(12) United States Patent
Moe et al.

(10) Patent No.: US 11,895,920 B2
(45) Date of Patent: *Feb. 6, 2024

(54) METHODS OF FORMING GROUP III PIEZOELECTRIC THIN FILMS VIA REMOVAL OF PORTIONS OF FIRST SPUTTERED MATERIAL

(71) Applicant: Akoustis, Inc., Huntersville, NC (US)

(72) Inventors: Craig Moe, Penfield, NY (US); Jeffrey B. Shealy, Cornelius, NC (US); Mary Winters, Webster, NY (US); Dae Ho Kim, Cornelius, NC (US); Abhay Saranswarup Kochhar, Charlotte, NC (US)

(73) Assignee: Akoustis, Inc., Huntersville, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/811,222

(22) Filed: Jul. 7, 2022

(65) Prior Publication Data

US 2022/0352456 A1    Nov. 3, 2022

Related U.S. Application Data

(60) Division of application No. 16/742,202, filed on Jan. 14, 2020, now Pat. No. 11,411,169, which is a
(Continued)

(51) Int. Cl.
*H10N 30/076* (2023.01)
*H03H 3/02* (2006.01)
(Continued)

(52) U.S. Cl.
CPC ............ *H10N 30/076* (2023.02); *H03H 3/02* (2013.01); *H10N 30/053* (2023.02);
(Continued)

(58) Field of Classification Search
CPC ............... H03H 3/02; H03H 2003/021; H03H 2003/023; H03H 2003/025;
(Continued)

(56) References Cited

U.S. PATENT DOCUMENTS

| 5,231,327 | A | 7/1993 | Ketcham |
| 5,894,647 | A | 4/1999 | Lakin |

(Continued)

FOREIGN PATENT DOCUMENTS

| JP | 2009100197 A | 5/2009 |
| JP | 2010068109 A | 3/2010 |

(Continued)

OTHER PUBLICATIONS

Notification Concerning Transmittal of IPRP, PCT/US2020/045658, dated Feb. 24, 2022, 13 pgs.
(Continued)

*Primary Examiner* — Peter Dungba Vo
*Assistant Examiner* — Joshua D Anderson
(74) *Attorney, Agent, or Firm* — Stanek Lemon Crouse & Meeks, P.A.

(57) ABSTRACT

A method of forming a piezoelectric thin film includes sputtering a first surface of a substrate to provide a piezoelectric thin film comprising AlN, AlScN, AlCrN, HfMgAlN, or ZrMgAlN thereon, processing a second surface of the substrate that is opposite the first surface of the substrate to provide an exposed surface of the piezoelectric thin film from beneath the second surface of the substrate, wherein the exposed surface of the piezoelectric thin film includes a first crystalline quality portion, removing a portion of the exposed surface of the piezoelectric thin film to access a second crystalline quality portion that is covered by the first crystalline quality portion, wherein the second crystalline quality portion has a higher quality than the first
(Continued)

crystalline quality portion and processing the second crystalline quality portion to provide an acoustic resonator device on the second crystalline quality portion.

8 Claims, 67 Drawing Sheets

Related U.S. Application Data continuation-in-part of application No. 16/513,143, filed on Jul. 16, 2019, now Pat. No. 11,411,168, which is a continuation-in-part of application No. 15/784,919, filed on Oct. 16, 2017, now Pat. No. 10,355,659.

(60) Provisional application No. 62/887,126, filed on Aug. 15, 2016.

(51) Int. Cl.
  *H10N 30/06* (2023.01)
  *H10N 30/053* (2023.01)
  *H10N 30/85* (2023.01)

(52) U.S. Cl.
  CPC .............. *H10N 30/06* (2023.02); *H10N 30/85* (2023.02); *Y10T 29/42* (2015.01); *Y10T 29/49005* (2015.01)

(58) Field of Classification Search
  CPC ...... H03H 9/02015; H03H 9/105; H03H 9/17; H03H 9/171; H03H 9/173; H03H 9/174; H03H 9/175; H03H 9/54; H03H 9/562; H03H 9/564; H10N 30/00; H10N 30/01; H10N 30/05; H10N 30/053; H10N 30/06; H10N 30/076; H10N 30/077; H10N 30/079; H10N 30/08; H10N 30/082; H10N 30/085; H10N 30/086; H10N 30/1051; H10N 30/10513; H10N 30/10516; H10N 30/50; H10N 30/80; H10N 30/85; C23C 14/0036; C23C 14/0084; C23C 14/02; C23C 14/024; C23C 14/025; C23C 14/027; C23C 14/0617; C23C 14/0641; C23C 14/165; C23C 14/34; C23C 14/3407; C23C 14/345; C23C 14/3464; C23C 14/3492; C23C 14/541; Y10T 29/42; Y10T 29/49005
  See application file for complete search history.

(56) References Cited

U.S. PATENT DOCUMENTS

| | | | |
|---|---|---|---|
| 6,051,907 A | 4/2000 | Ylilammi | |
| 6,114,635 A | 9/2000 | Lakin et al. | |
| 6,262,637 B1 | 7/2001 | Bradley et al. | |
| 6,377,137 B1 | 4/2002 | Ruby | |
| 6,384,697 B1 | 5/2002 | Ruby | |
| 6,472,954 B1 | 10/2002 | Ruby et al. | |
| 6,583,690 B2 | 6/2003 | Lee et al. | |
| 6,617,060 B2 | 9/2003 | Weeks, Jr. et al. | |
| 6,812,619 B1 | 11/2004 | Kaitila et al. | |
| 6,841,922 B2 | 1/2005 | Aigner et al. | |
| 6,864,619 B2 | 3/2005 | Aigner et al. | |
| 6,879,224 B2 | 4/2005 | Frank | |
| 6,909,340 B2 | 6/2005 | Aigner et al. | |
| 6,933,807 B2 | 8/2005 | Marksteiner et al. | |
| 7,112,860 B2 | 9/2006 | Saxler | |
| 7,250,360 B2 | 7/2007 | Shealy et al. | |
| 7,268,436 B2 | 9/2007 | Aigner et al. | |
| 7,365,619 B2 | 4/2008 | Aigner et al. | |
| 7,514,759 B1 | 4/2009 | Mehta et al. | |
| 7,875,910 B2 | 1/2011 | Sheppard et al. | |
| 7,982,363 B2 | 7/2011 | Chitnis | |
| 8,304,271 B2 | 11/2012 | Huang et al. | |
| 8,440,259 B2 | 5/2013 | Chiang et al. | |
| 9,136,819 B2 | 9/2015 | Grannen et al. | |
| 10,110,190 B2 | 10/2018 | Vetury | |
| 10,187,036 B2 | 1/2019 | Yokoyama | |
| 10,797,681 B1 | 10/2020 | Hurwitz | |
| 2003/0039866 A1 | 2/2003 | Mitamura | |
| 2005/0093397 A1 | 5/2005 | Yamada et al. | |
| 2005/0140246 A1 | 6/2005 | Wang | |
| 2005/0255234 A1 | 11/2005 | Kanda et al. | |
| 2006/0214539 A1 | 9/2006 | Sato | |
| 2007/0080611 A1 | 4/2007 | Yamada ............... H01L 41/0477 310/364 |
| 2008/0284541 A1 | 11/2008 | Chitnis | |
| 2009/0033177 A1 | 2/2009 | Itaya et al. | |
| 2009/0102319 A1 | 4/2009 | Nakatsuka | |
| 2010/0148637 A1 | 6/2010 | Satou | |
| 2010/0301379 A1 | 12/2010 | Yokoyama ........ H01L 21/02631 438/46 |
| 2011/0114968 A1 | 5/2011 | Sheppard et al. | |
| 2011/0137184 A1 | 6/2011 | Ren et al. | |
| 2012/0287575 A1 | 11/2012 | Nelson | |
| 2013/0111719 A1 | 5/2013 | Deguet | |
| 2013/0140525 A1 | 6/2013 | Chen | |
| 2013/0209685 A1 | 8/2013 | Ku et al. | |
| 2014/0246305 A1 | 9/2014 | Larson, III | |
| 2014/0318443 A1 | 10/2014 | Fenwick | |
| 2014/0327013 A1 | 11/2014 | Schenk | |
| 2015/0381144 A1 | 12/2015 | Bradley ................. H03H 9/568 333/132 |
| 2016/0028367 A1 | 1/2016 | Shealy | |
| 2016/0036580 A1 | 2/2016 | Shealy | |
| 2016/0064645 A1 | 3/2016 | Teshigahara .......... H01L 41/316 252/62.9 R |
| 2016/0203972 A1 | 7/2016 | Sundaram | |
| 2016/0218271 A1 | 7/2016 | Sakuma et al. | |
| 2017/0149405 A1 | 5/2017 | Kishimoto | |
| 2017/0288628 A1 | 10/2017 | Grannen ............. C23C 14/0057 |
| 2017/0310299 A1 | 10/2017 | Bower | |
| 2018/0026604 A1 | 1/2018 | Yokoyama | |
| 2018/0069168 A1 | 3/2018 | Ikeuchi et al. | |
| 2018/0323767 A1 | 11/2018 | Then et al. | |
| 2018/0342999 A1 | 11/2018 | Gibb et al. | |
| 2019/0036511 A1 | 1/2019 | Choy et al. | |
| 2019/0199316 A1 | 6/2019 | Houlden et al. | |
| 2019/0305039 A1 | 10/2019 | Wang et al. | |
| 2019/0305753 A1 | 10/2019 | Shealy | |

FOREIGN PATENT DOCUMENTS

| | | |
|---|---|---|
| WO | WO 2005034349 A1 | 4/2005 |
| WO | WO 2016122877 | 8/2016 |
| WO | WO 2017095437 | 8/2017 |

OTHER PUBLICATIONS

Notification Concerning Transmittal of IPRP, PCT/US2020/040648, dated Nov. 25, 2021, 12 pgs.
International Search Report and Written Opinion for PCT/US2020/040648, dated Sep. 25, 2020, 13 pgs.
International Search Report and Written Opinion for PCT/US2020/045658, dated Oct. 6, 2020, 14 pgs.
Hardy et al.; *Epitaxial ScAlN Etch-Stop Layers Grown by Molecular Beam Epitaxy for Selective Etching of AlN and GaN*; IEEE Transactions on Semiconductor Manufacturing, vol. 30, No. 4; Nov. 2017; pp. 475-479.
Hardy et al.; *Epitaxial ScAlN Grown by Molecular Beam Epitaxy on GaN and SiC Substrates*; Applied Physics Letter 110; 162104; (2017); 5 pages.
Leone et al. *Metal-Organic Chemical Vapor Deposition of Aluminum Scandium Nitride*; Physica Status Solidi (RRL)—Rapid Research Letters; vol. 14, Issue 1; Oct. 31, 2019; pp. 1-16.
Ligl, et al.; *Metalorganic Chemical Vapor Phase Deposition of AlScN/GaN Heterostructures*; Journal of Applied Physics 127, 195704; May 18, 2020; pp. 1-12.

(56) References Cited

OTHER PUBLICATIONS

Yokoyama et al.; *Dopant Concentration Dependence of Electromechanical Coupling Coefficients of Co-doped AlN Thin Films for BAW Devices*; IEEE International Ultrasonics Symposium Proceedings; (2016); 4 pages.

Yokoyama et al.; *Effect of Mg and Zr Co-Doping on Piezoelectric AlN Thin Films for bulk Acoustic Wave Resonators*; IEEE Transactions on Ultrasonics, Ferroelectrics, and Frequency Control, vol. 61, No. 8; Aug. 2014; pp. 1322-1328.

International Search Report and Written Opinion for PCT/US2021/027678, dated Jul. 21, 2021, 11 pages.

International Search Report and Written Opinion, PCT/US2018/050521, dated Jan. 28, 2019.

International Search Report and Written Opinion, PCT/US2015/034560, dated Sep. 18, 2015.

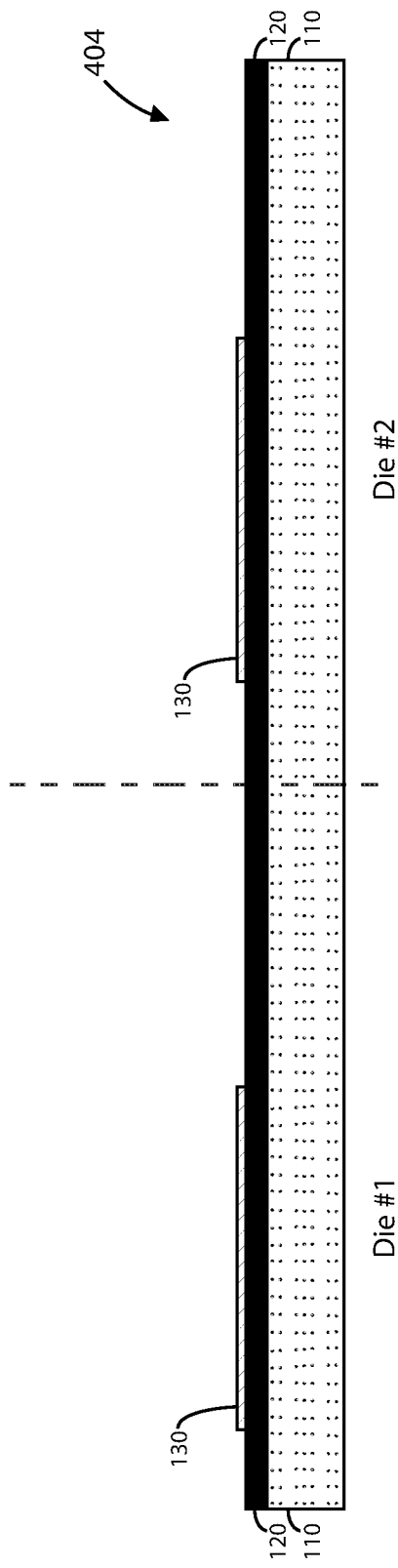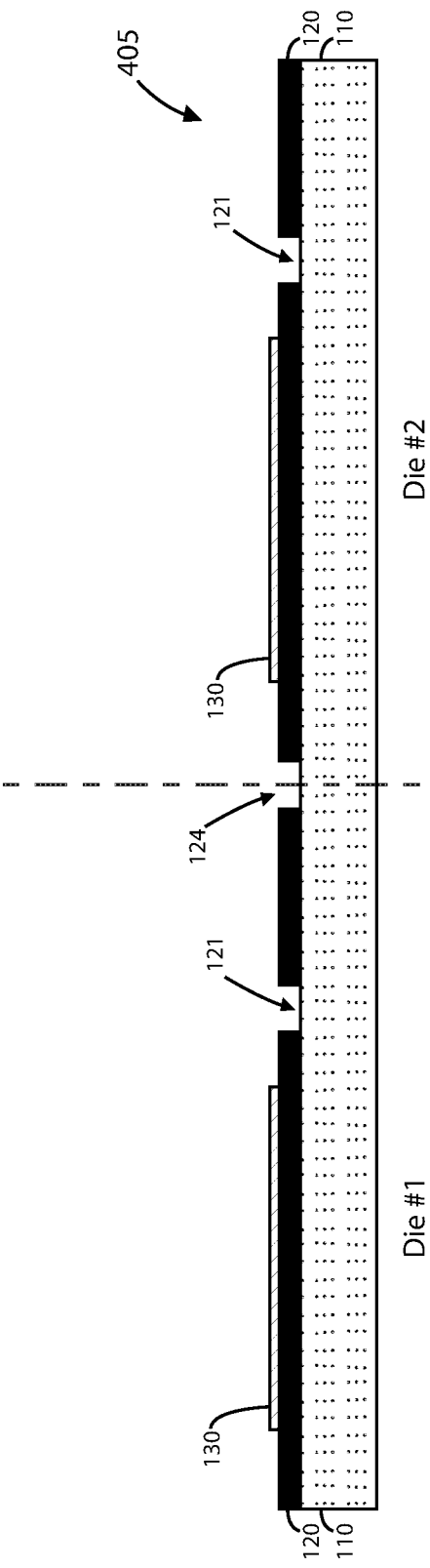

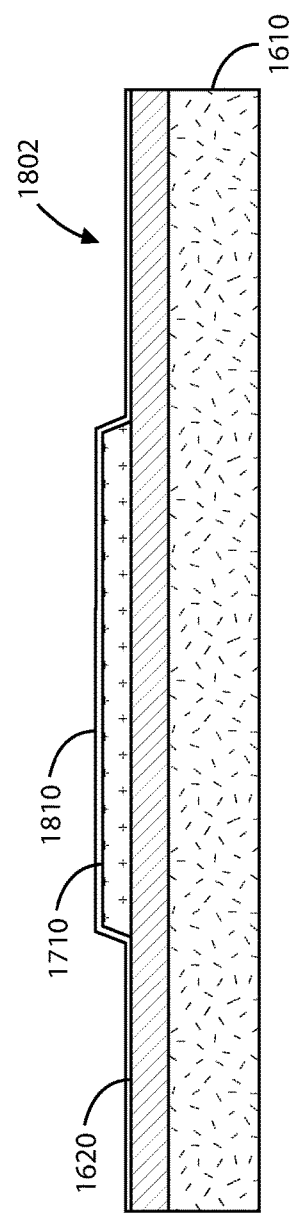
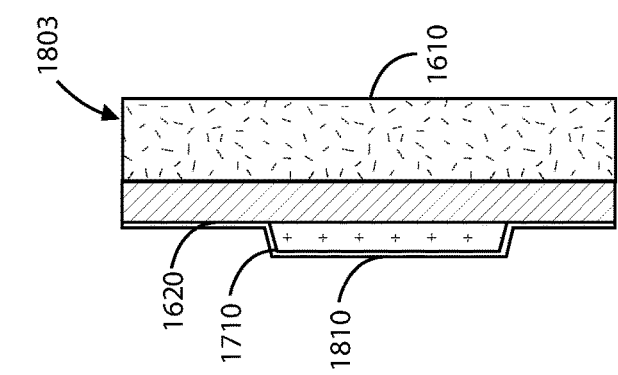
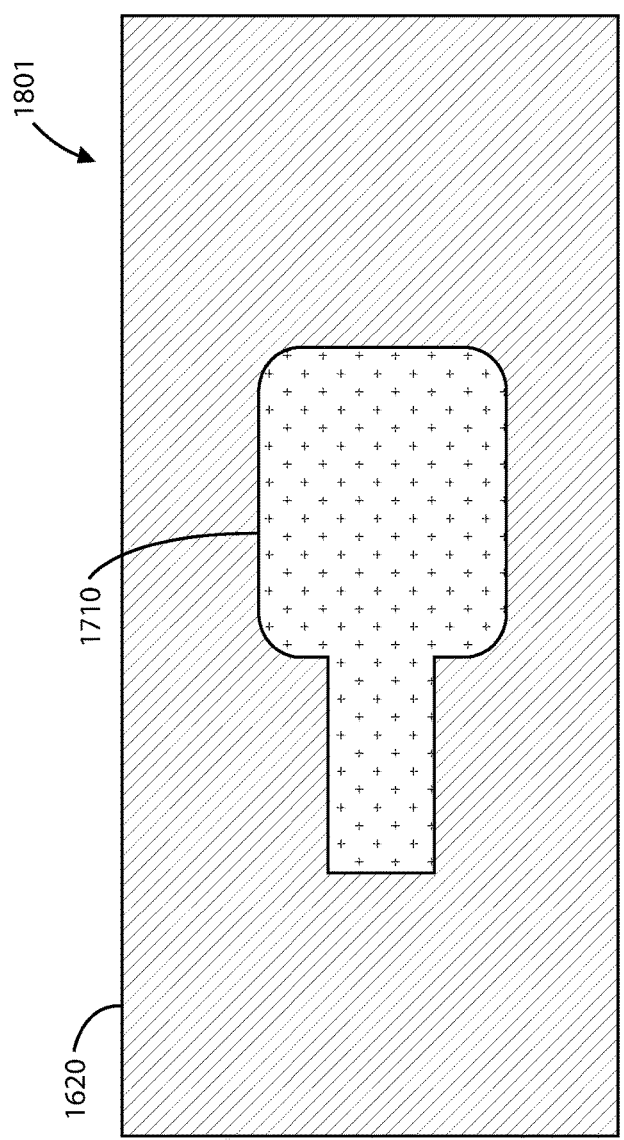

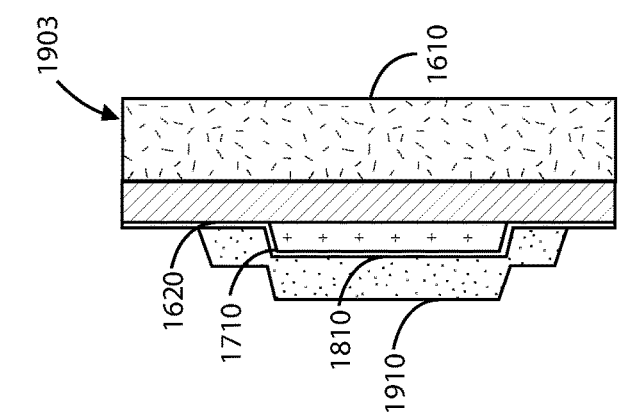
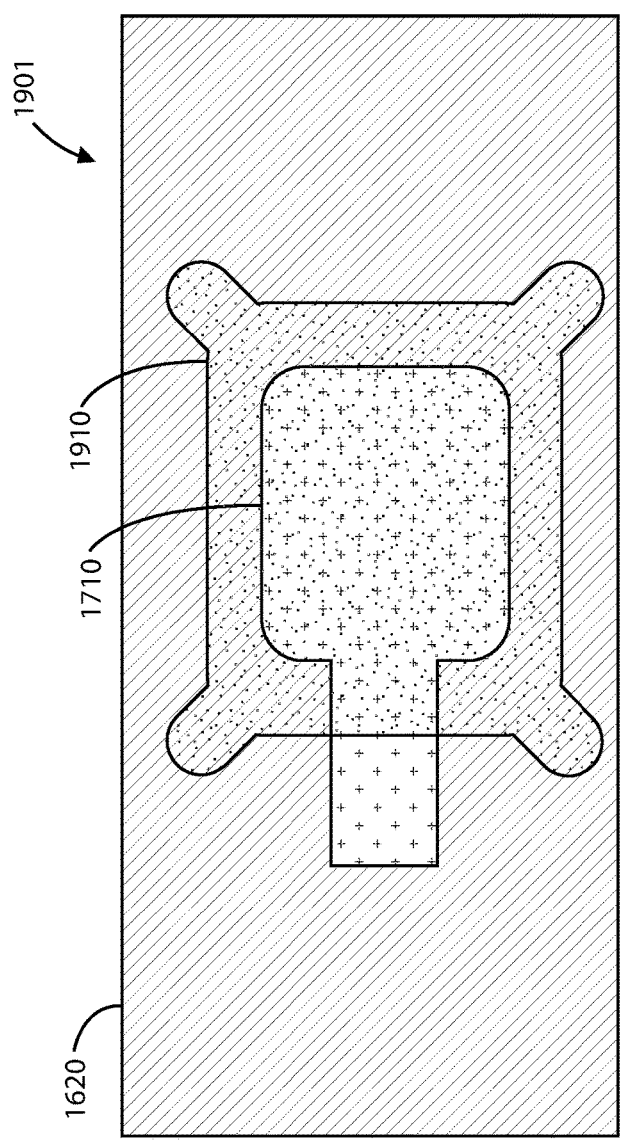
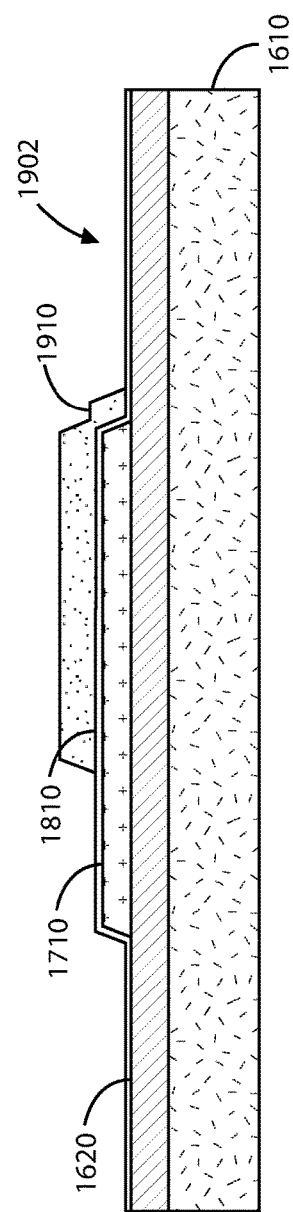

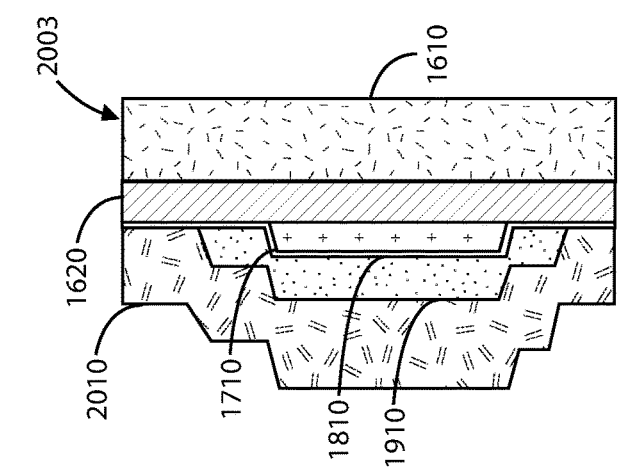
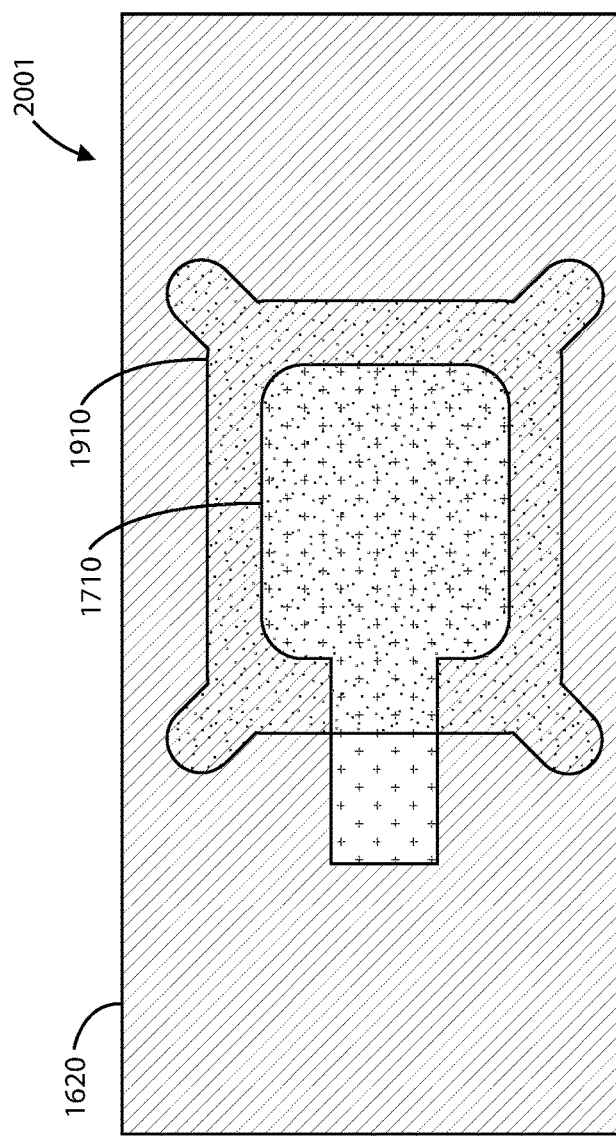
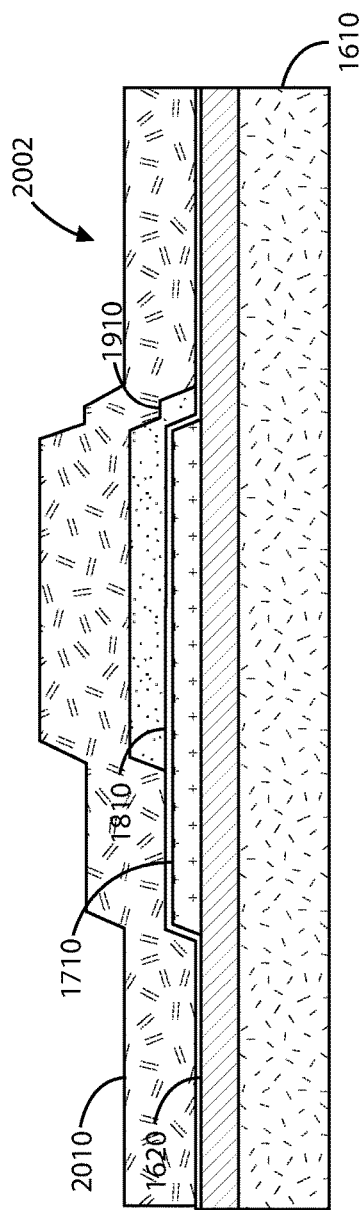
FIG. 20A
FIG. 20B
FIG. 20C

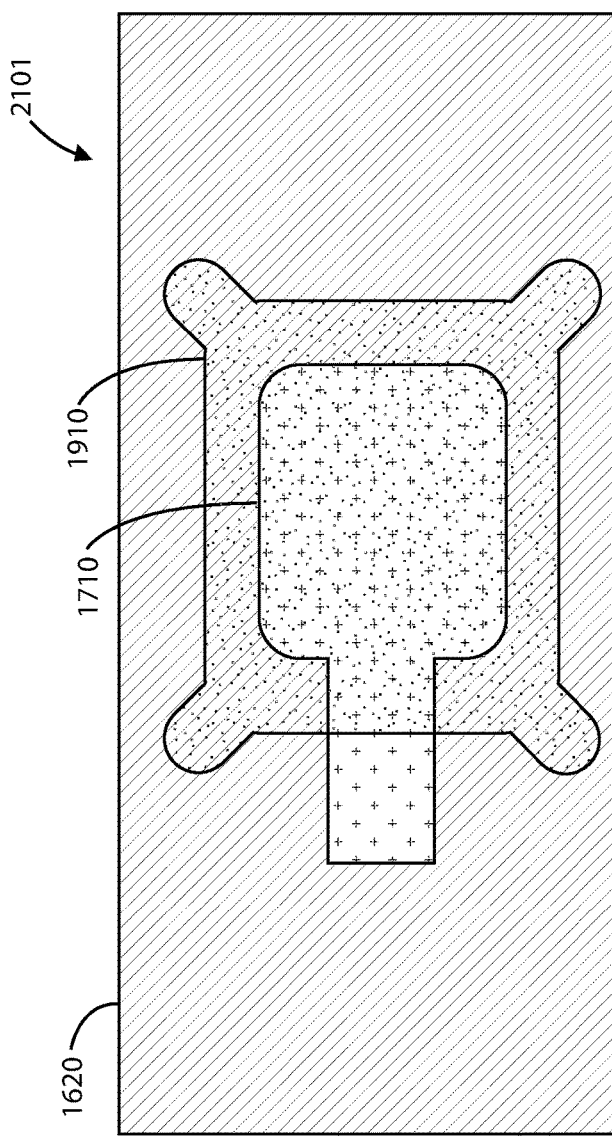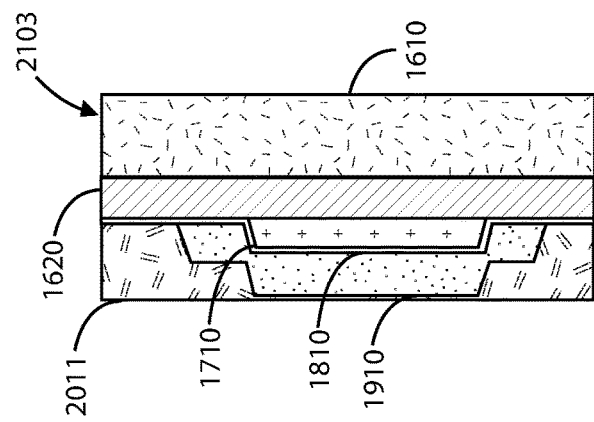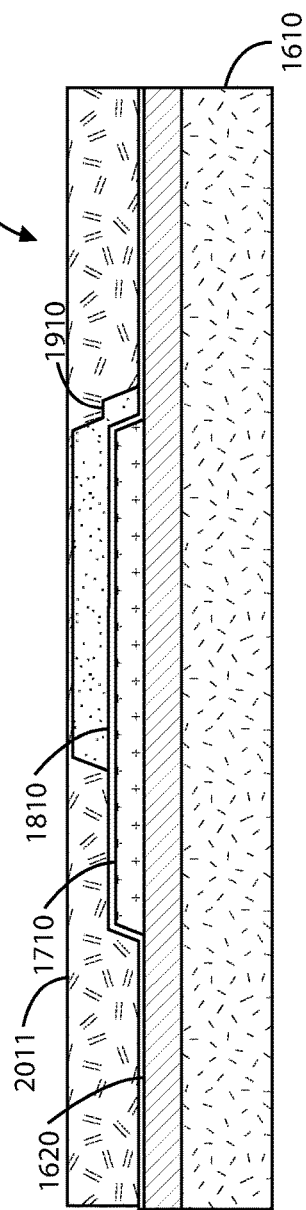

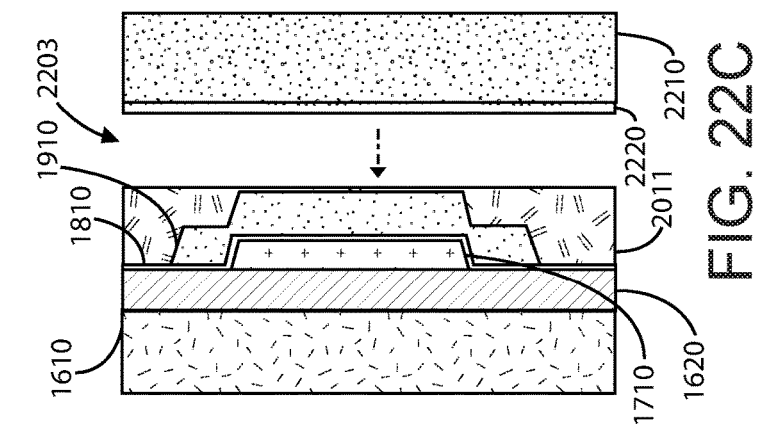
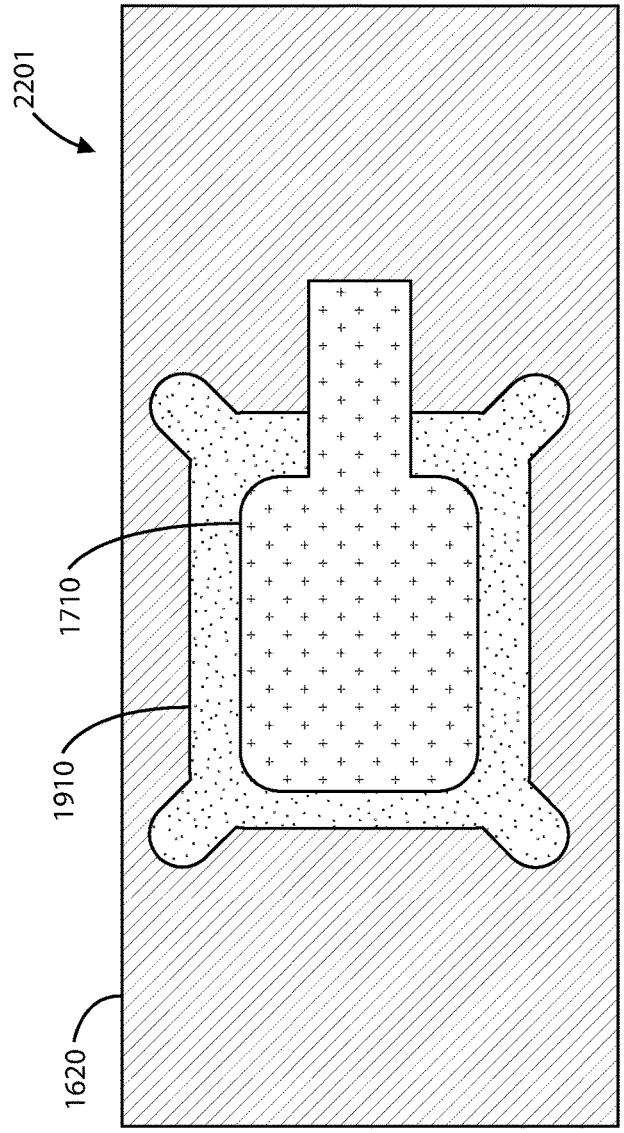
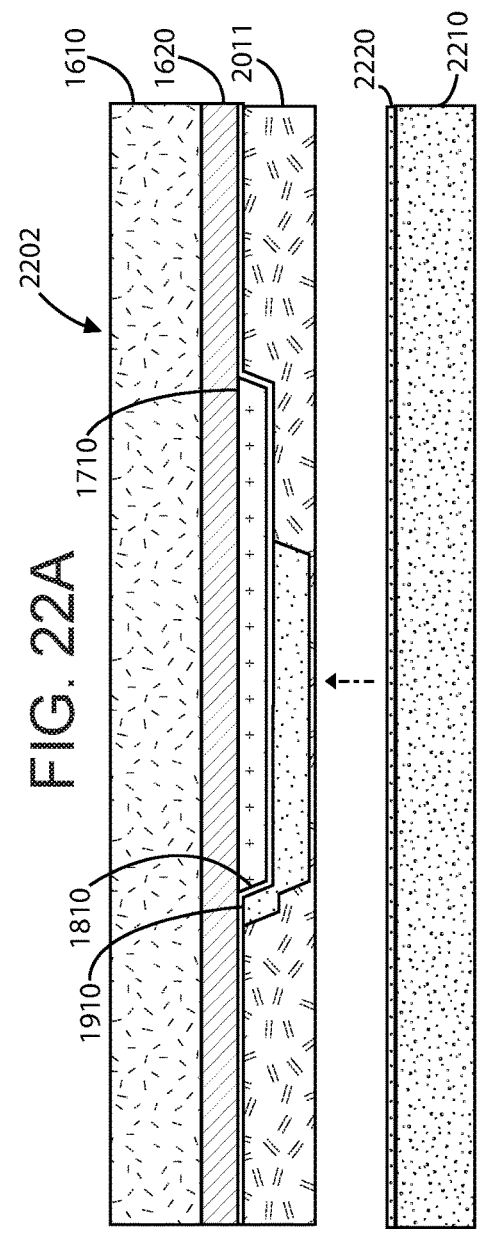
FIG. 22C
FIG. 22A
FIG. 22B

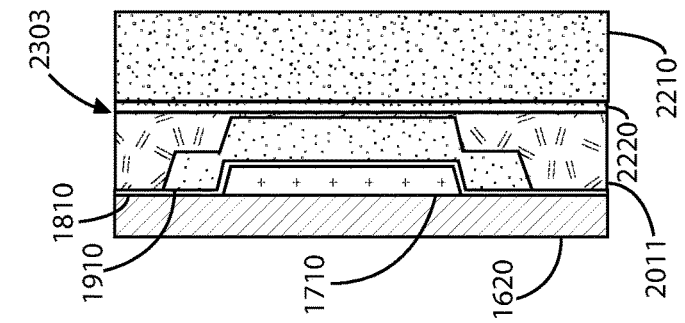
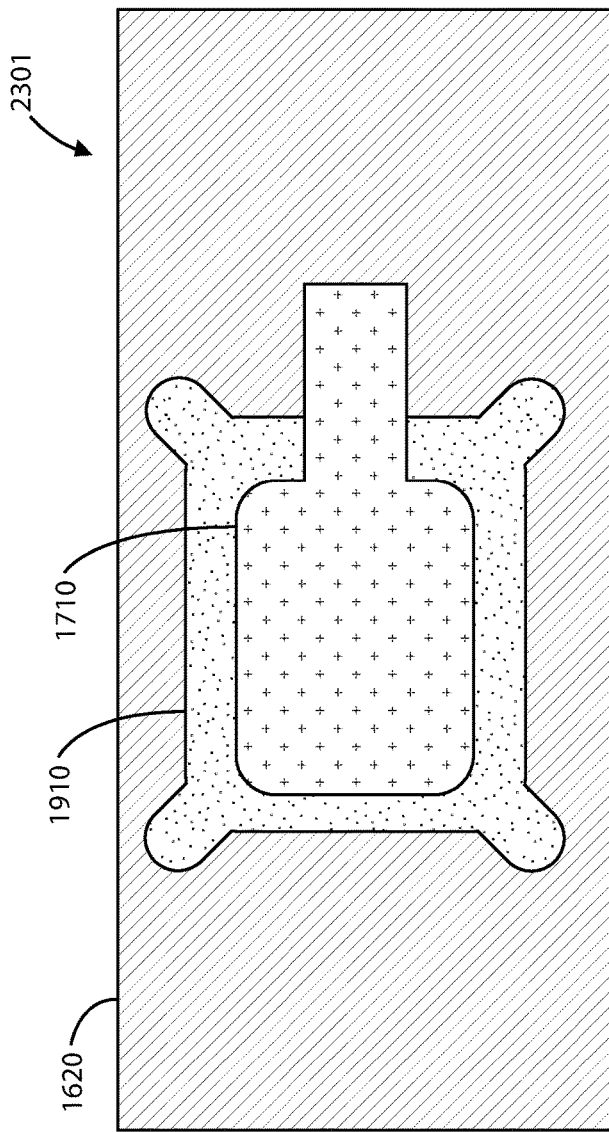
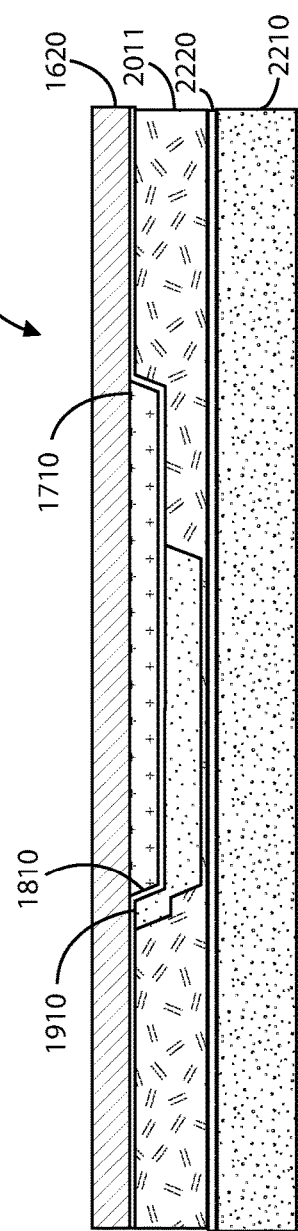
FIG. 23A
FIG. 23B
FIG. 23C

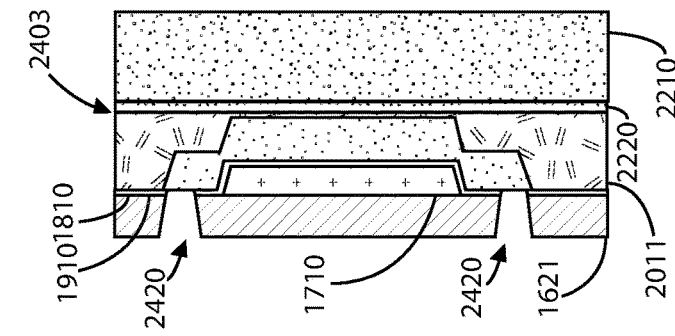
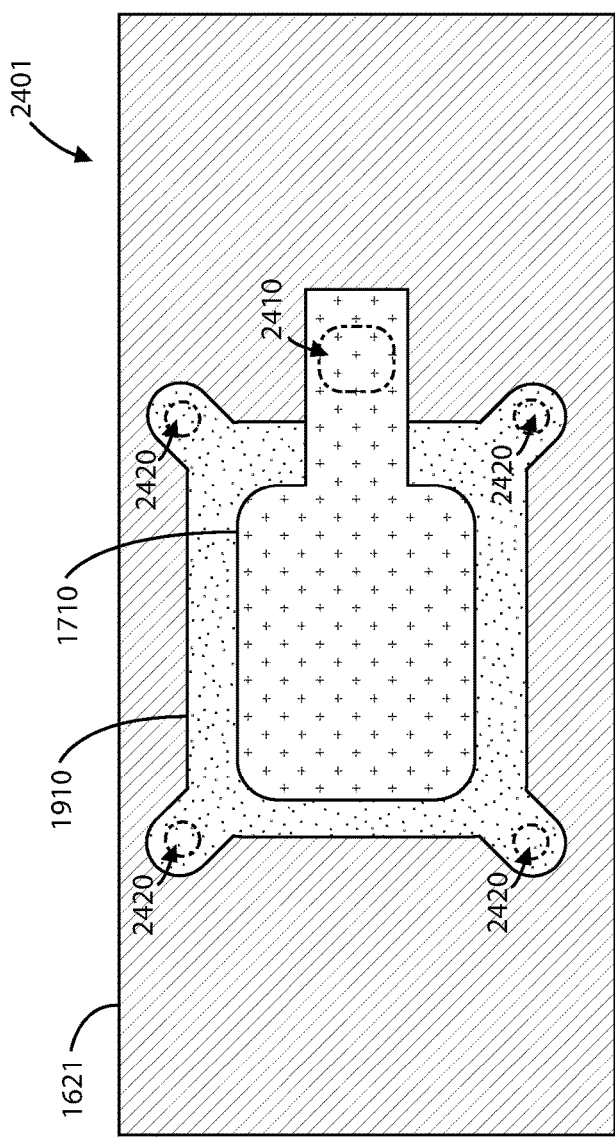
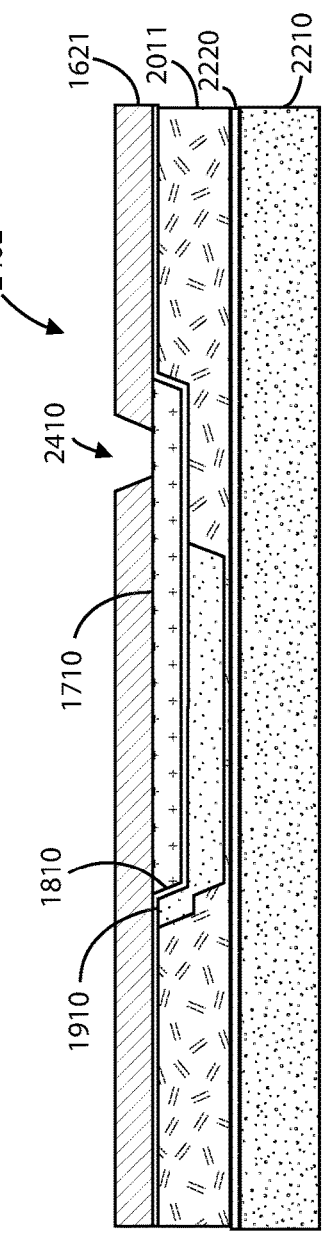
FIG. 24C
FIG. 24A
FIG. 24B

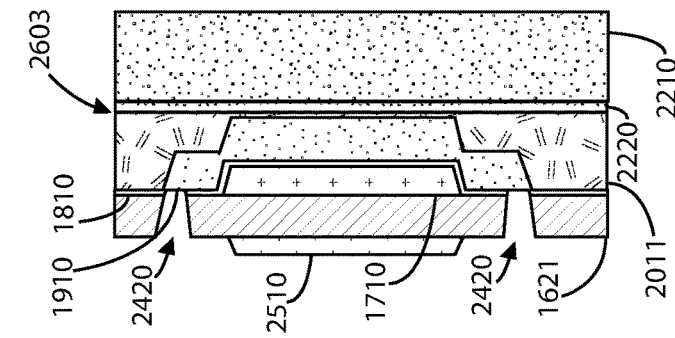
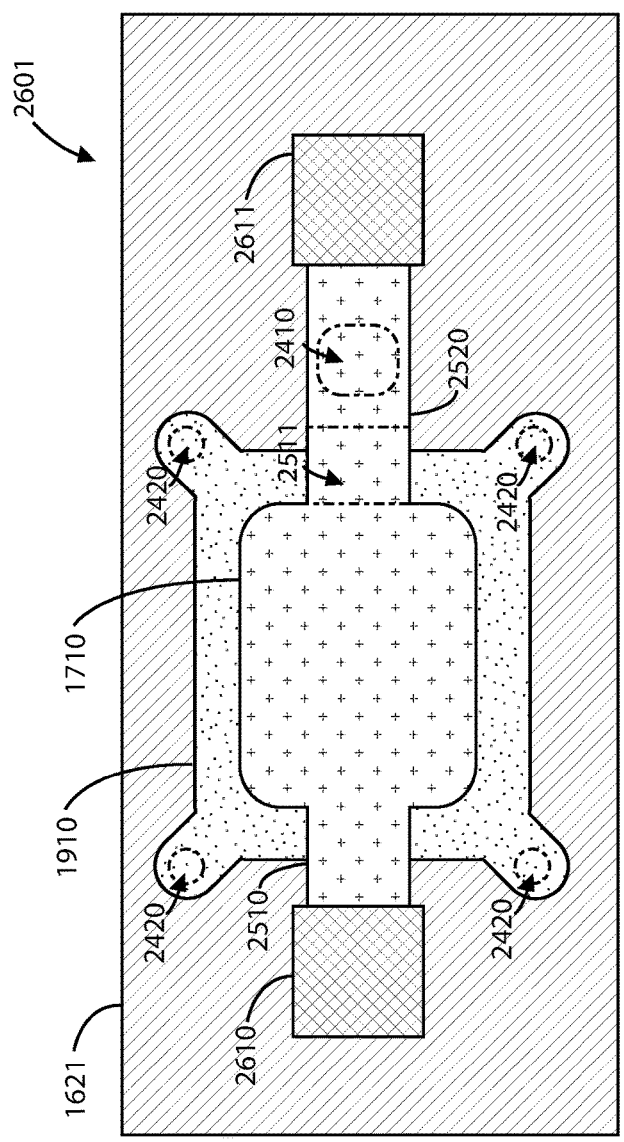
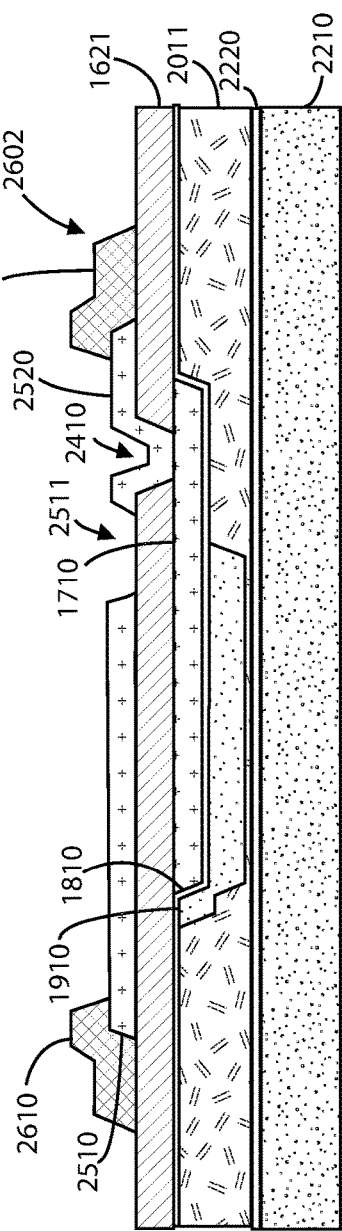
FIG. 26A
FIG. 26B
FIG. 26C

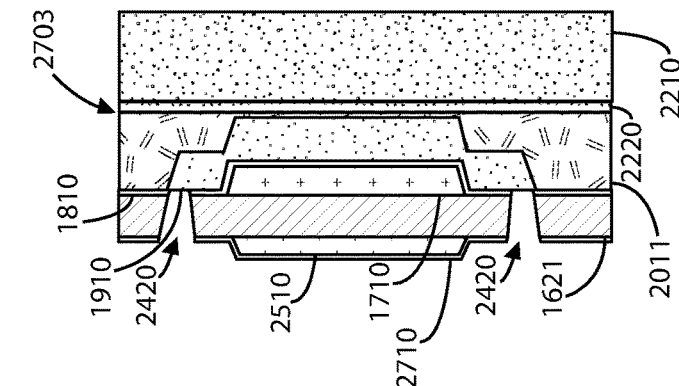
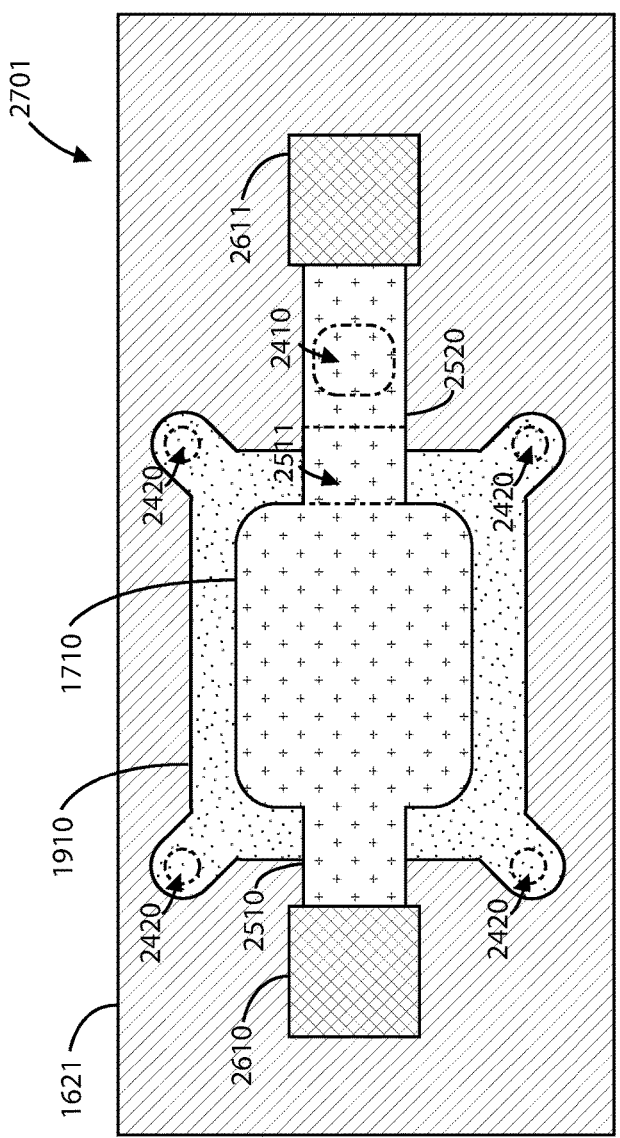
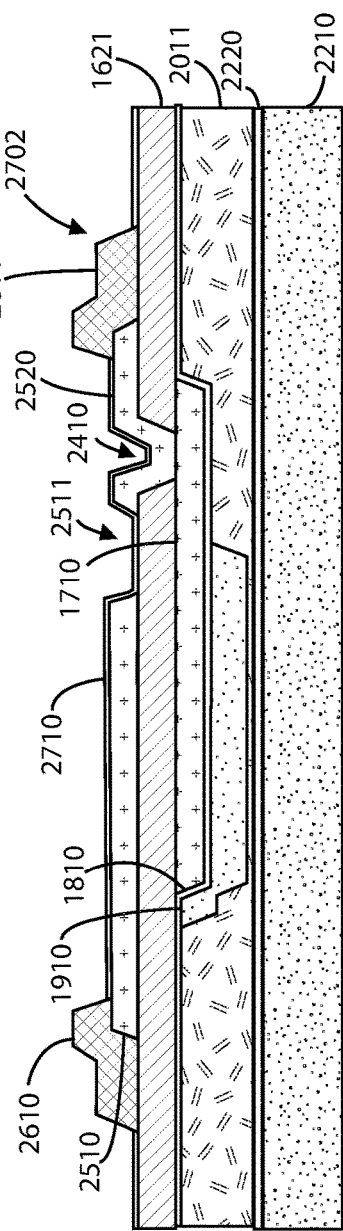
FIG. 27A
FIG. 27B
FIG. 27C

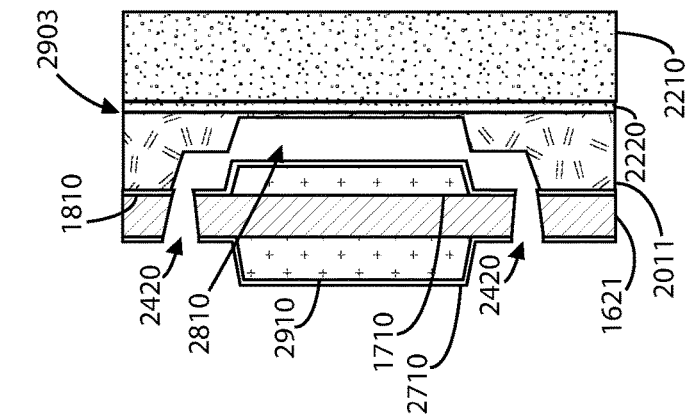
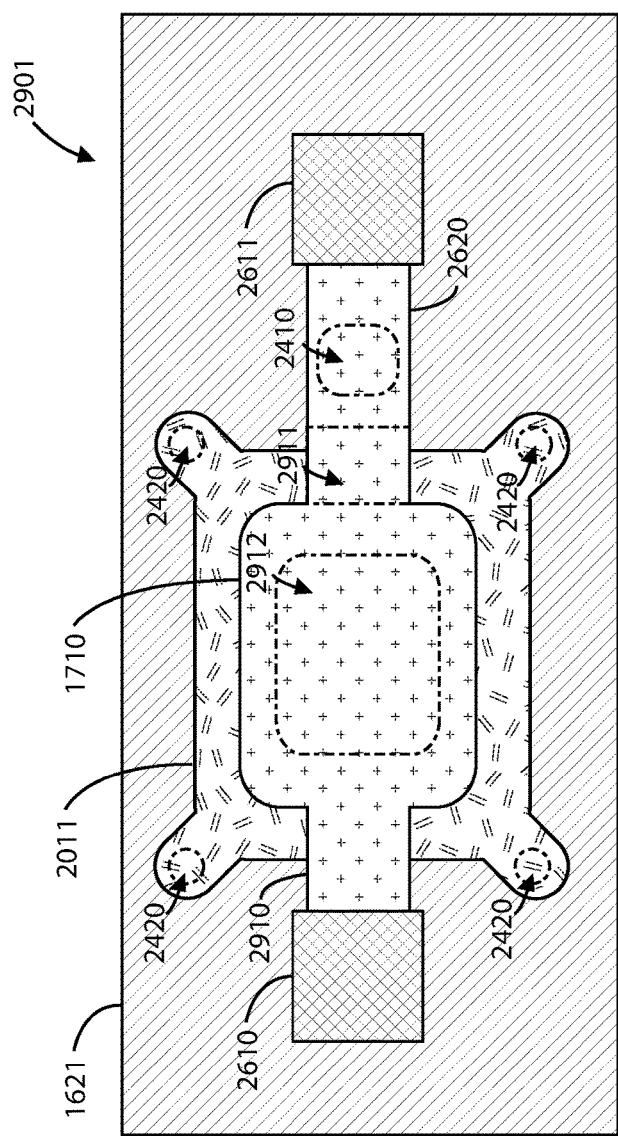
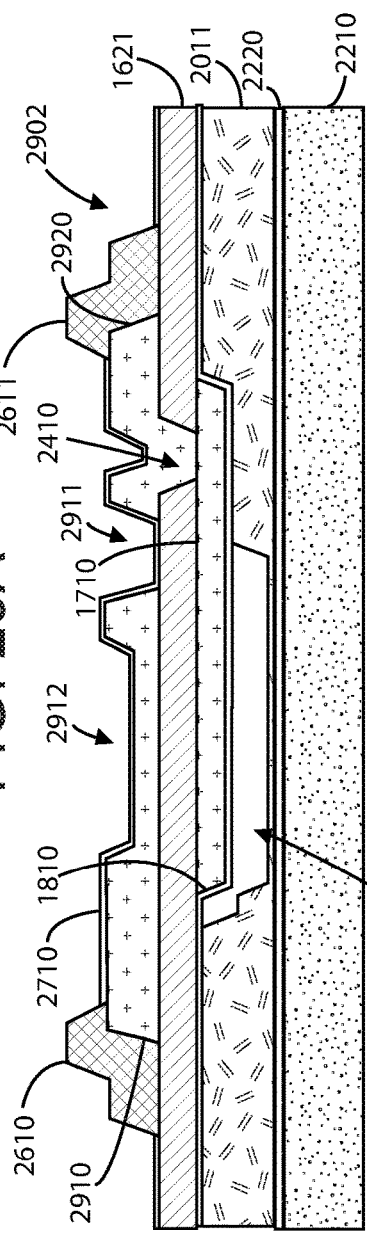

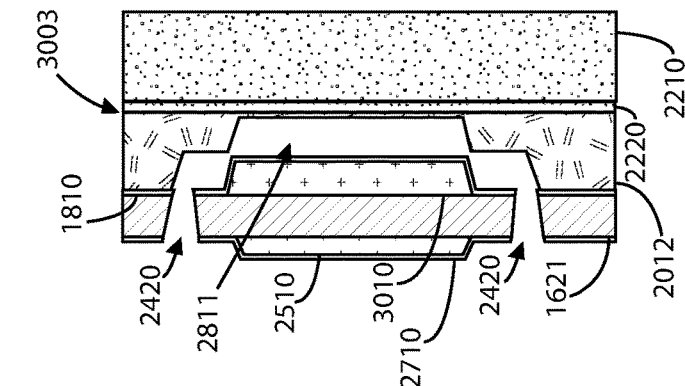
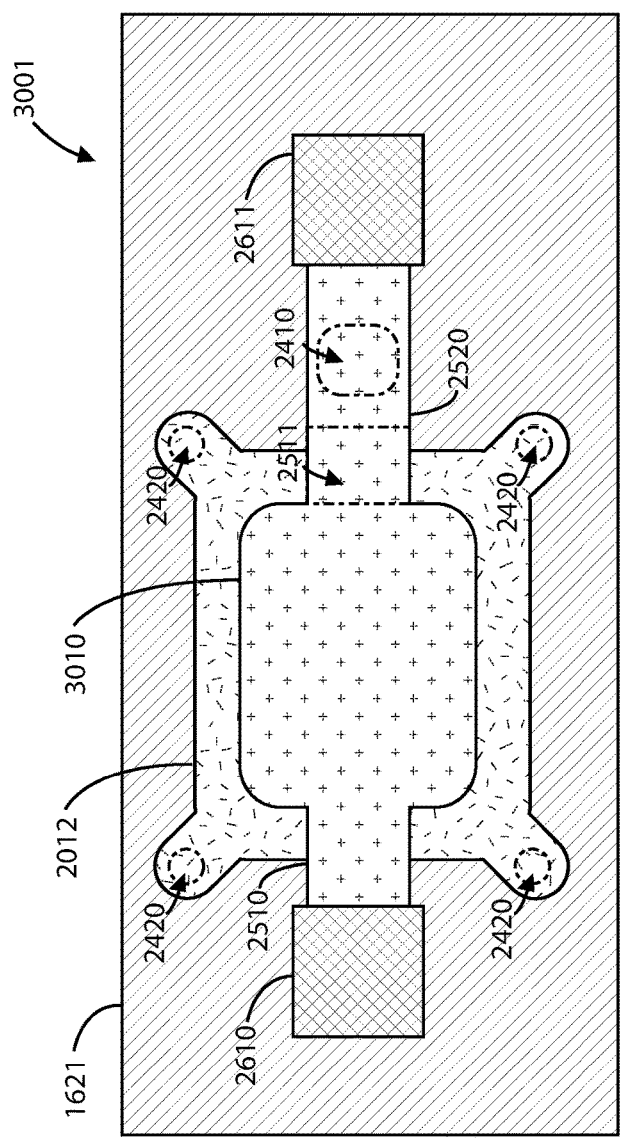
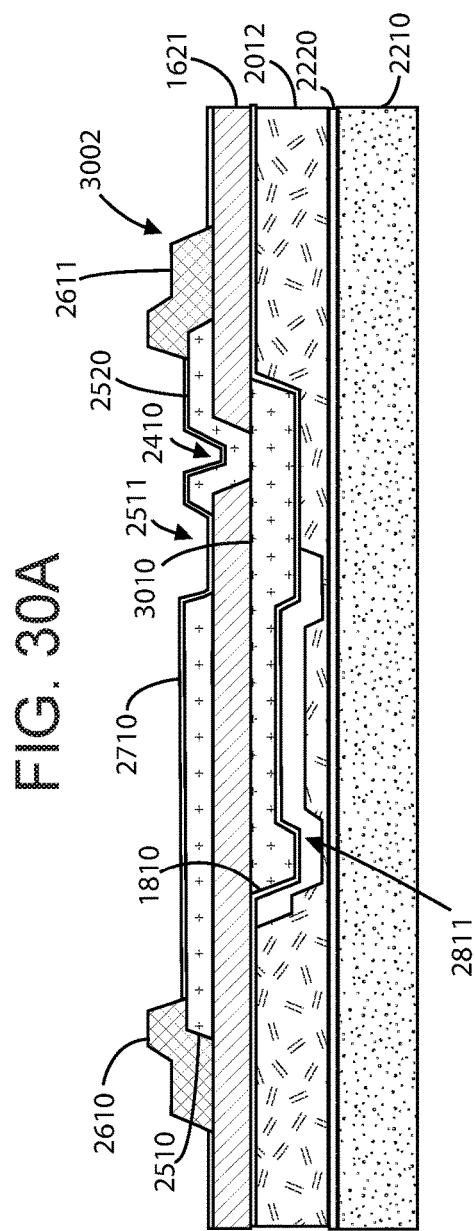

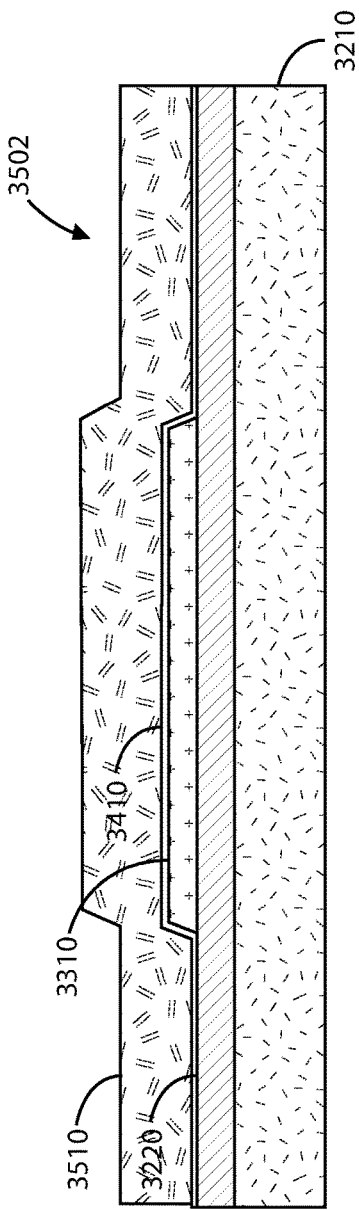
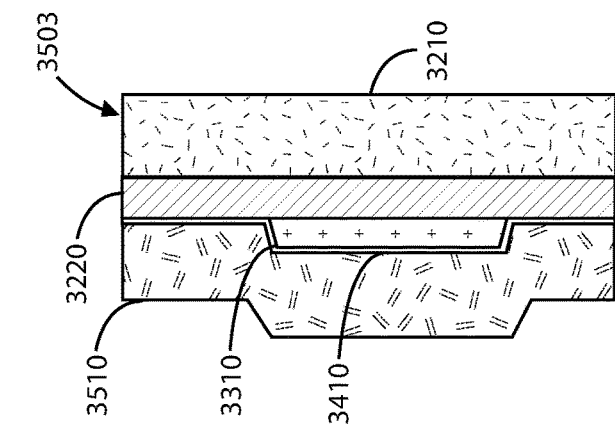
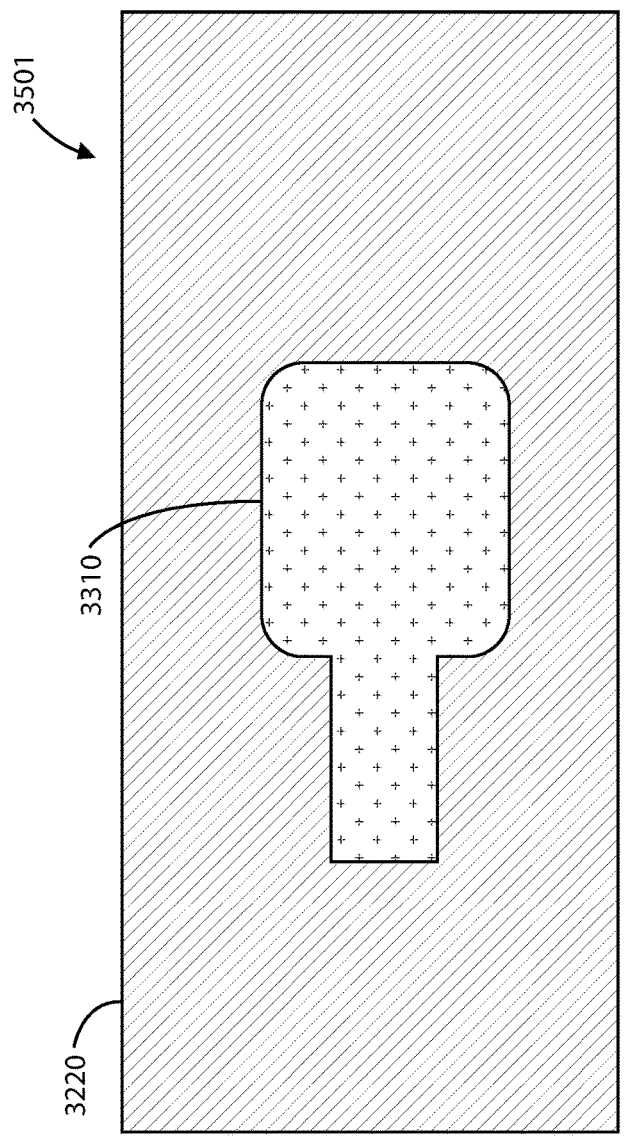
FIG. 35A
FIG. 35B
FIG. 35C

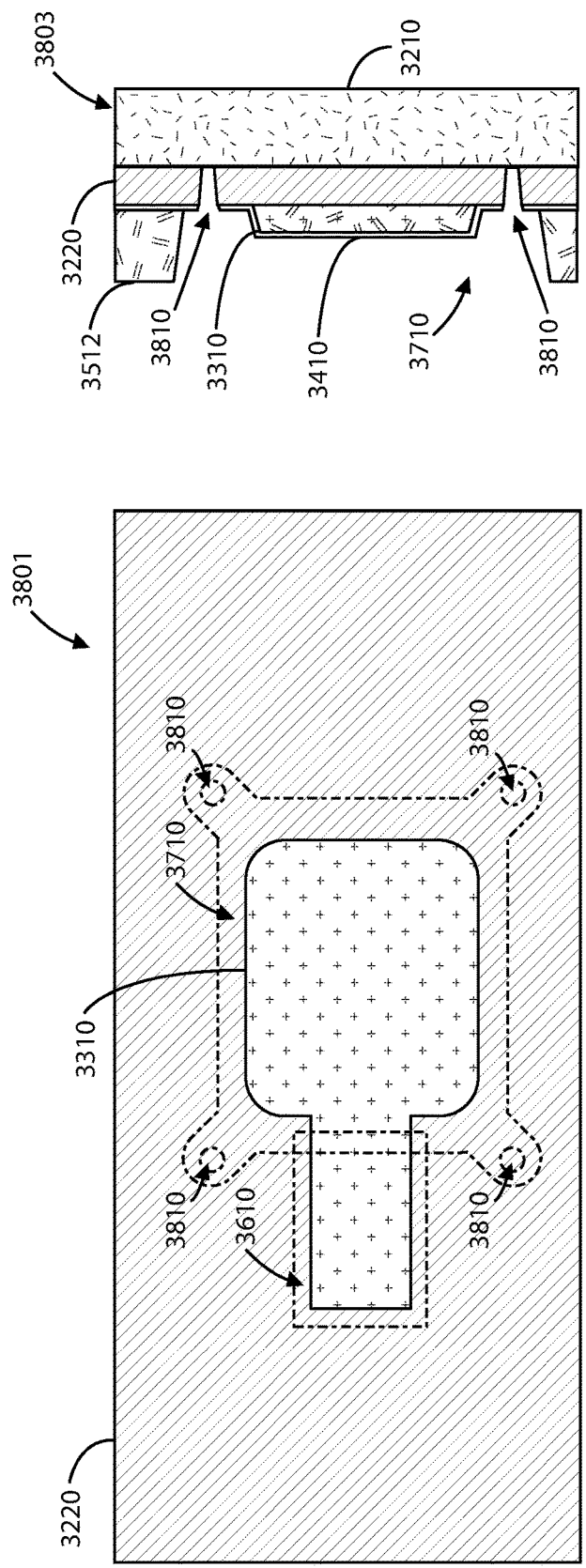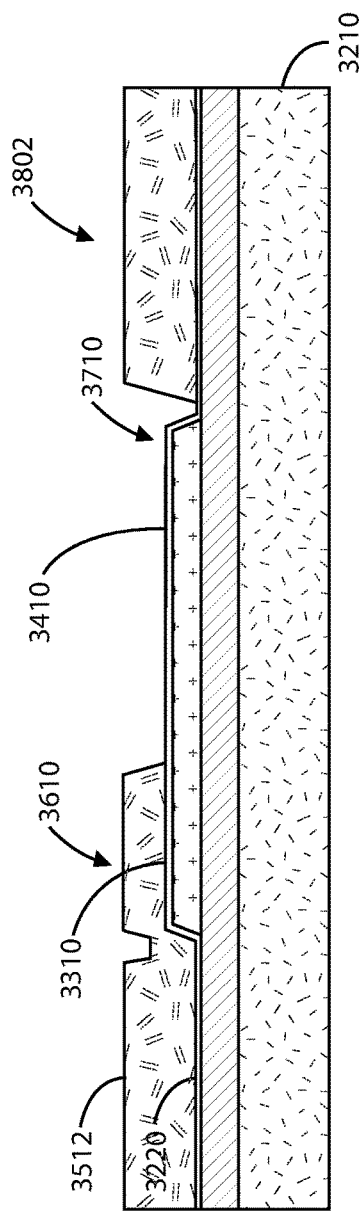
FIG. 38A
FIG. 38B
FIG. 38C

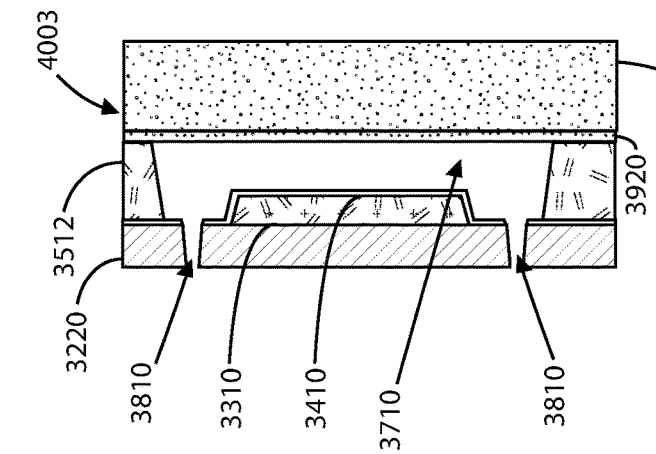
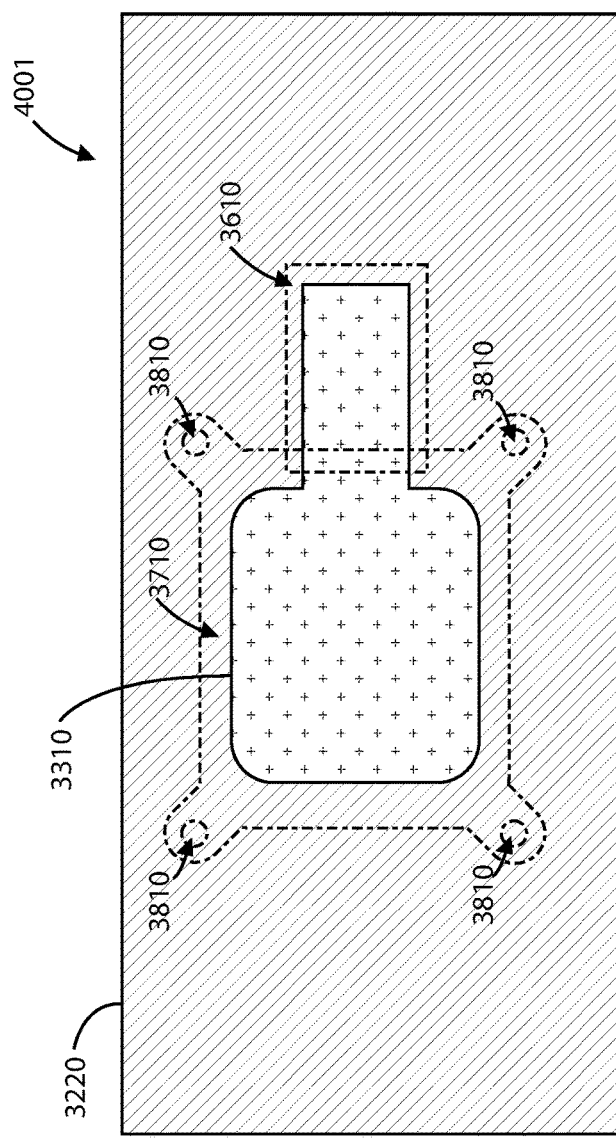
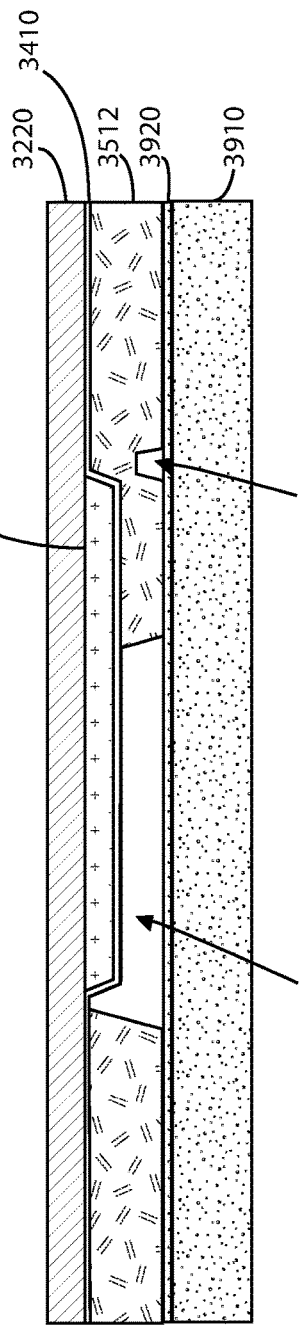

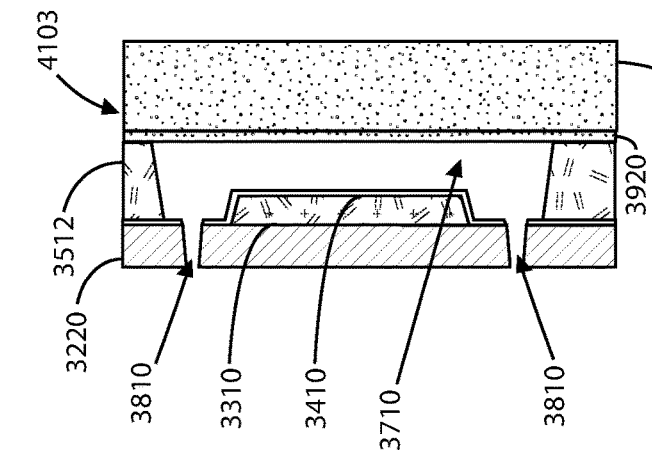
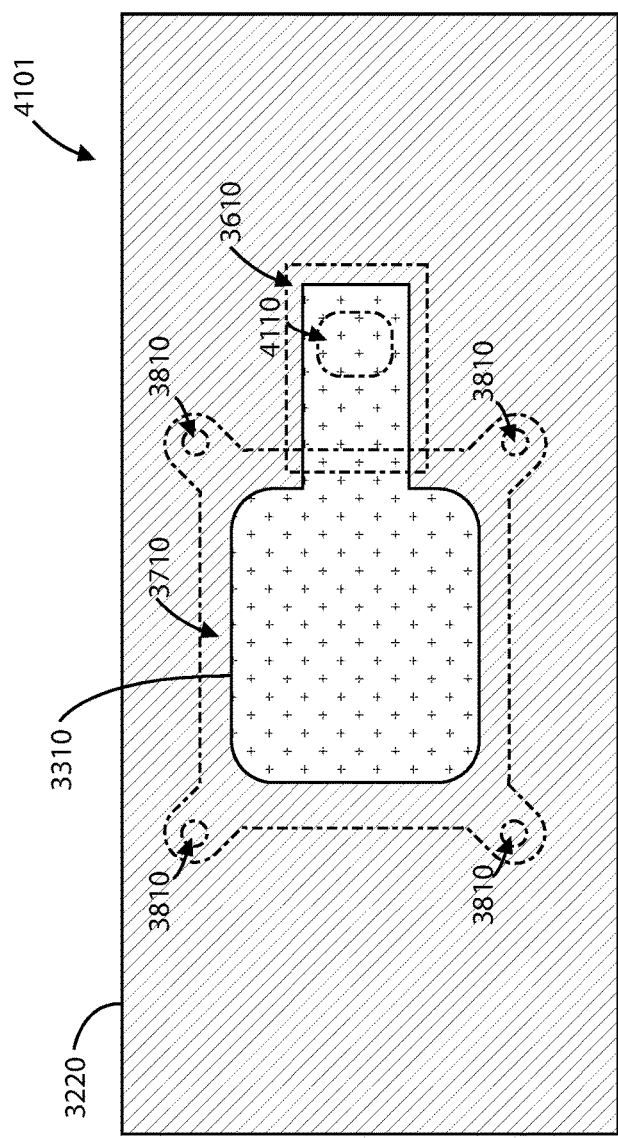
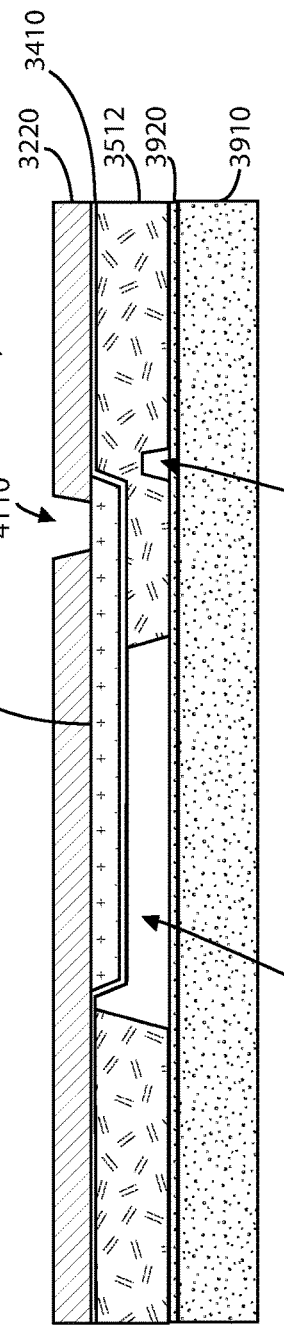

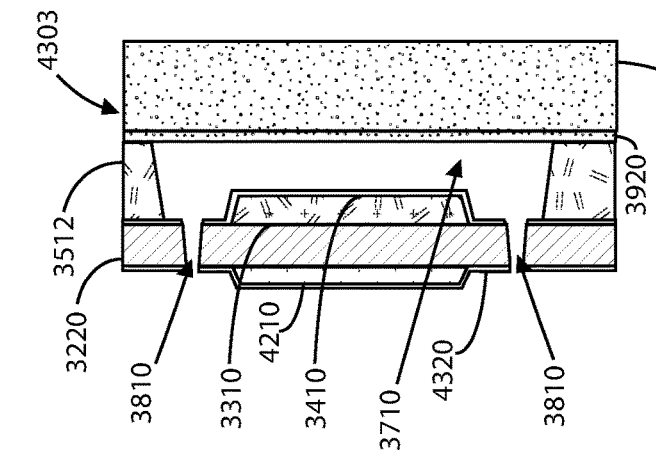
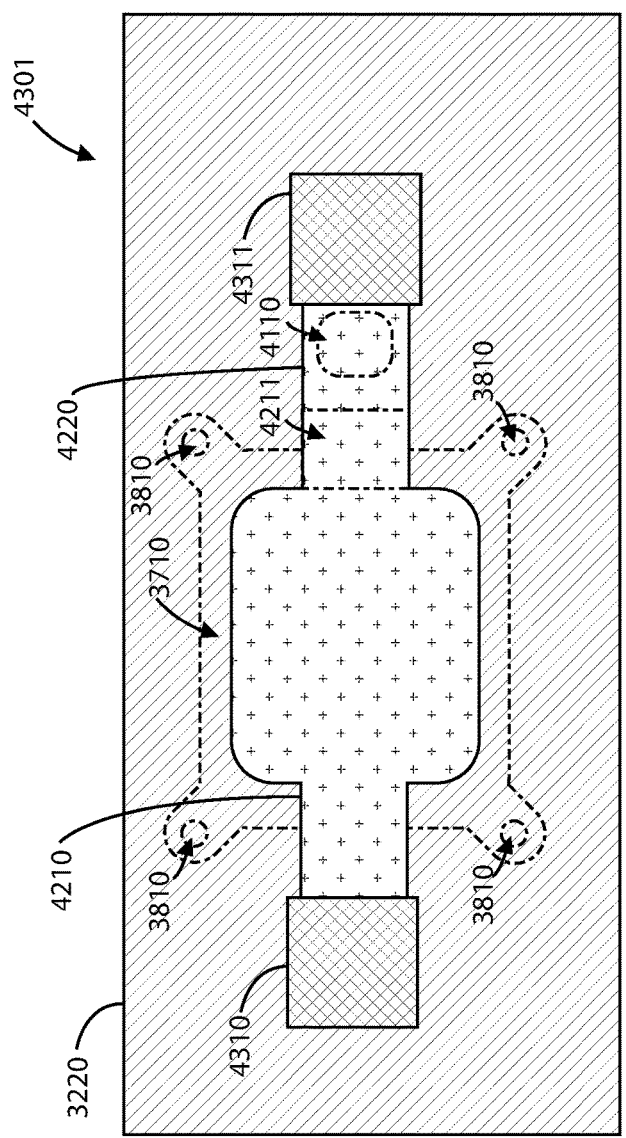
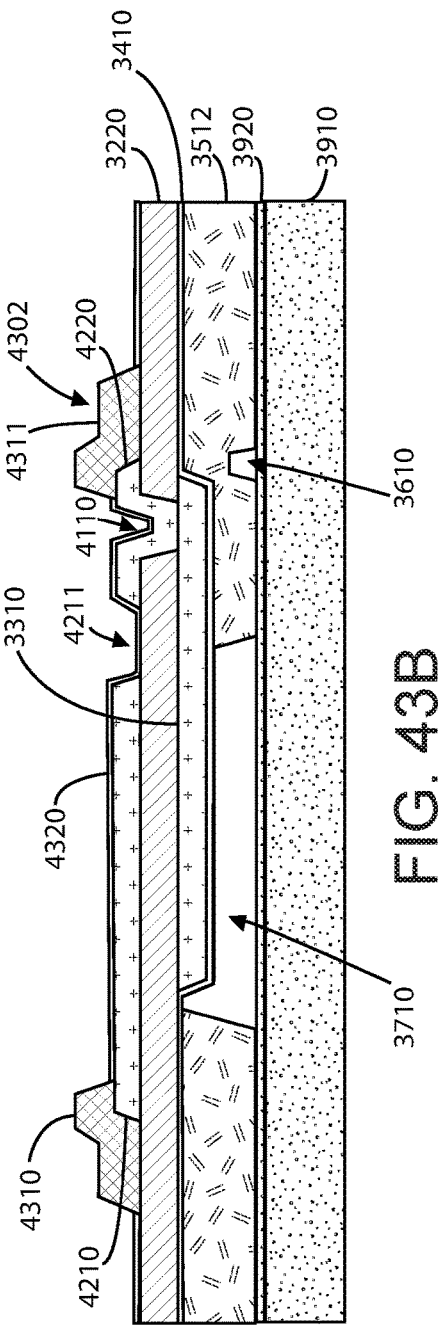
FIG. 43C
FIG. 43A
FIG. 43B

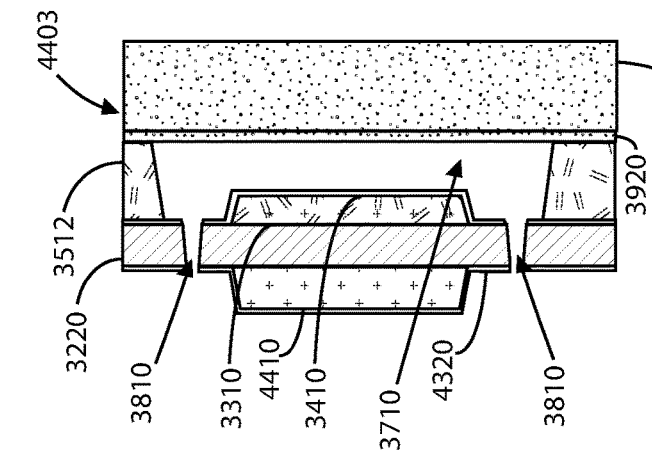
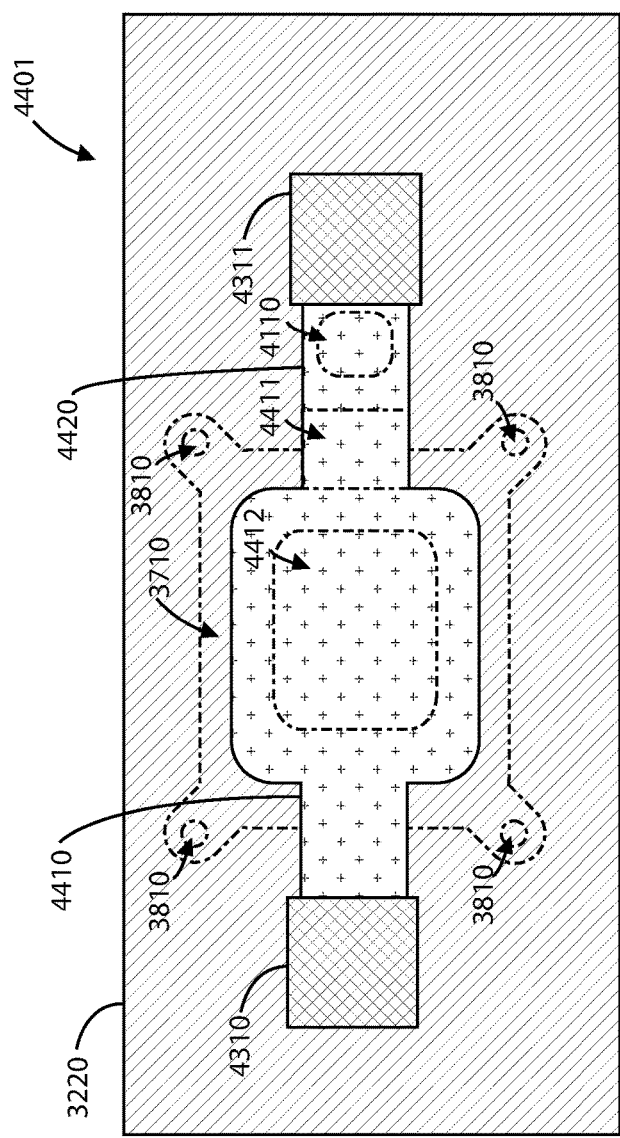
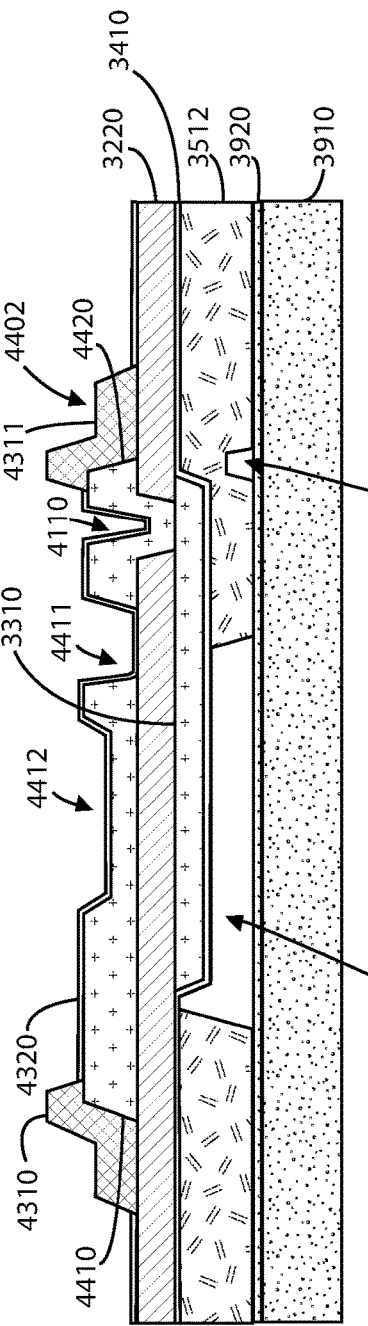

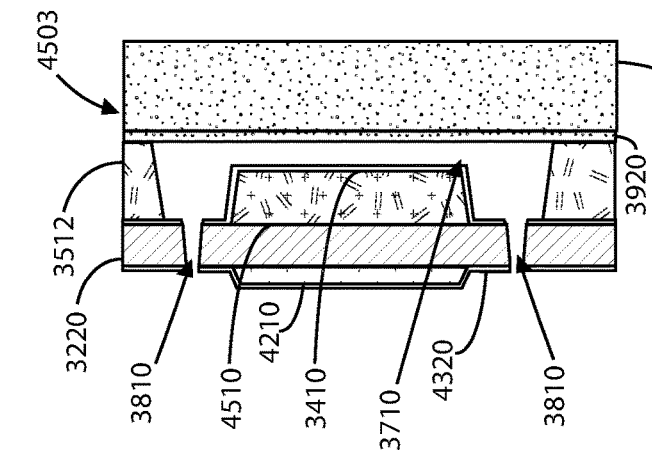
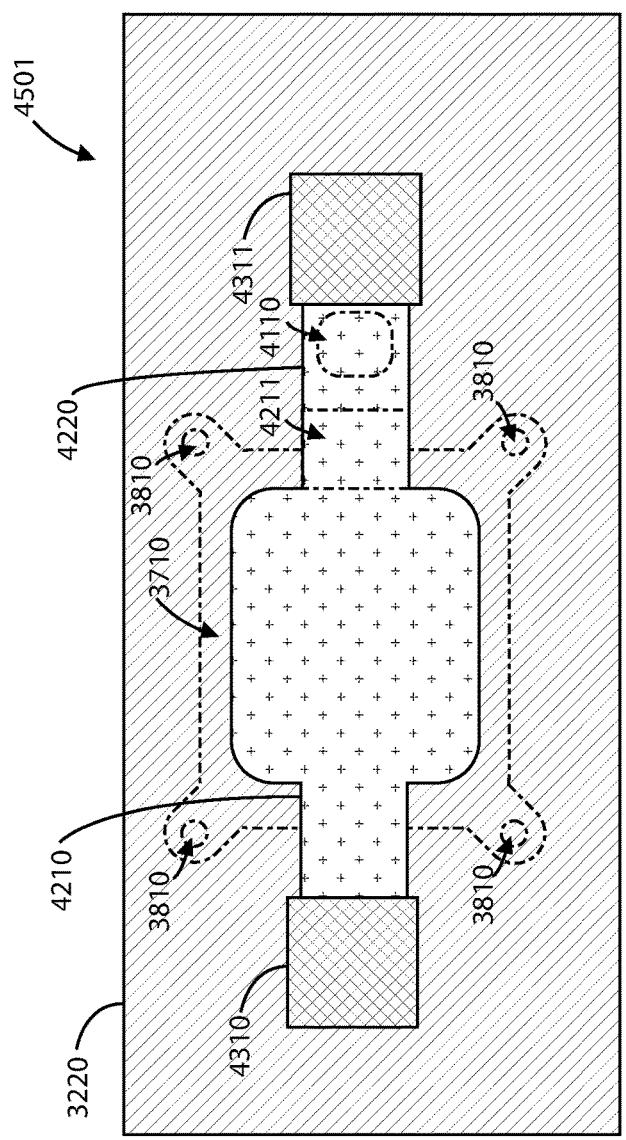
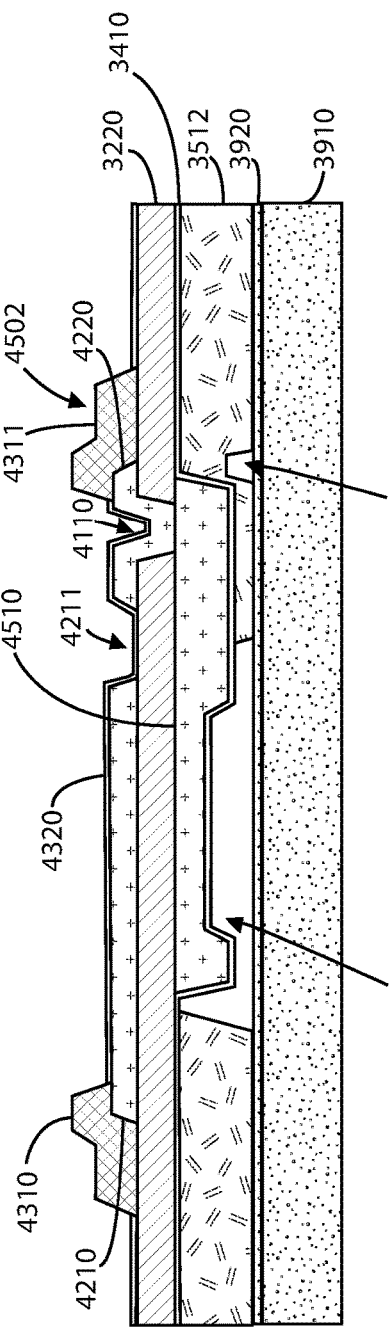
FIG. 45A
FIG. 45B
FIG. 45C

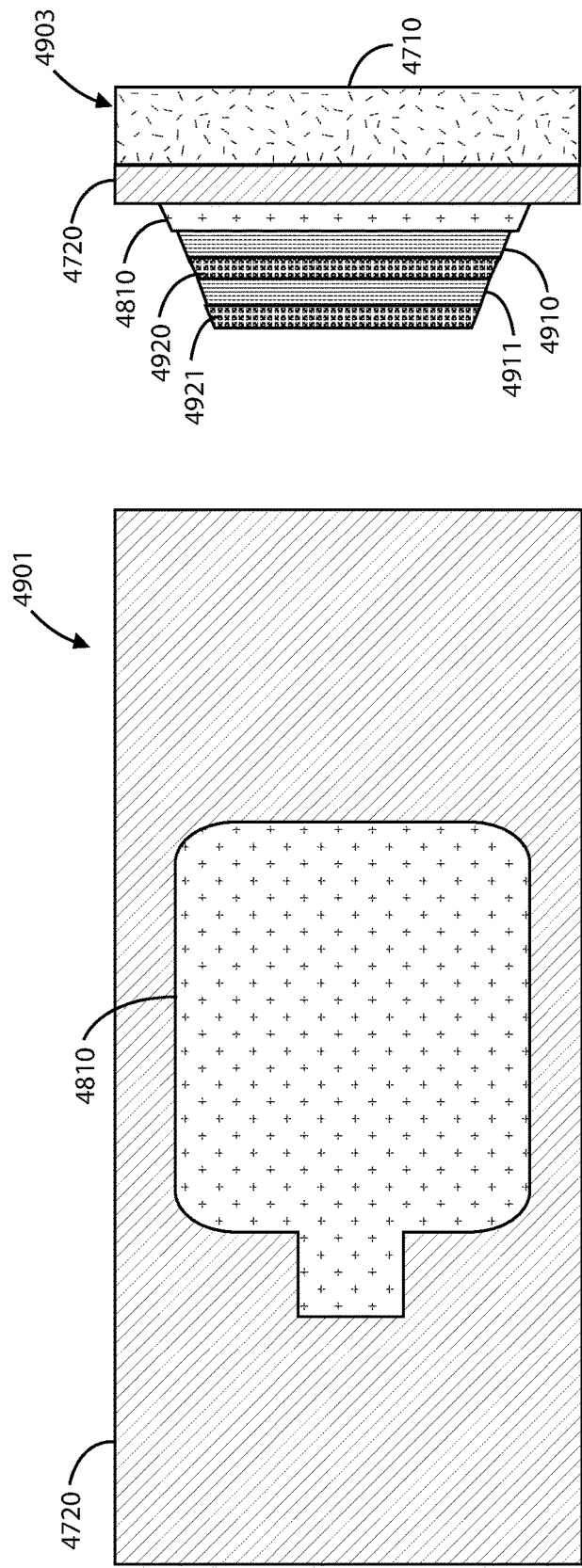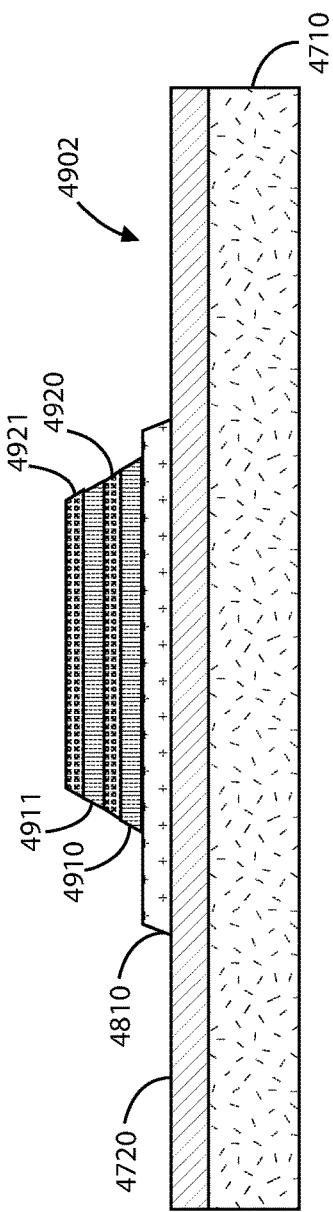

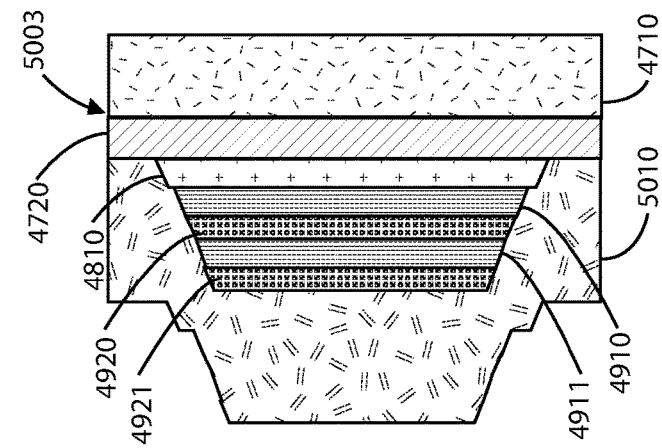
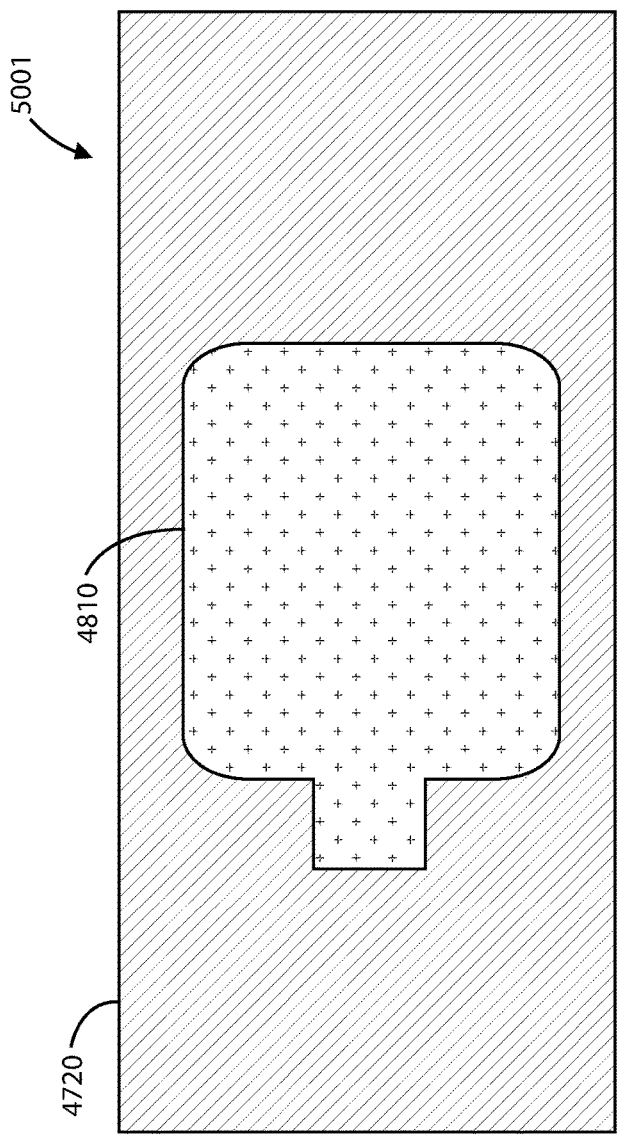
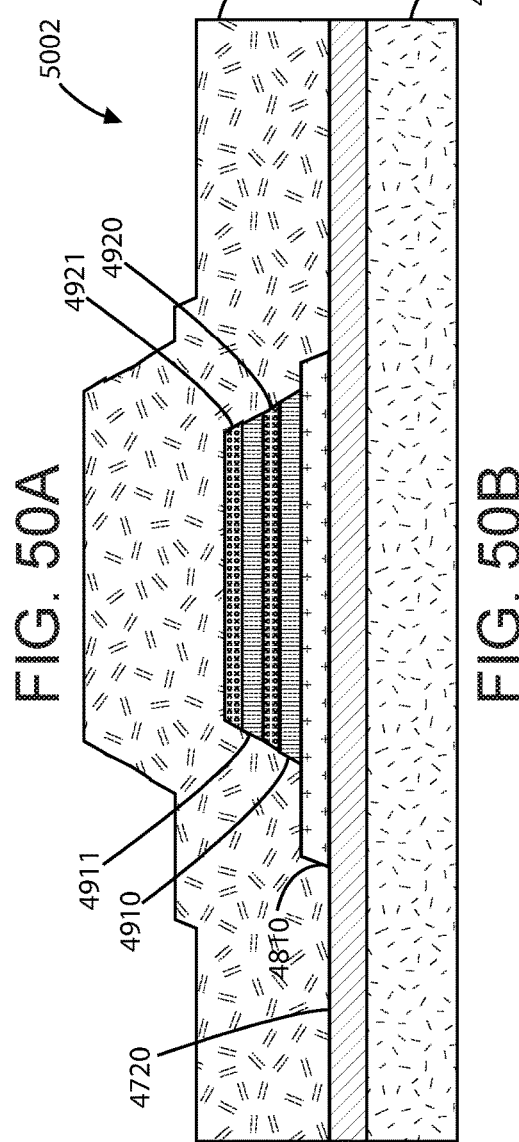

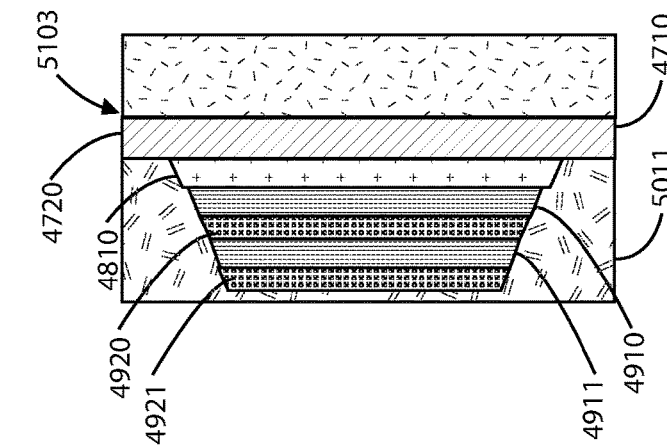
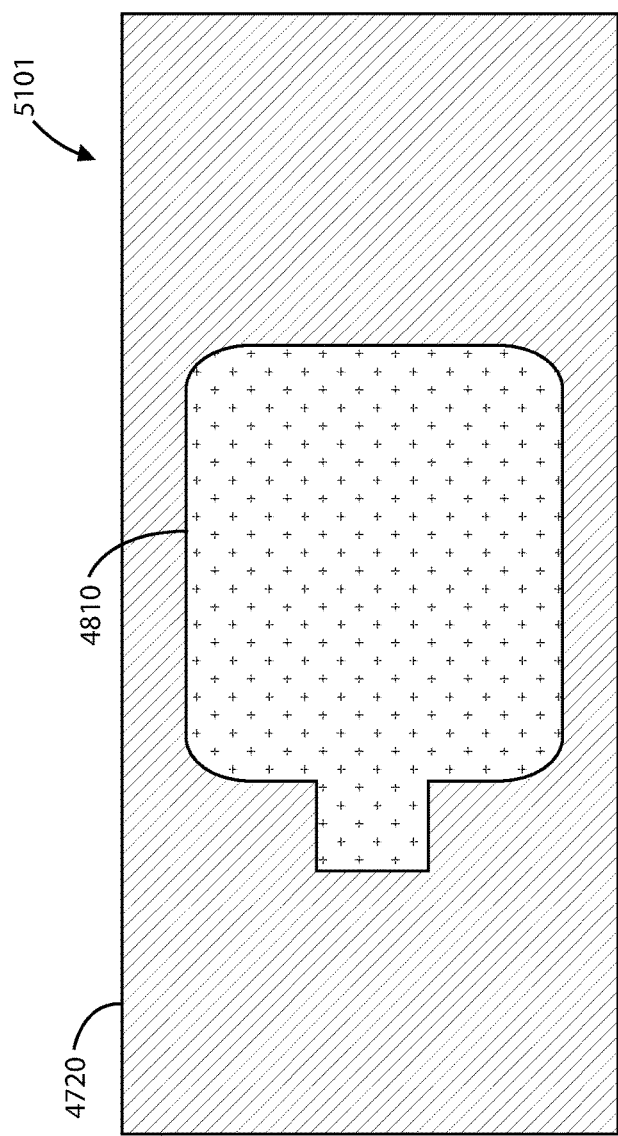
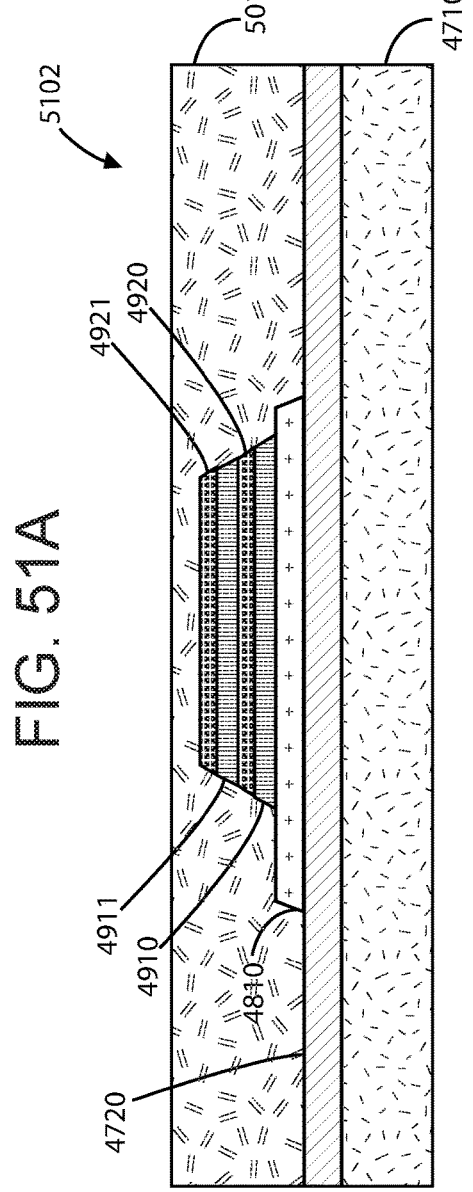

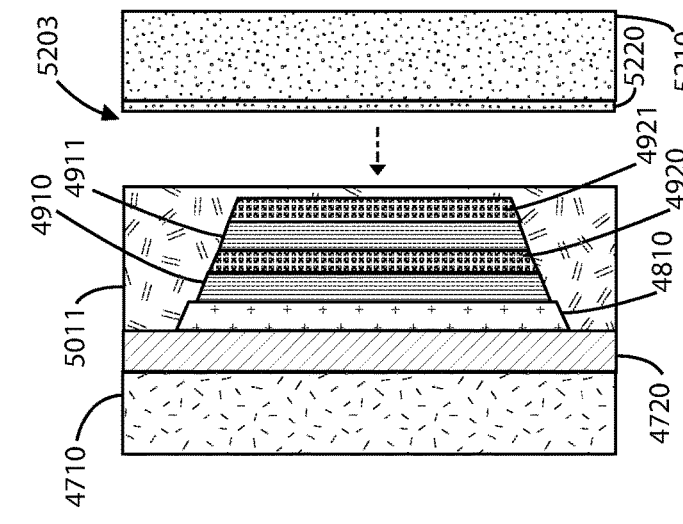
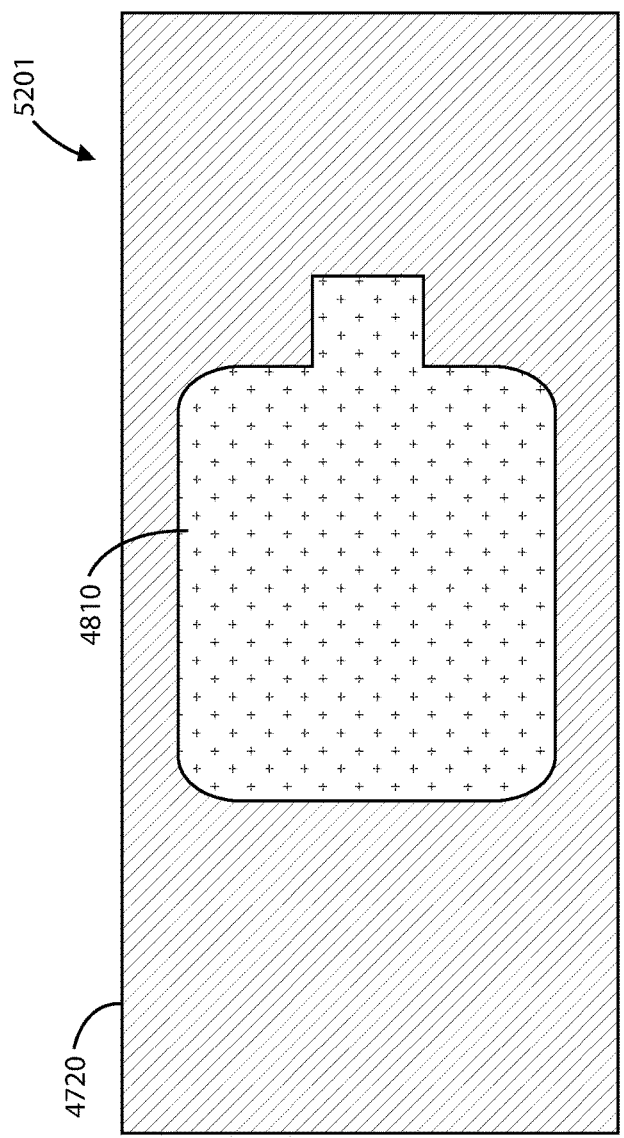
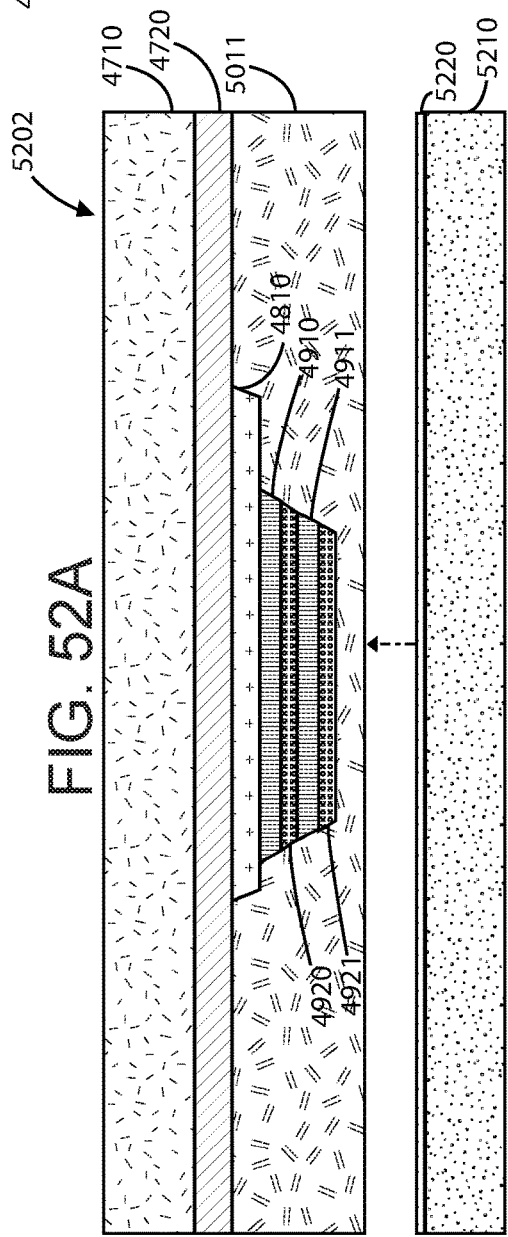

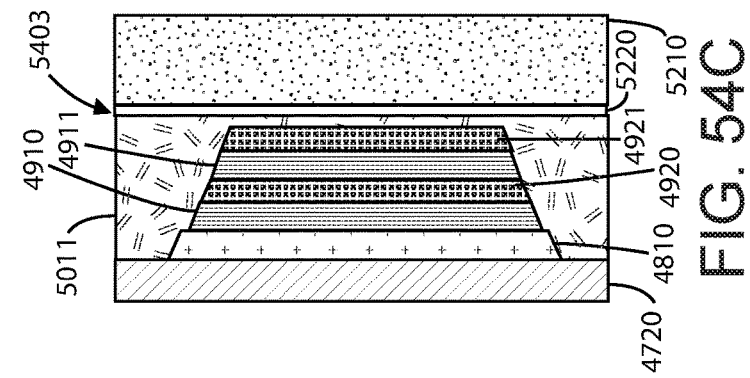
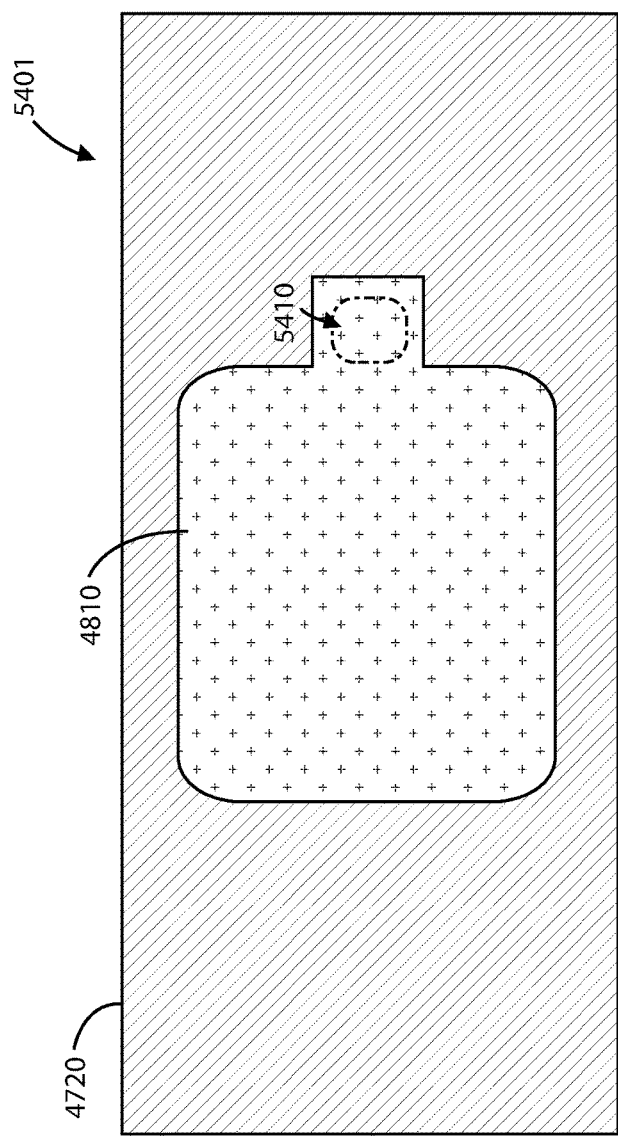
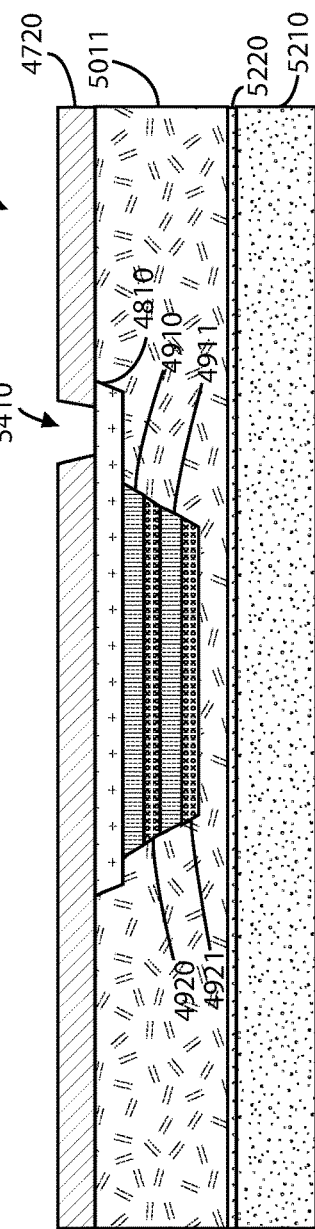
FIG. 54A
FIG. 54B
FIG. 54C

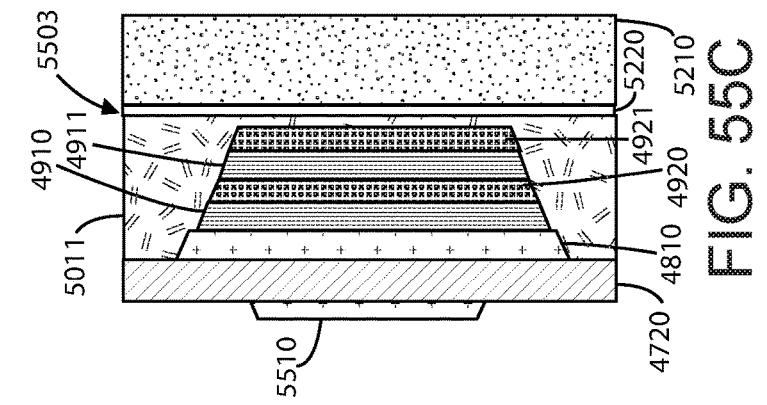
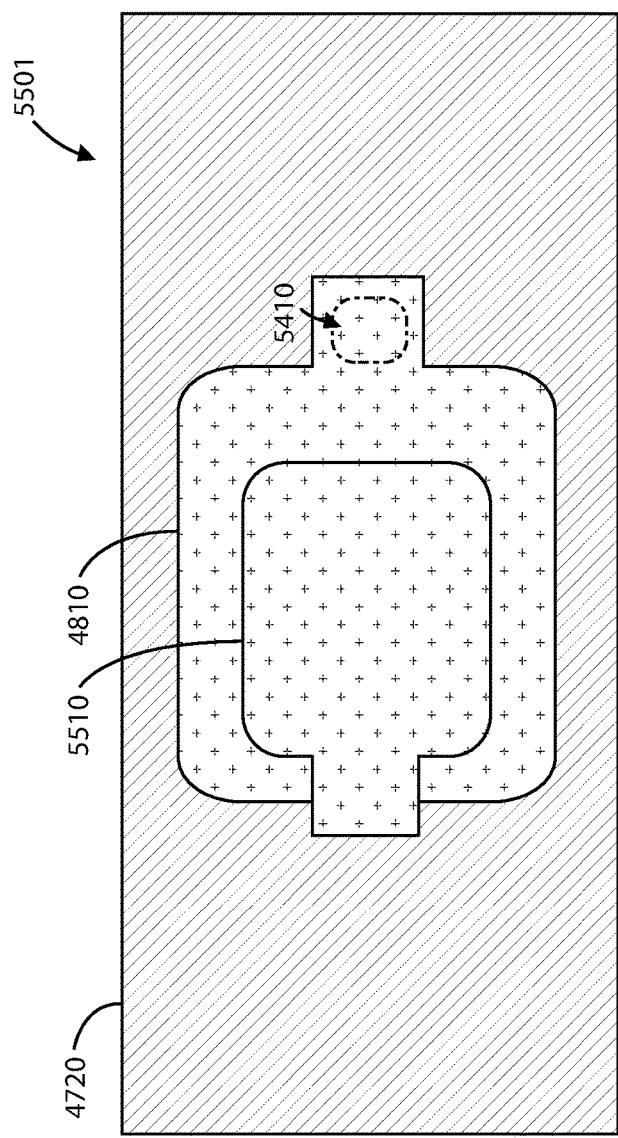
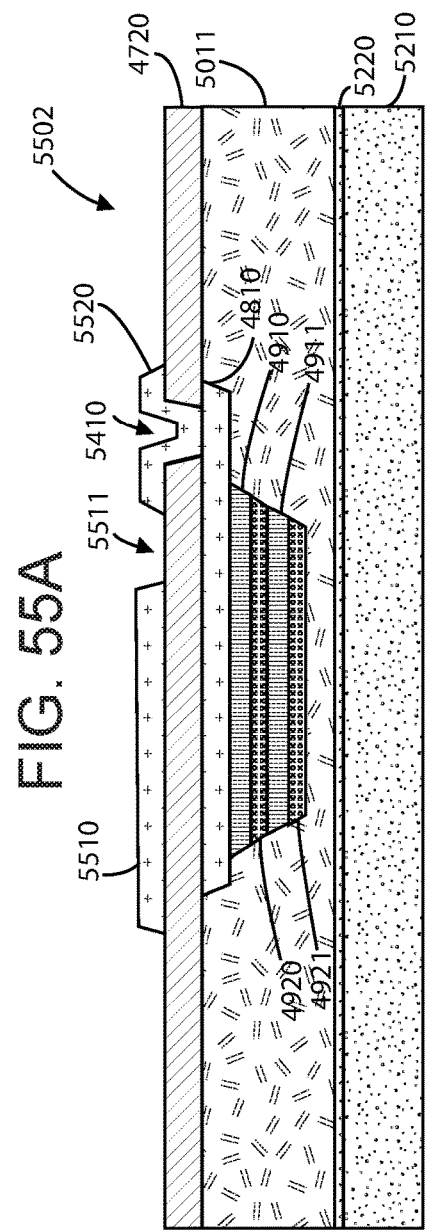

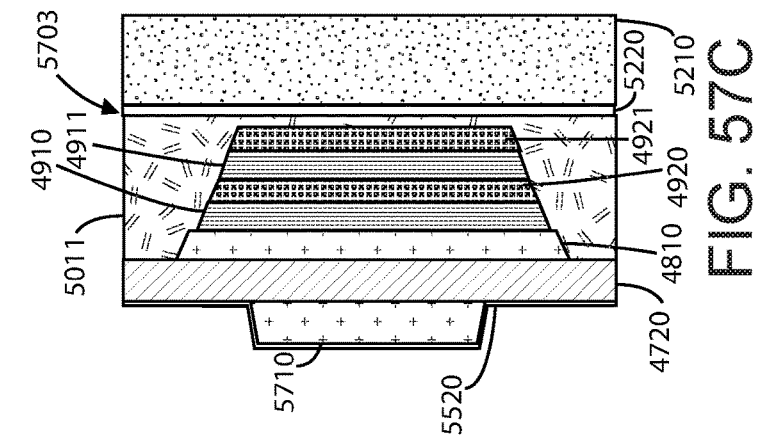
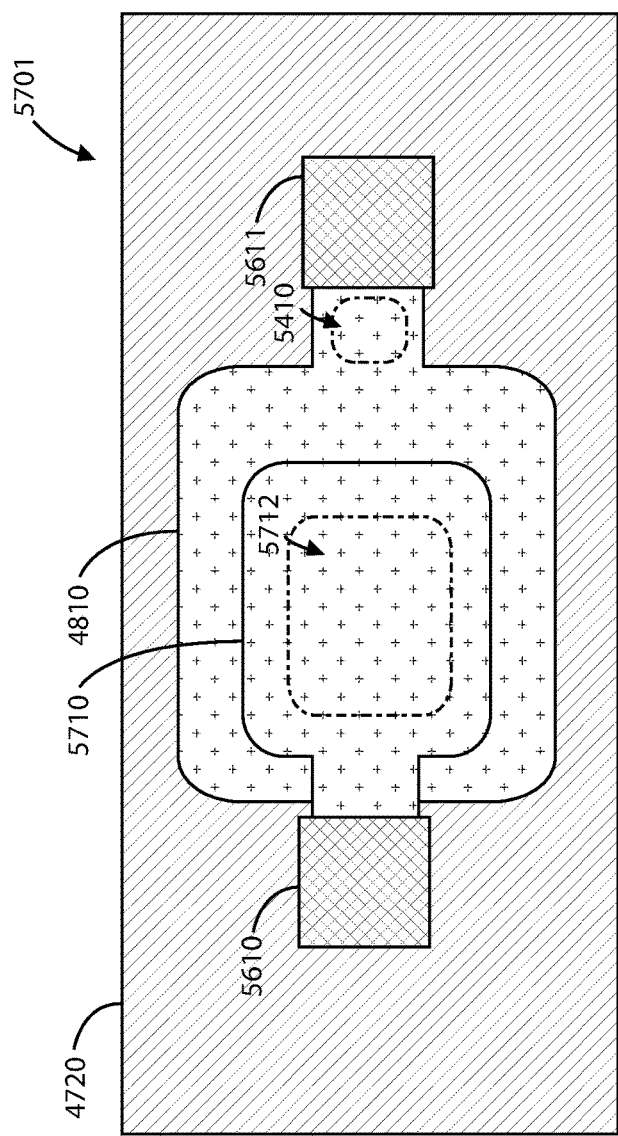
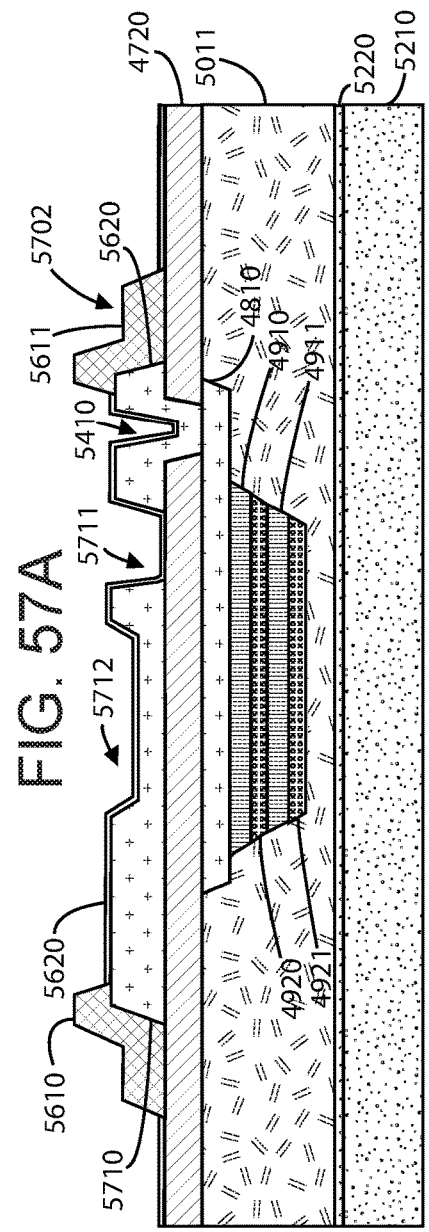
FIG. 57C
FIG. 57A
FIG. 57B

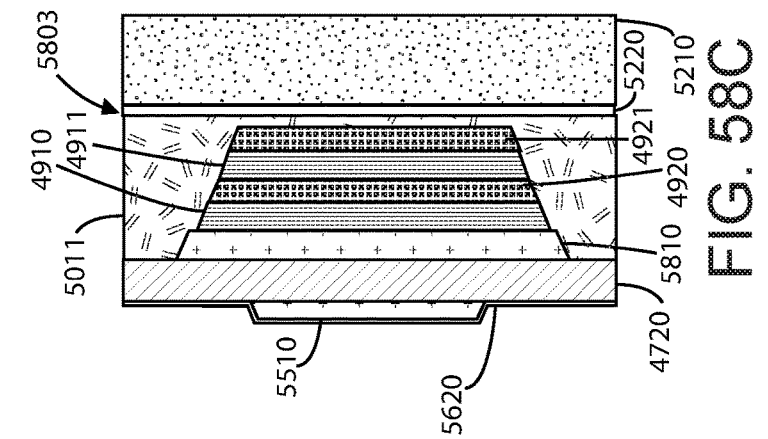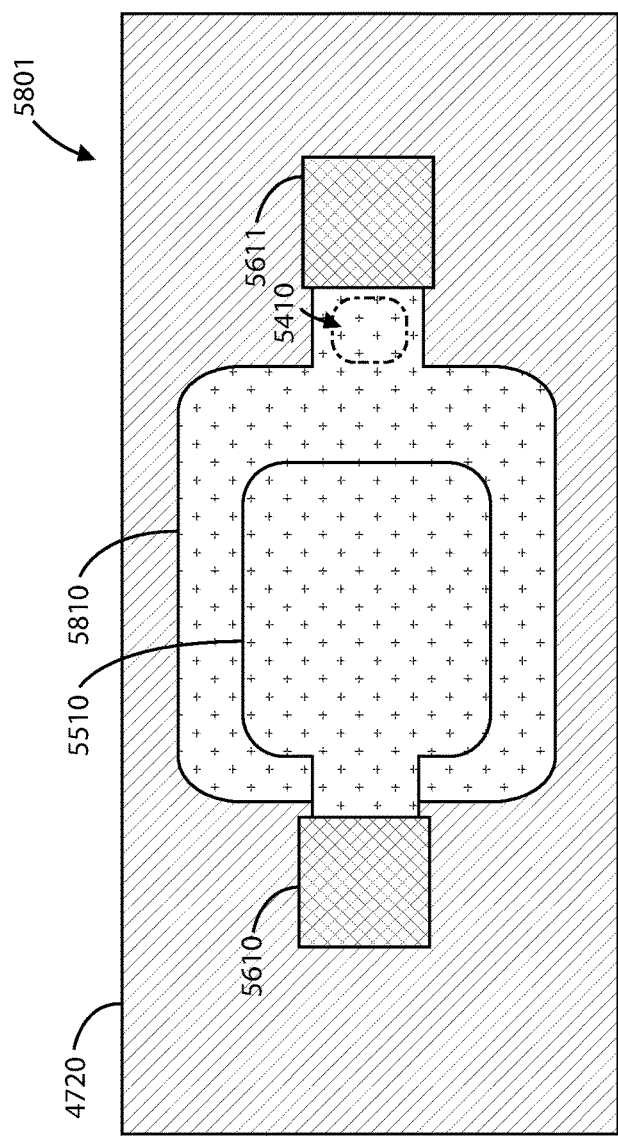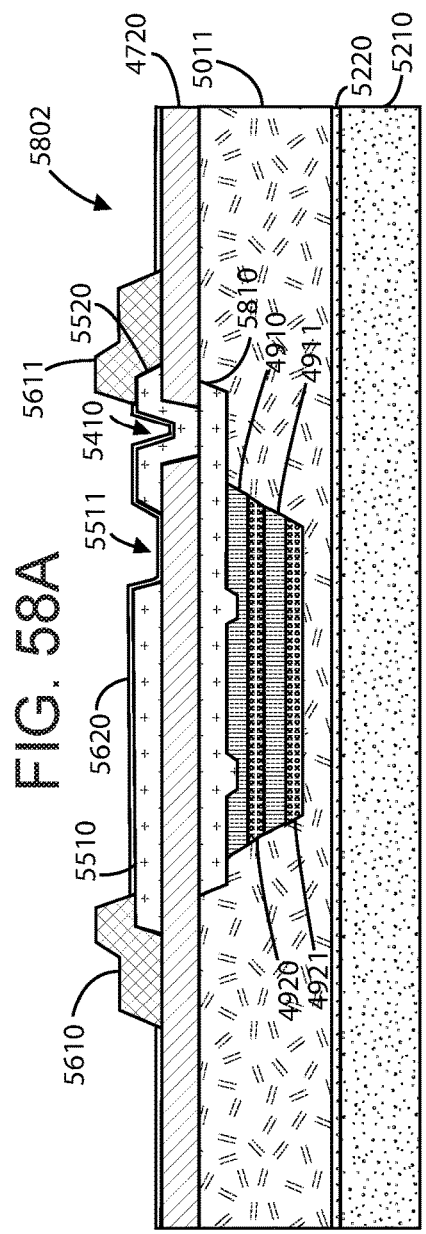

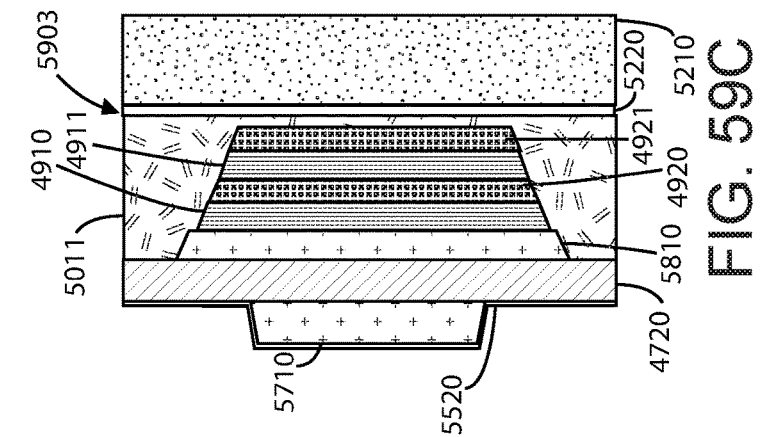
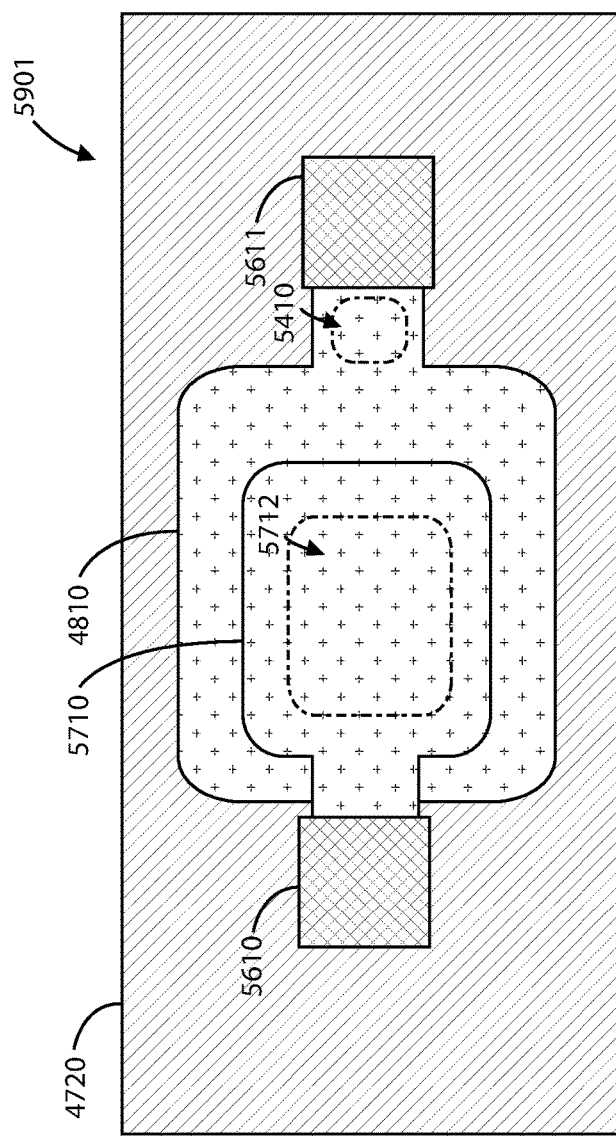
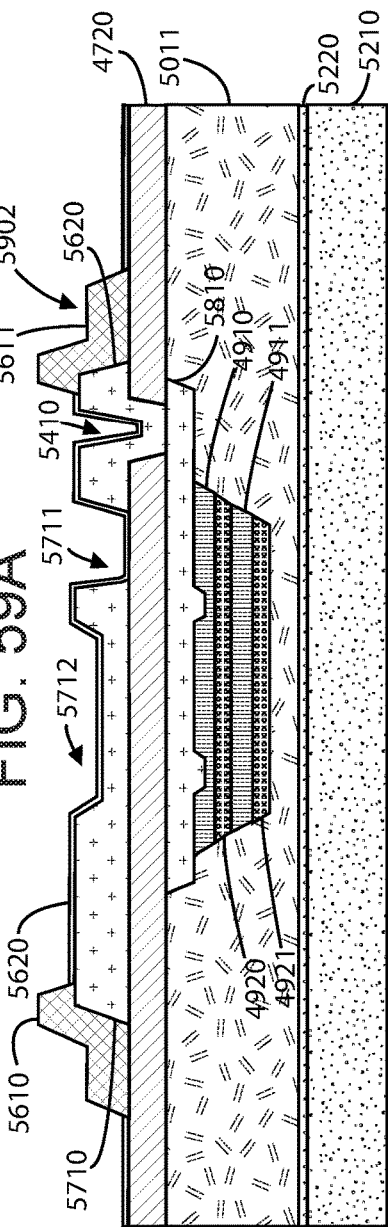
FIG. 59A
FIG. 59B
FIG. 59C

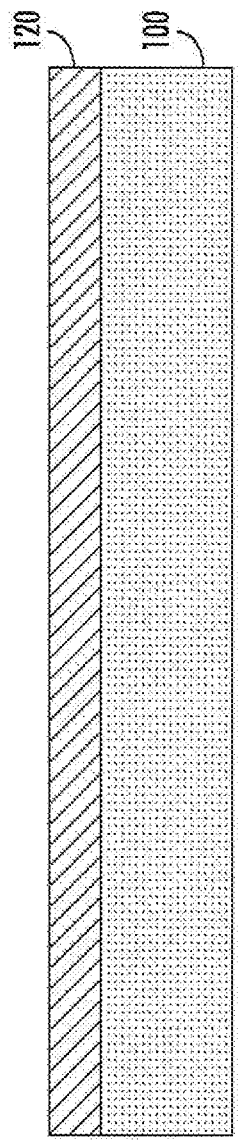
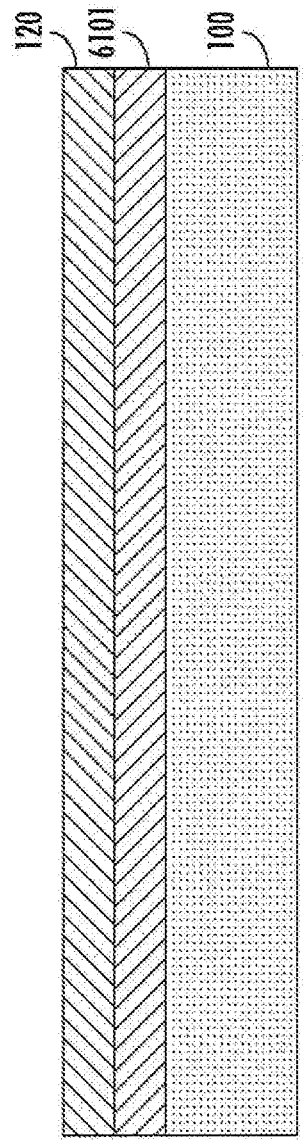
FIG. 62
FIG. 63

__US 11,895,920 B2__

METHODS OF FORMING GROUP III PIEZOELECTRIC THIN FILMS VIA REMOVAL OF PORTIONS OF FIRST SPUTTERED MATERIAL

CROSS-REFERENCE TO RELATED APPLICATIONS AND CLAIM FOR PRIORITY

The present application claims priority to and is a divisional of U.S. patent application Ser. No. 16/742,202; titled "METHODS OF FORMING GROUP III PIEZOELECTRIC THIN FILMS VIA REMOVAL OF PORTIONS OF FIRST SPUTTERED MATERIAL" filed Jan. 14, 2020 which claims priority to U.S. Provisional Patent Application Ser. No. 62/887,126 entitled "METHODS OF FORMING GROUP III PIEZOELECTRIC THIN FILMS VIA REMOVAL OF PORTIONS OF FIRST SPUTTERED MATERIAL," filed in the U.S.P.T.O, on Aug. 15, 2019, and is a continuation-in-part application of U.S. patent application Ser. No 16/513,143 entitled "METHODS OF FORMING GROUP III PIEZOELECTRIC THIN FILMS VIA SPUTTERING," filed in the U.S.P.T.O, on Jul. 16, 2019, which was a continuation-in-part application of U.S. patent application Ser. No. 15/784,919 titled "PIEZOELECTRIC ACOUSTIC RESONATOR MANUFACTURED WITH PIEZOELECTRIC THIN FILM TRANSFER PROCESS," filed Oct. 16, 2017 (now U.S. Pat. No. 10,355,659 which issued on Jul. 16, 2019), the disclosures of which are all incorporated herein by reference in their entireties.

The present application incorporates by reference, for all purposes, the following concurrently filed patent applications, all commonly owned: U.S. patent application Ser. No. 14/298,057 titled "RESONANCE CIRCUIT WITH A SINGLE CRYSTAL CAPACITOR DIELECTRIC MATERIAL", filed Jun. 6, 2014 (now U.S. Pat. No. 9,673,384 issued Jun. 6, 2017), U.S. patent application Ser. No. 14/298,076 titled "ACOUSTIC RESONATOR DEVICE WITH SINGLE CRYSTAL PIEZO MATERIAL AND CAPACITOR ON A BULK SUBSTRATE", filed Jun. 6, 2014 (now U.S. Pat. No. 9,537,465 issued Jan. 3, 2017), U.S. patent application Ser. No. 14/298,100 titled "INTEGRATED CIRCUIT CONFIGURED WITH TWO OR MORE SINGLE CRYSTAL ACOUSTIC RESONATOR DEVICES", filed Jun. 6, 2014 (now U.S. Pat. No. 9,571,061 issued Feb. 14, 2017), U.S. patent application Ser. No. 14/341,314 titled "WAFER SCALE PACKAGING", filed Jul. 25, 2014, U.S. patent application Ser. No. 14/449,001 titled "MOBILE COMMUNICATION DEVICE CONFIGURED WITH A SINGLE CRYSTAL PIEZO RESONATOR STRUCTURE", filed Jul. 31, 2014 (now U.S. Pat. No. 9,716,581 issued Jul. 25, 2017), and U.S. patent application Ser. No. 14/469,503 titled "MEMBRANE SUBSTRATE STRUCTURE FOR SINGLE CRYSTAL ACOUSTIC RESONATOR DEVICE", filed Aug. 26, 2014.

BACKGROUND

The present invention relates generally to electronic devices. More particularly, the present invention provides techniques related to a method of manufacture and a structure for bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Wireless data communications can utilize RF filters operating at frequencies around 5 GHz and higher. It is known to use Bulk acoustic Wave Resonators (BAWR) incorporating polycrystalline piezoelectric thin films for some applications. While some polycrystalline based piezoelectric thin film BAWRs may be adequate for filters operating at frequencies from about 1 to 3 GHz, applications at frequencies around 5 GHz and above may present obstacles due to the reduced crystallinity associated with such thin poly-based films.

BRIEF DESCRIPTION OF THE DRAWINGS

FIGS. 4D and 4E are simplified diagrams illustrating an alternative method for conducting the method step of forming a topside micro-trench as described in FIG. 4A.

FIGS. 59A-59C are simplified diagrams illustrating various cross-sectional views of a single crystal acoustic resonator device and of method steps for a solidly mounted transfer process for single crystal acoustic resonator devices according to an example of the present invention.

FIG. 62 is a cross-sectional view illustrating a piezoelectric thin film sputtered directly onto the substrate which may be processed as shown, for example, in FIGS. 60 and 64 in some embodiments according to the invention.

FIG. 63 is a cross-sectional view illustrating a piezoelectric thin film sputtered directly onto a seed layer on the substrate which may be processed as shown, for example, in FIGS. 60 and 64 in some embodiments according to the invention.

DETAILED DESCRIPTION OF EMBODIMENTS ACCORDING TO THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

Figure 1A:
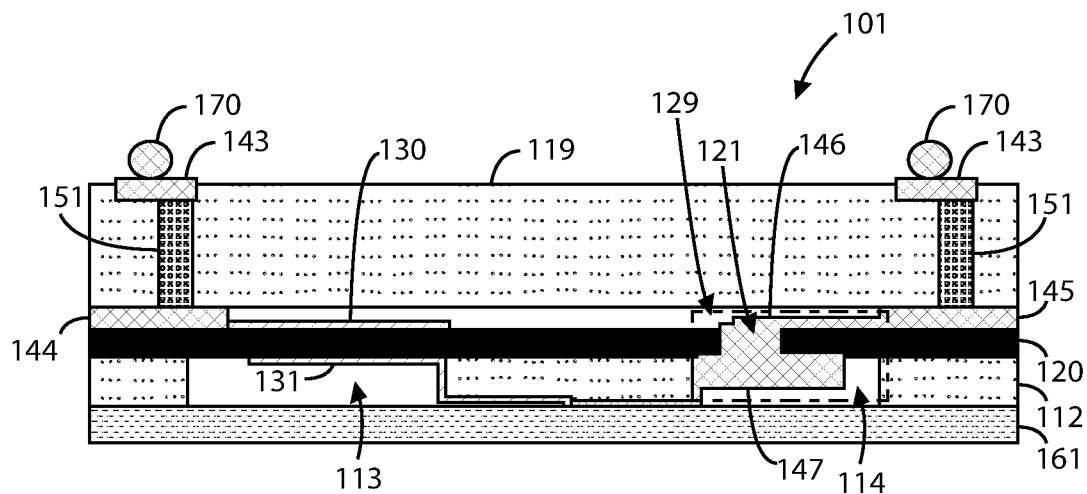
FIG. 1A is a simplified diagram illustrating an acoustic resonator device having topside interconnections according to an example of the present invention.

FIG. 1A is a simplified diagram illustrating an acoustic resonator device 101 having topside interconnections according to an example of the present invention. As shown, device 101 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 144, and topside metal 145 with topside metal plug 146. Solder balls 170 are electrically coupled to the one or more top bond pads 143.

The thinned substrate 112 has the first and second backside trenches 113, 114. A backside metal electrode 131 is formed underlying a portion of the thinned seed substrate 112, the first backside trench 113, and the topside metal electrode 130. The backside metal plug 147 is formed underlying a portion of the thinned seed substrate 112, the second backside trench 114, and the topside metal 145. This backside metal plug 147 is electrically coupled to the topside metal plug 146 and the backside metal electrode 131. A backside cap structure 161 is bonded to the thinned seed substrate 112, underlying the first and second backside trenches 113, 114. Further details relating to the method of manufacture of this device will be discussed starting from FIG. 2.

Figure 1B:
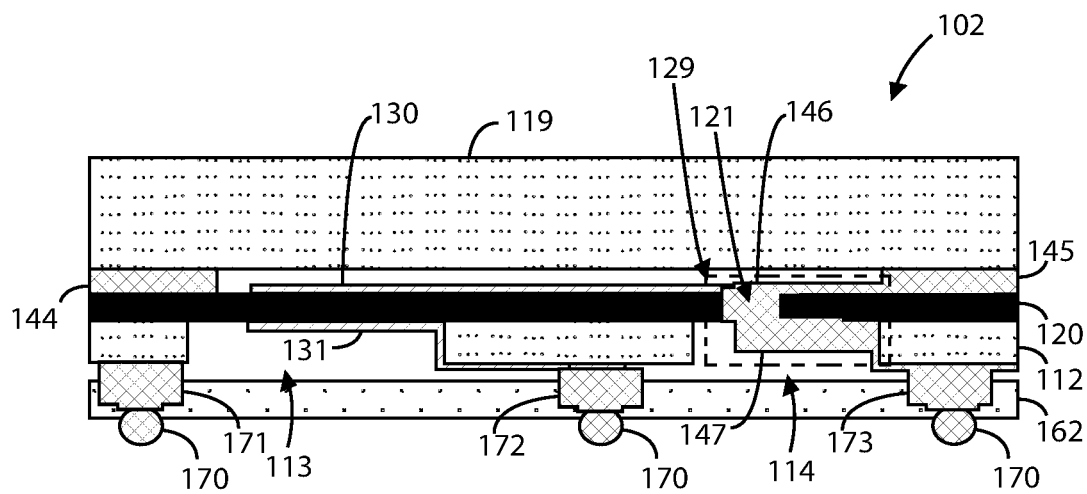
FIG. 1B is a simplified diagram illustrating an acoustic resonator device having bottom-side interconnections according to an example of the present invention.

FIG. 1B is a simplified diagram illustrating an acoustic resonator device 102 having backside interconnections according to an example of the present invention. As shown, device 101 includes a thinned seed substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal plug 146. This backside metal plug 147 is electrically coupled to the topside metal plug 146. A backside cap structure 162 is bonded to the thinned seed substrate 112, underlying the first and second backside trenches. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
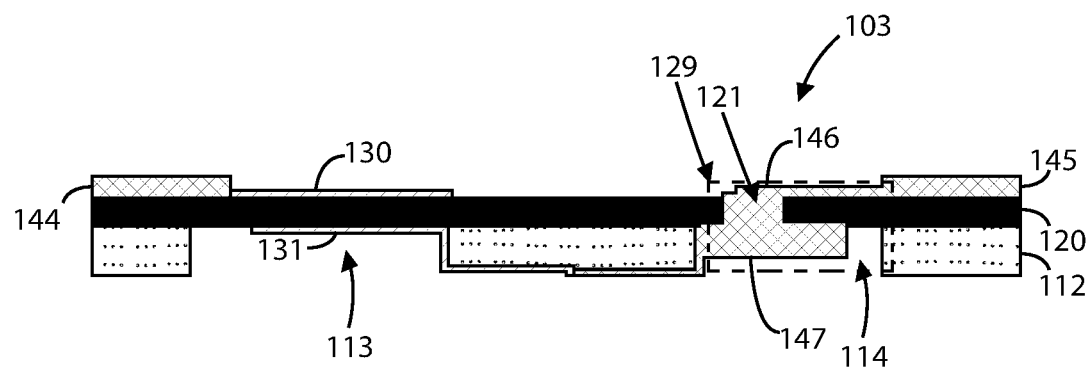
FIG. 1C is a simplified diagram illustrating an acoustic resonator device having interposer/cap-free structure interconnections according to an example of the present invention.

FIG. 1C is a simplified diagram illustrating an acoustic resonator device having interposer/cap-free structure interconnections according to an example of the present invention. As shown, device 103 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
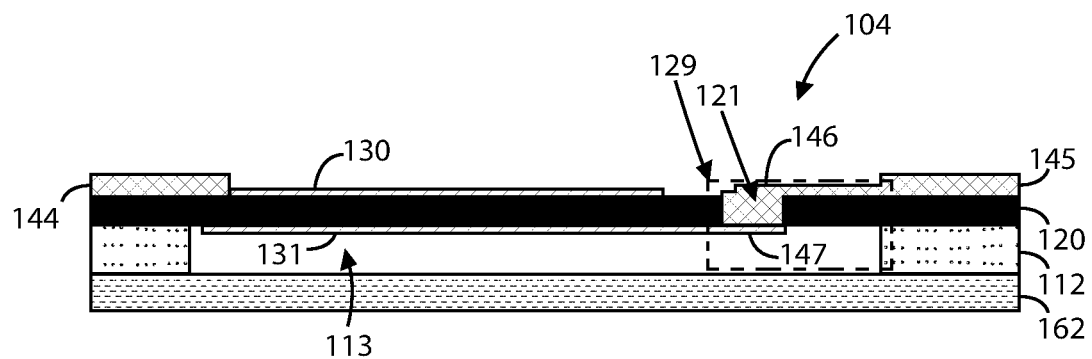
FIG. 1D is a simplified diagram illustrating an acoustic resonator device having interposer/cap-free structure interconnections with a shared backside trench according to an example of the present invention.

FIG. 1D is a simplified diagram illustrating an acoustic resonator device having interposer/cap-free structure interconnections with a shared backside trench according to an example of the present invention. As shown, device 104 includes a thinned seed substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside metal electrode 130 is formed overlying the piezoelectric layer 120. The thinned substrate 112 has a first backside trench 113. A backside metal electrode 131 is formed underlying a portion of the thinned seed substrate 112, the first backside trench 113, and the topside metal electrode 130. A backside metal 147 is formed underlying a portion of the thinned seed substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
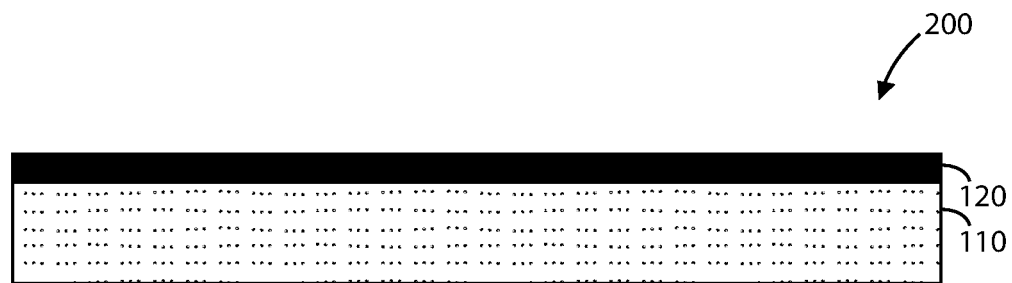
FIGS. 2 and 3 are simplified diagrams illustrating steps for a method of manufacture for an acoustic resonator device according to an example of the present invention.
Figure 3:
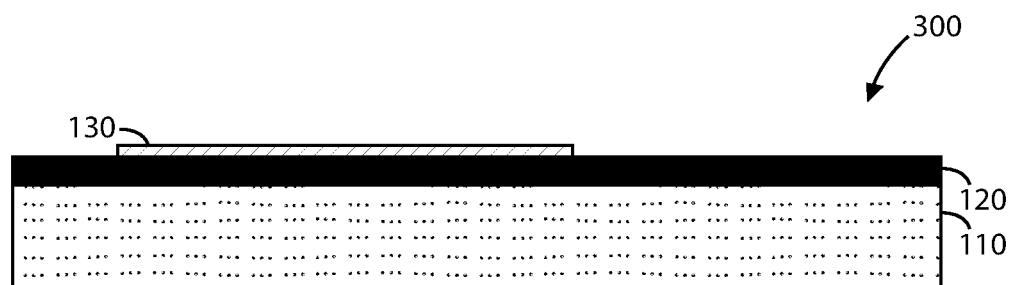

FIGS. 2 and 3 are simplified diagrams illustrating steps for a method of manufacture for an acoustic resonator device according to an example of the present invention. This method illustrates the process for fabricating an acoustic resonator device similar to that shown in FIG. 1A. FIG. 2 can represent a method step of providing a partially processed piezoelectric substrate. As shown, device 200 includes a seed substrate 110 with a piezoelectric layer 120 formed overlying. In a specific example, the seed substrate can include silicon, silicon carbide, aluminum oxide, or single crystal aluminum gallium nitride materials, or the like. The piezoelectric layer 120 can include a piezoelectric single crystal layer or a thin film piezoelectric single crystal layer.

As appreciated by the present inventors, a high crystallinity piezoelectric thin film 120 may be formed on the substrate 110 by sputtering a Group III target material (such as Al, Sc, or Al and Sc, and other materials) in a plasma environment and subsequently removing the first formed portion of the piezoelectric thin film 120 by processing the back-side of the piezoelectric thin film 120. Removing the portion of the piezoelectric thin film 120 that was first formed on the substrate can eliminate the lower crystallinity portion of the piezoelectric thin film such that the remaining portion of the piezoelectric thin film 120 has a higher crystallinity. For example, in some embodiments, a piezoelectric thin film of AlN or AlScN can be processed to remove about at least 500 Angstroms of material from the back-side of the film (the portion that was first formed on the substrate) so that the remaining portion has a crystallinity of less than about 1.0 degree at Full Width Half Maximum (FWHM) to about 10 arcseconds at FWHM measured using X-ray diffraction (XRD). In some embodiments, the crystallinity of the piezoelectric thin film can be in a range between about 1.0 degree at FWHM to about 0.5 degrees at FWHM measured using XRD.

In some embodiments, the substrate 110 may optionally be heated to a relatively high sputtering temperature, such as about 350 degrees Centigrade to about 850 degrees Centigrade during formation of the piezoelectric thin film 120. In some embodiments, the sputtering temperature can be in a range between about 400 degrees Centigrade to about 600 Degrees centigrade. In some embodiments according to the invention, lower temperatures may also be used to sputter the piezoelectric thin films 120 described herein onto the substrate.

In some embodiments, the piezoelectric thin film 120 can be formed directly on the substrate such that the piezoelectric thin film 120 contacts the surface of the substrate. In some embodiments, a seed layer can be formed on the substrate 110 before forming the piezoelectric thin film 120 so that the seed layer is located between the substrate 110 and the piezoelectric thin film 120. Accordingly, in some embodiments the seed layer is included in the first formed portion of the piezoelectric thin film 120, which may be removed from the back-side as described herein. In some embodiments, the seed layer includes one or more Group III elements that are also included in the piezoelectric thin film 120. For example, the seed layer can be formed to include Al if the piezoelectric thin film 120 comprises AlN or to include Al and Sc if the piezoelectric thin film 120 includes AlScN. Other Group III elements and seed layer components can also be used. In some embodiments, the seed layer can be formed using the same temperature used to form the piezoelectric thin film.

In some embodiments, the seed layer can be formed at a temperature that is less than the temperature used to form the piezoelectric thin film 120. For example, the seed layer may be formed at a temperature less than 400 degrees Centigrade whereas the temperature can be increased to more than 400 degrees Centigrade to about 600 Degrees centigrade when forming the piezoelectric thin film 120. In some embodiments, the seed layer can include Al and the piezoelectric thin film can be formed of AlN. In some embodiments, the seed layer can include Al and Sc and the piezoelectric thin film can be formed of AlScN. In some embodiments, the sputtering can be done with separate targets (for example a first target of Al and a second target of Sc). It will be understood that the operations described above can each be applied to the formation and processing of the piezoelectric thin film utilized in any of the embodiments described herein, including the piezoelectric thin films shown and described herein with reference to FIGS. 8-9A, 22-23, 39-40, and 52-53.

Figure 60:
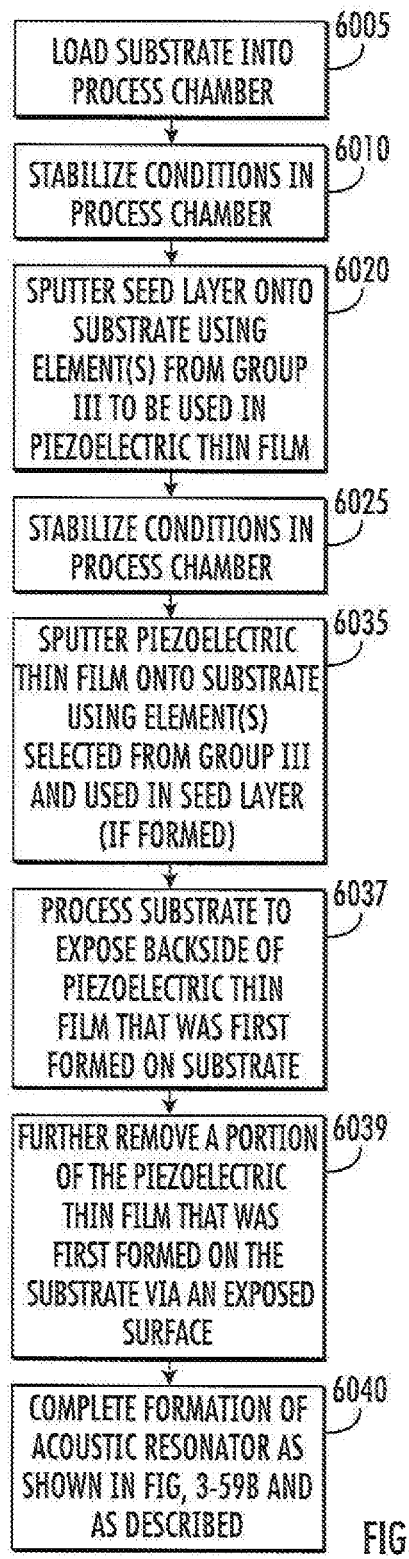
FIG. 60 is a flowchart illustrating methods of forming a high crystallinity piezoelectric thin film by removal of a portion of the thin film that is first formed on the substrate, for inclusion in devices shown, for example, FIGS. 8-9A, 22-23, 39-40, 52-53 in some embodiments according to the invention.
Figure 61:
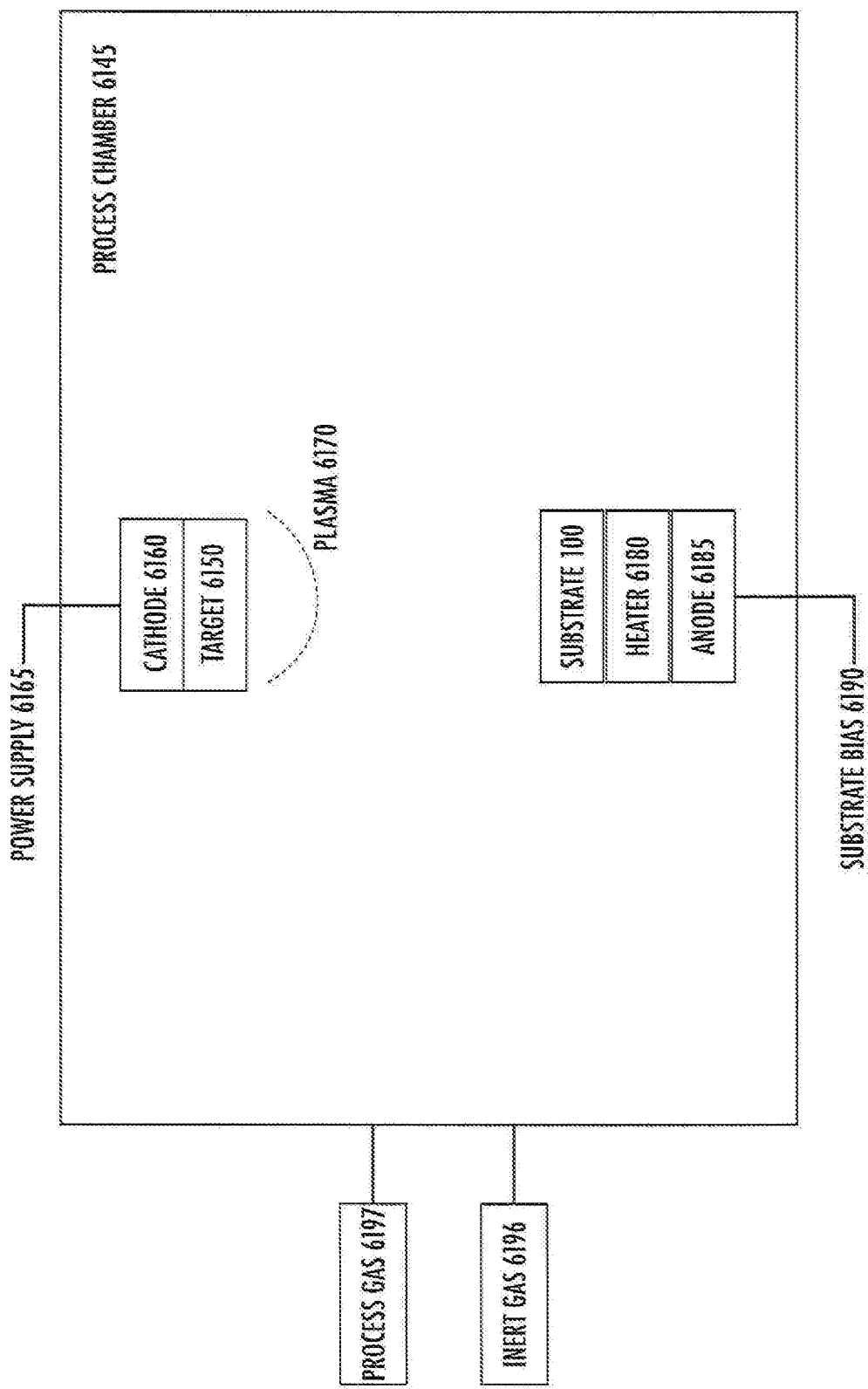
FIG. 61 is a schematic illustration of a sputtering chamber that can be used to form the high crystallinity piezoelectric thin films on the substrate using a Group III target material (such as Al, Sc, or Al and Sc) in a plasma environment where the substrate may be optionally heated to a relatively high sputtering temperature as shown, for example, in FIGS. 60 and 64 in some embodiments according to the invention.

FIG. 60 is a flowchart illustrating methods of forming a piezoelectric thin film on a substrate, which may be subsequently processed to expose the back-side surface of the film and to remove the portion of the film that was first formed on the substrate as described in reference to, for example, FIGS. 8-9A, 22-23, 39-40, and 52-53 in some embodiments according to the invention. FIG. 61 is a schematic illustration of a sputtering chamber that can be used to form the high crystallinity piezoelectric thin films on the substrate 100 using a Group III target material (such as Al, Sc, or Al and Sc) in a plasma environment including the capability to heat the substrate 100 to a relatively high sputtering temperature in some embodiments according to the invention.

According to FIGS. 60, 61, 62, and 63 the substrate (including substrates 100, 1610, 3210, and 4710 shown in FIGS. 8-9A, 22-23, 39-40, 52-53, respectively) can be loaded into the sputtering process chamber 6145 illustrated in FIG. 61 (block 6005). It will be understood that the substrate 100 may comprise Silicon, Sapphire, SiC, or other material. In some embodiments, the substrate 100 may be pre-processed prior to sputtering. For example, the substrate 100 may be etched to remove any unwanted oxides and/or may be heated to out-gas any materials from the substrate 100. Still further, these processes may be carried out in a chamber that is coupled to the sputtering process chamber 6145 via a cluster type configuration or carried out in a separate system.

The atmosphere in the sputtering process chamber 6145 may be stabilized prior to the sputtering process (block 6010). It will be understood that the term "stabilize" means (in reference to the sputtering process chamber 6145) that the controllable parameters associated with the sputtering process described herein are brought to their initial values before conducting the subsequent sputtering operations. For example, controllable parameters associated with the sputtering process described herein can include pressure in the chamber, temperature of the substrate, power levels applied to the cathode and anode, the concentrations and amounts of the inert and process gases, the plasma, etc. as these parameters may drift during the sputtering process. In some embodiments, the inert gas 6196 and the process gas 6197 gas are introduced into the sputtering process chamber 6145 maintained at a pressure of about 1 to 5 mTorr. In some embodiments, the inert gas 6196 may be Argon and the process gas 6197 may be Nitrogen.

In some embodiments according to the invention, the piezoelectric thin film (including piezoelectric thin films 120, 1620, 3220, and 4720 shown in FIGS. 8-9A, 22-23, 39-40, 52-53, respectively) is formed directly on the substrate (as shown, for example, in FIG. 62) by sputtering a target 6150 using the ionized inert gas 6196 to create a plasma 6170 as shown in FIG. 61. It will be understood that the target can include an element selected from Group III (such as Al or Sc), which can be used to form a nitride of the target material as the piezoelectric thin film 120 on the substrate 100 using the Nitrogen process gas 6197 (block 6035). Accordingly, the piezoelectric thin film can be, for example, AlN, AlScN, AlCrN, HfMgAlN, or ZrMgAlN.

During the sputtering, a power level is provided at a cathode 6160 coupled to the target 6150 which creates the plasma 6170 (due to the ionization of the inert gas 6196) to eject the Group III element(s) from the target 6150 onto the substrate thereby forming the piezoelectric thin film 120 on the substrate. In some embodiments, the power level provided to the cathode 6160 can be changed during the sputtering. In still further embodiments, a substrate bias 6190 may be applied to the substrate via an anode 6185 during the sputtering of the Group III element(s) to adjust the strain within the piezoelectric thin film.

It will be further understood that in some embodiments according to the invention, the target can be first and second separate targets that each include an element selected from Group III (such as Al and Sc), which can be used to form a nitride of the target material as the piezoelectric thin film 120 on the substrate 100 using the Nitrogen process gas 6197. Accordingly, the piezoelectric thin film can be formed to be, for example AlScN, in the case of the first and second separate targets including respective Group III elements.

It will be further understood that in some embodiments according to the invention, the target can be a composite target that includes the first and second target materials selected from Group III (such as Al and Sc), which can be used to form a nitride of the target material as the piezoelectric thin film on the substrate using the Nitrogen process gas 6197. Accordingly, the piezoelectric thin film can be, for example AlScN, in the case of the target including two Group III elements. It will be understood that more than two Group III elements may be used as either separate targets or as a single composite target. Further any combination of targets and Group III elements may be used.

In some embodiments according to the invention, an optional seed layer 6101 can be formed directly on the substrate to form a nucleation layer prior to formation of the piezoelectric thin film, as shown in FIG. 63 (block 6020). In some embodiments, the seed layer 6101 is formed to include the same Group III element(s) included in the piezoelectric thin film. For example, if the piezoelectric thin film includes AlN, the seed layer 6101 can be formed using Al. In some embodiments, when the piezoelectric thin film includes AlScN, the seed layer 6101 can be formed using Al and Sc. During the sputtering of the seed layer 6101, a power level can be provided at the cathode 6160 coupled to the target 6150 which creates the plasma 6170 (due to the ionization of the inert gas 6196) to eject the Group III element(s) from the target 6150 onto the substrate thereby forming the seed layer 6101 on the substrate. In some embodiments, the power level provided to the cathode 6160 can be changed during the sputtering of the seed layer 6101. In still further embodiments, the power level at the cathode 6160 may be changed during the sputtering of the Group III element(s) onto the substrate to adjust the strain within the seed layer 6101. After formation of the optional seed layer 6101, the sputtering process chamber 6145 can be stabilized by adjusting the pressure and flows of the inert gas 6196 and the process gas 6197 (block 6025) before sputtering the piezoelectric thin film onto the seed layer 6101.

In some embodiments, the piezoelectric thin film is subjected to partial removal (block 6035) from the back-side so that the portion of the piezoelectric thin film that is first formed on the substrate is removed as described, for example, in reference to FIGS. 8-9, 22-23, 39-40, and 52-53 herein. Accordingly, a high crystallinity piezoelectric thin film may be formed on the substrate by sputtering a Group III target material (such as Al, Sc, or Al and Sc, and other materials) in a plasma environment and subsequently removing the first formed portion of the piezoelectric thin film by processing the substrate to expose the back-side of the piezoelectric thin film (block 6037) (the portion that was first formed on the substrate) and to further remove the portion of the piezoelectric thin film 120 that was first formed on the substrate (block 6039) to eliminate the lower crystallinity portion of the piezoelectric thin film so that the remaining portion of the piezoelectric thin film has a higher crystallinity. For example, in some embodiments, a piezoelectric thin film of AlN or AlScN can be processed to remove about at least 500 Angstroms of material from the back-side of the film (the portion that was first formed on the substrate) so that the remaining portion has a crystallinity of less than about 1.0 degree at Full Width Half Maximum (FWHM) to about 10 arcseconds at FWHM measured using X-ray diffraction (XRD). In some embodiments, the crystallinity of the piezoelectric thin film can be in a range between about 1.0 degree at FWHM to about 0.5 degrees at FWHM measured using XRD.

Figure 64:
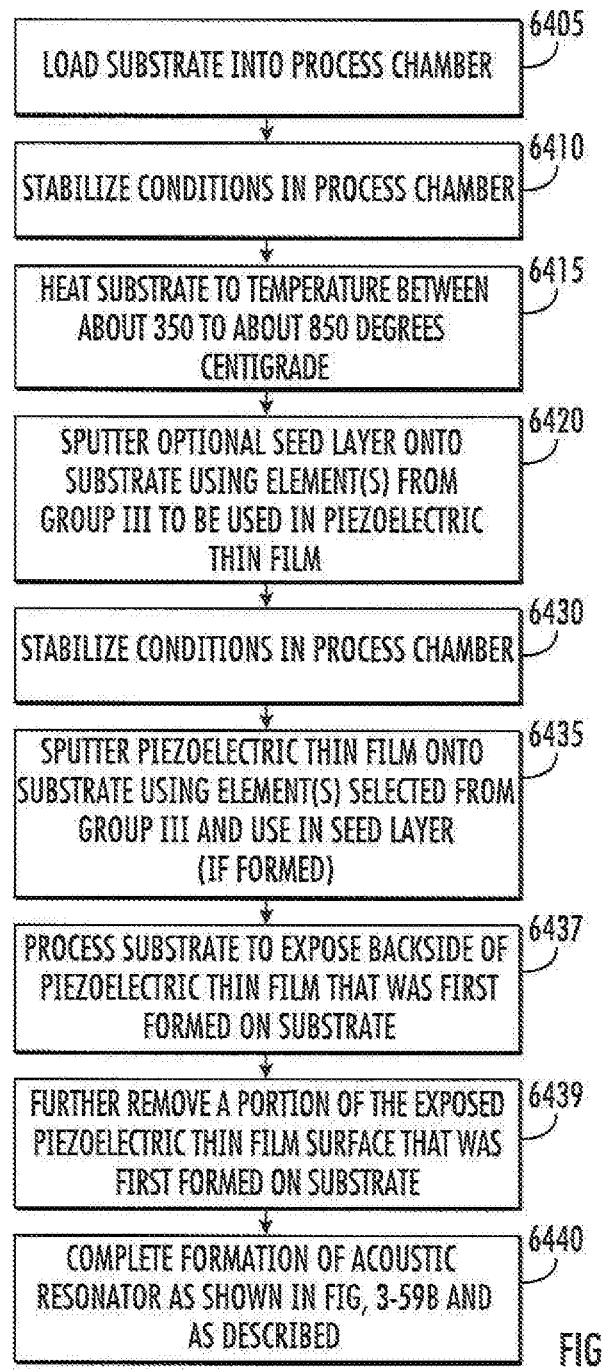
FIG. 64 is a flowchart illustrating methods of forming a high crystallinity piezoelectric thin film on a heated substrate at a relatively high sputtering temperature followed by removal of a portion of the thin film that is first formed on the substrate, for inclusion in devices shown, for example, FIGS. 8-9A, 22-23, 39-40, 52-53 in some embodiments according to the invention.

It will also be understood that in some embodiments, the piezoelectric thin films can be formed via sputtering or other methods, such as CVD. For example, the piezoelectric thin films subject to partial removal from the back-side as described herein can be formed using the high temperature sputtering process as illustrated by FIG. 64, a lower temperature sputtering process, or a CVD process. It will be further understood that these processes can be applied to all of the embodiments described herein, such as those related FIGS. 1-15, 16-31, 32-46, and 47-59 (block 6040).

Figure 65:
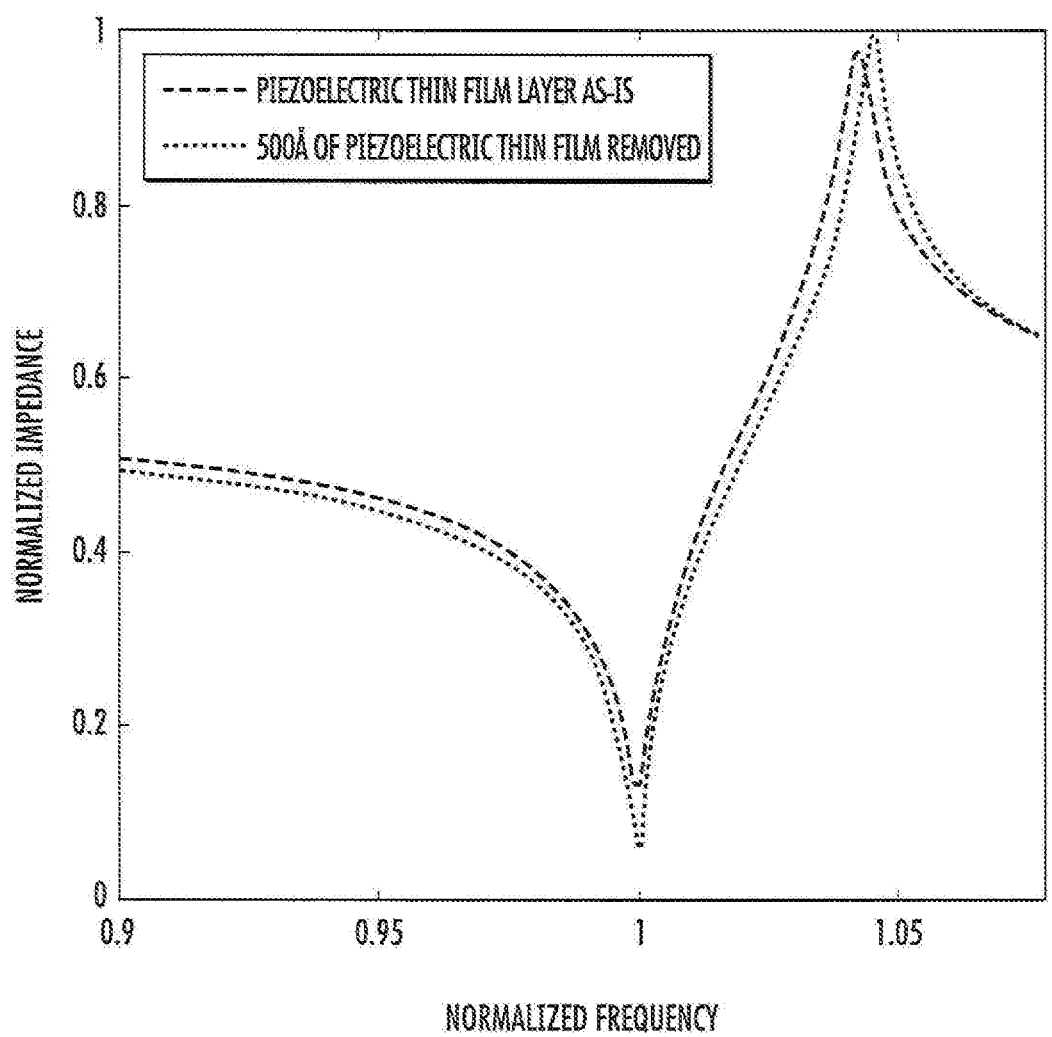
FIG. 65 is a graph illustrating an improvement of about 5% in an impedance of an acoustic resonator as a function of frequency, including a piezoelectric thin film (AlScN) formed by removing about a 500 Angstrom portion from the surface that was first formed on the substrate in some embodiments according to the invention compared to a conventionally formed piezoelectric thin film.

FIG. 65 is a graph illustrating impedance of an acoustic resonator as a function of frequency, including a piezoelectric thin film formed by removing about a 500 Angstrom portion from the surface that was first formed on the substrate in some embodiments according to the invention compared to a conventionally formed piezoelectric thin film.

Figure 66:
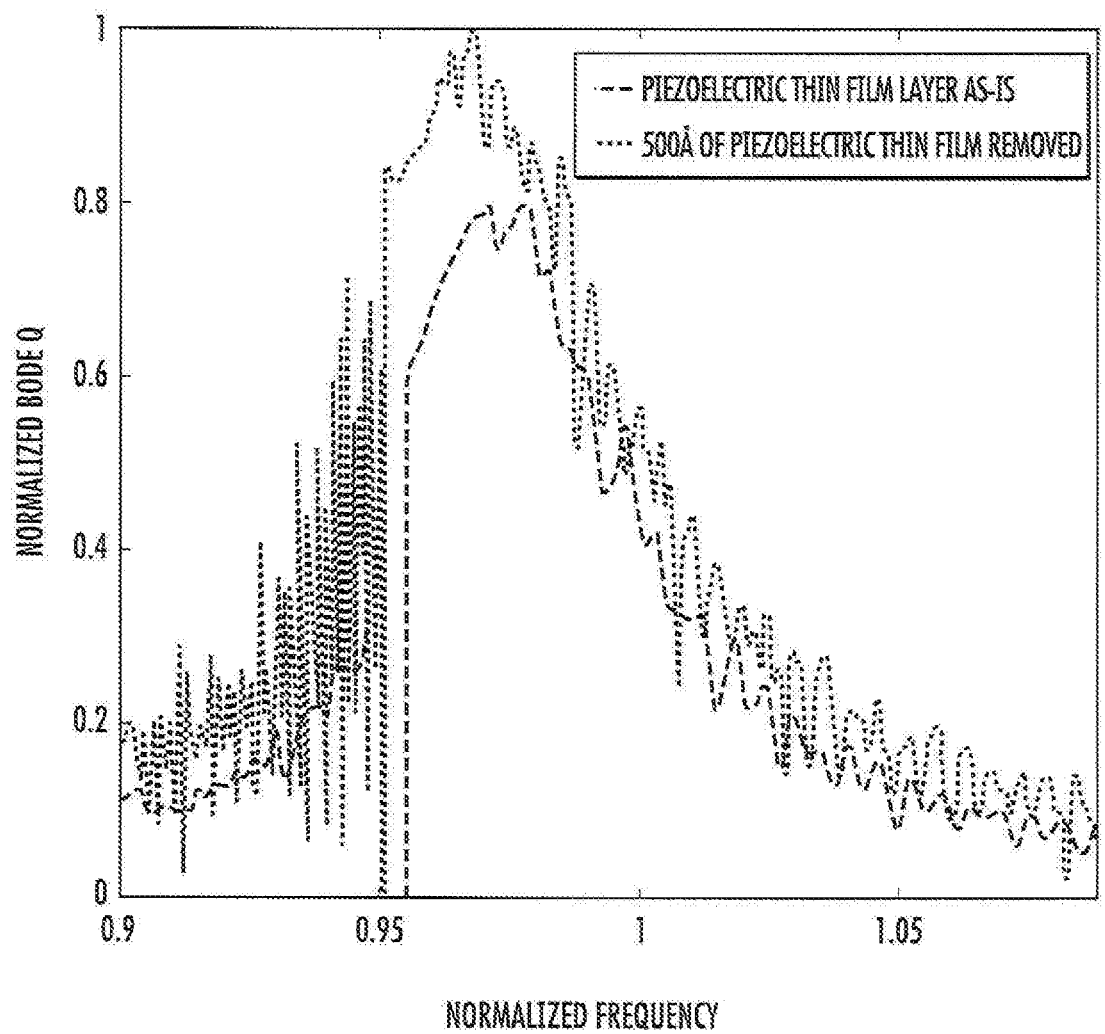
FIG. 66 is a graph illustrating an improvement of about 21% in a Q factor of an acoustic resonator as a function of frequency, including a piezoelectric thin film (AlScN) formed by removing about a 500 Angstrom portion from the surface that was first formed on the substrate in some embodiments according to the invention compared to a conventionally formed piezoelectric thin film.

FIG. 66 is a graph illustrating a Q factor of an acoustic resonator as a function of frequency, including a piezoelectric thin film formed by removing about a 500 Angstrom portion from the surface that was first formed on the substrate in some embodiments according to the invention compared to a conventionally formed piezoelectric thin film.

FIG. 64 is a flowchart illustrating methods of forming a piezoelectric thin film on a substrate that is heated to the sputtering temperature to provide the piezoelectric thin film, which may be subsequently processed to expose the back-side surface of the film and to remove the portion of the film that was first formed on the substrate as described in reference to, for example, FIGS. 8-9A, 22-23, 39-40, 52-53 in some embodiments according to the invention. FIG. 61 is a schematic illustration of a sputtering chamber that can be used to form the high crystallinity piezoelectric thin films on the substrate using a Group III target material (such as Al, Sc, or Al and Sc) in a plasma environment where the substrate is heated to a relatively high sputtering temperature in some embodiments according to the invention.

According to FIG. 64, the substrate (including substrates 100, 1610, 3210, and 4710 shown in FIGS. 8-9A, 22-23, 39-40, 52-53, respectively) can be loaded into the sputtering process chamber 6145 illustrated in FIG. 61 (block 6405). It will be understood that the substrate may comprise Silicon, Sapphire, SiC, or other material. In some embodiments, the substrate may be pre-processed prior to sputtering. For example, the substrate may be etched to remove any unwanted oxides and/or may be heated to out-gas any materials from the substrate. Still further, these processes may be carried out in a chamber that is coupled to the sputtering process chamber 6145 via a cluster type configuration or carried out in a separate system.

The atmosphere in the sputtering process chamber 6145 may be stabilized prior to the sputtering process (block 6410). It will be understood that the term "stabilize" means (in reference to the sputtering process chamber 6145) that the controllable parameters associated with the sputtering process described herein are brought to their initial values before conducting the subsequent sputtering operations. For example, controllable parameters associated with the sputtering process described herein can include pressure in the chamber, temperature of the substrate, power levels applied to the cathode and anode, the concentrations and amounts of the inert and process gases, the plasma, etc. as these parameters may drift during the sputtering process. In some embodiments, the inert gas 6196 and the process gas 6197 gas are introduced into the sputtering process chamber 6145 maintained at a pressure of about 1 to 5 mTorr. In some embodiments, the inert gas 6196 may be Argon and the process gas 6197 may be Nitrogen.

In some embodiments, the substrate is heated to a sputtering temperature in a range between about 350 degrees Centigrade to about 850 degrees Centigrade using the heater 6180 (block 6415). In some embodiments, the substrate 100 is heated to a sputtering temperature in a range between about 400 degrees Centigrade to about 600 degrees Centigrade. In some embodiments, the sputtering temperature may be changed during the sputtering process to improve the level of crystallinity of the piezoelectric layer. It will be understood that the process chamber 6145 may also include a feedback mechanism to ensure that the temperature of the substrate is maintained at the set point that is indicated to be the sputtering temperature as described herein.

In some embodiments according to the invention, the piezoelectric thin film (including piezoelectric thin films 120, 1620, 3220, and 4720 shown in FIGS. 8-9A, 22-23, 39-40, 52-53, respectively) is formed directly on the substrate at a temperature in the sputtering temperature range by sputtering a target 6150 using the ionized inert gas 6196 to create a plasma 6170 as shown in FIG. 61 (block 6430). It will be understood that the target can include an element selected from Group III (such as Al or Sc), which can be used to form a nitride of the target material as the piezoelectric thin film on the substrate using the Nitrogen process gas 6197. Accordingly, the piezoelectric thin film can be, for example, AlN, AlScN, AlCrN, HfMgAlN, or ZrMgAlN. Other materials may also be used.

During the sputtering, a power level is provided at a cathode 6160 coupled to the target 6150 which creates the plasma 6170 (due to the ionization of the inert gas 6196) to eject the Group III element(s) from the target 6150 onto the substrate thereby forming the piezoelectric thin film on the substrate. In some embodiments, the power level provided to the cathode 6160 can be changed during the sputtering. In still further embodiments, a substrate bias 6190 may be applied to the substrate via an anode 6185 during the sputtering of the Group III element(s) to adjust the strain within the piezoelectric thin film.

It will be further understood that in some embodiments according to the invention, the target can be first and second separate targets that each include an element selected from Group III (such as Al and Sc), which can be used to form a nitride of the target material as the piezoelectric thin film on the substrate using the Nitrogen process gas 6197. Accordingly, the piezoelectric thin film can be formed to be, for example AlScN, in the case of the first and second separate targets including respective Group III elements.

It will be further understood that in some embodiments according to the invention, the target can be a composite target that includes the first and second target materials selected from Group III (such as Al and Sc), which can be used to form a nitride of the target material as the piezoelectric thin film on the substrate using the Nitrogen process gas 6197 Accordingly, the piezoelectric thin film can be, for example AlScN, in the case of the target including two Group III elements. It will be understood that more than two Group III elements may be used as either separate targets or as a single composite target. Further any combination of targets and Group III elements may be used.

In some embodiments according to the invention, the optional seed layer 6101 can be formed directly on the substrate at a temperature in the sputtering temperature range so as to form a nucleation layer prior to formation of the piezoelectric thin film, as shown in FIG. 62 (block 6420). In some embodiments, the seed layer 6101 is formed to include the same Group III element(s) included in the piezoelectric thin film. For example, if the piezoelectric thin film includes AlN, the seed layer 6101 can be formed using Al. In some embodiments, when the piezoelectric thin film includes AlScN, the seed layer 6101 can be formed using Al and Sc. During the sputtering of the seed layer 6101, a power level can be provided at the cathode 6160 coupled to the target 6150 which creates the plasma 6170 (due to the ionization of the inert gas 6196) to eject the Group III element(s) from the target 6150 onto the substrate thereby forming the seed layer 6101 on the substrate. In some embodiments, the power level provided to the cathode 6160 can be changed during the sputtering of the seed layer 6101. In still further embodiments, the power level at the cathode 6160 may be changed during the sputtering of the Group III element(s) onto the substrate to adjust the strain within the seed layer 6101.

As appreciated by the present inventors, the seed layer 6101 may be formed at a first temperature within sputtering temperature range whereas the piezoelectric thin film can be formed at a temperature that is also within the sputtering temperature range but is greater than the temperature used to sputter the seed layer 6101 onto the substrate 100. The lower sputtering temperature used to form the seed layer 6101 (compared to the temperature used to form the piezoelectric thin film) can provide still greater crystallinity in the piezoelectric thin film sputtered onto the seed layer 6101. After formation of the seed layer 6101, the sputtering process chamber 6145 can be stabilized by adjusting the pressure and flows of the inert gas 6196 and the process gas 6197 (block 6430).

In some embodiments, the piezoelectric thin film is subjected to partial removal from the back-side so that the portion of the piezoelectric thin film that is first formed on the substrate is removed as described, for example, in reference to FIGS. 8-9, 22-23, 39-40, and 52-53 herein. Accordingly, a high crystallinity piezoelectric thin film may be formed on the substrate heated to the sputtering temperature by sputtering a Group III target material (such as Al, Sc, or Al and Sc, and other materials) in a plasma environment and subsequently removing the first formed portion of the piezoelectric thin film by processing the substrate (block 6437) to expose the back-side of the piezoelectric thin film (the portion that was first formed on the substrate) and to further remove a portion of the piezoelectric thin film that was first formed on the substrate (block 6439). Removing the portion of the piezoelectric thin film that was first formed on the substrate can eliminate the lower crystallinity portion of the piezoelectric thin film such that the remaining portion of the piezoelectric thin film has a higher crystallinity. For example, in some embodiments, a piezoelectric thin film of AlN or AlScN can be processed to remove about at least 500 Angstroms of material from the back-side of the film (the portion that was first formed on the substrate) so that the remaining portion has a crystallinity of less than about 1.0 degree at Full Width Half Maximum (FWHM) to about 10 arcseconds at FWHM measured using X-ray diffraction (XRD). In some embodiments, the crystallinity of the piezoelectric thin film can be in a range between about 1.0 degree at FWHM to about 0.5 degrees at FWHM measured using XRD.

It will also be understood that in some embodiments, the piezoelectric thin films can be formed via sputtering or other methods, such as CVD. For example, the piezoelectric thin films subject to partial removal from the back-side as described herein can be formed using the high temperature sputtering process as illustrated by FIG. 64, a lower temperature sputtering process, or a CVD process. It will be further understood that these processes can be applied to all of the embodiments described herein, such as those related FIGS. 1-15, 16-31, 32-46, and 47-59 to form an acoustic resonator (block 6440).

It will also be understood that in some embodiments, the piezoelectric thin films can be formed via sputtering or other methods, such as CVD. For example, the piezoelectric thin films subject to partial removal from the back-side as described herein can be formed using the high temperature sputtering process as illustrated by FIG. 64, a lower temperature sputtering process, or a CVD process. It will be further understood that these processes can be applied to all of the embodiments described herein, such as those related FIGS. 16-31, 32-46, and 47-59.

FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can include sequential processes of metal deposition, lithographic patterning, metal deposition, and metal etching steps to produce the topside metal layer. Those of ordinary skill in the art will recognize other variations, modifications, and alternatives.

Figure 4A:
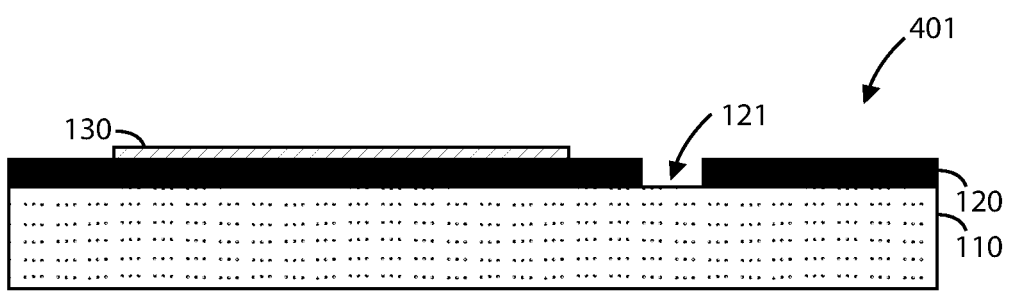
FIG. 4A is a simplified diagram illustrating a step for a method creating a topside micro-trench according to an example of the present invention.
Figure 4B:
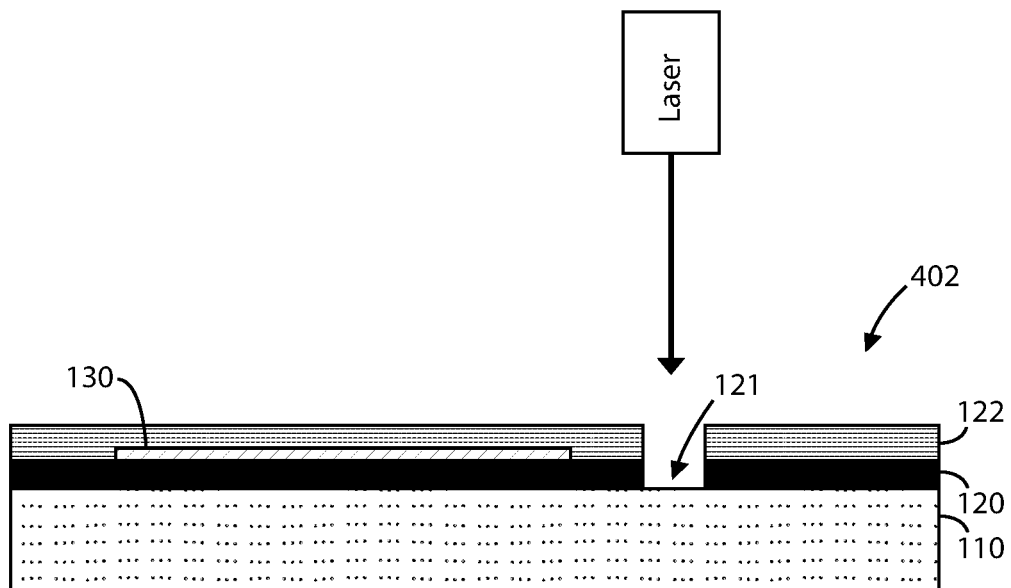
FIGS. 4B and 4C are simplified diagrams illustrating alternative methods for conducting the method step of forming a topside micro-trench as described in FIG. 4A.
Figure 4C:
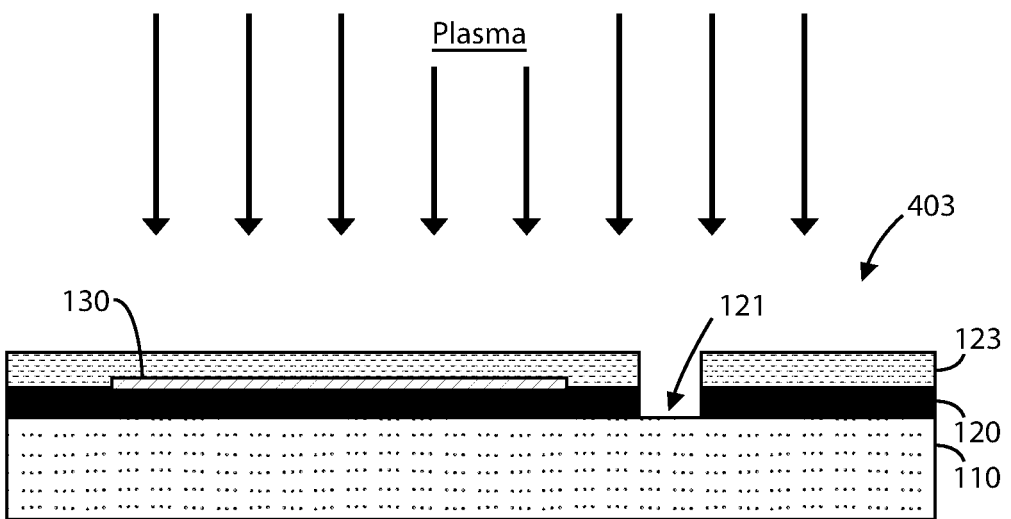

FIG. 4A is a simplified diagram illustrating a step for a method of manufacture for an acoustic resonator device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the seed substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the seed substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11 W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown, a lithographic masking layer 123 can be forming overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple acoustic resonator devices simultaneously. In FIG. 4D, two devices are shown on Die #1 and Die #2, respectively. FIG. 4E shows the process of forming a micro-via 121 on each of these dies while also etching a scribe line 124 or dicing line. In an example, the etching of the scribe line 124 singulates and relieves stress in the piezoelectric single crystal layer 120.

Figure 5:
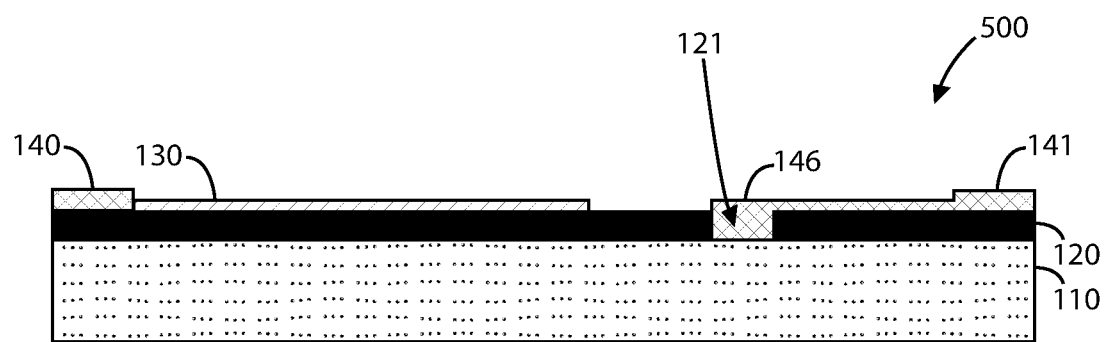
FIGS. 5 to 8 are simplified diagrams illustrating steps for a method of manufacture for an acoustic resonator device according to an example of the present invention.

FIGS. 5 to 8 are simplified diagrams illustrating steps for a method of manufacture for an acoustic resonator device according to an example of the present invention. FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold material or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

Figure 6:
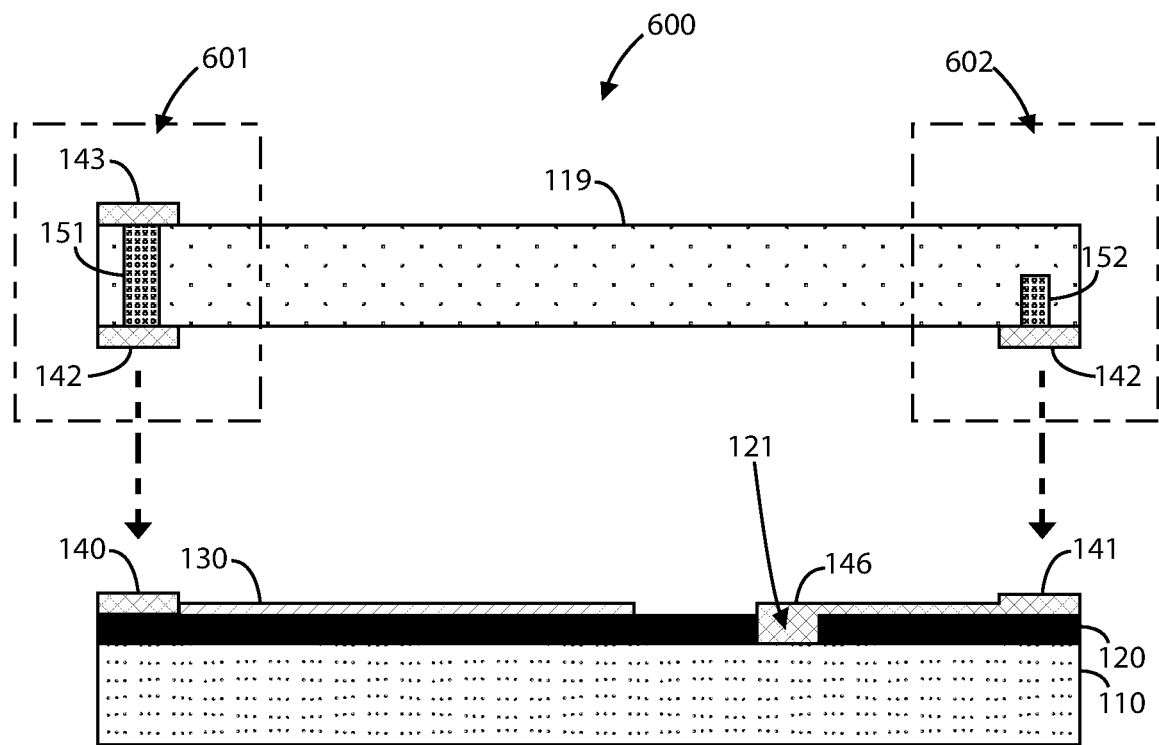

FIG. 6 can represent a method step for preparing the acoustic resonator device for bonding, which can be a hermetic bonding. As shown, a top cap structure is positioned above the partially processed acoustic resonator device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142. In a specific example, the interposer substrate can include a silicon, glass, smart-glass, or other like material.

Figure 7:
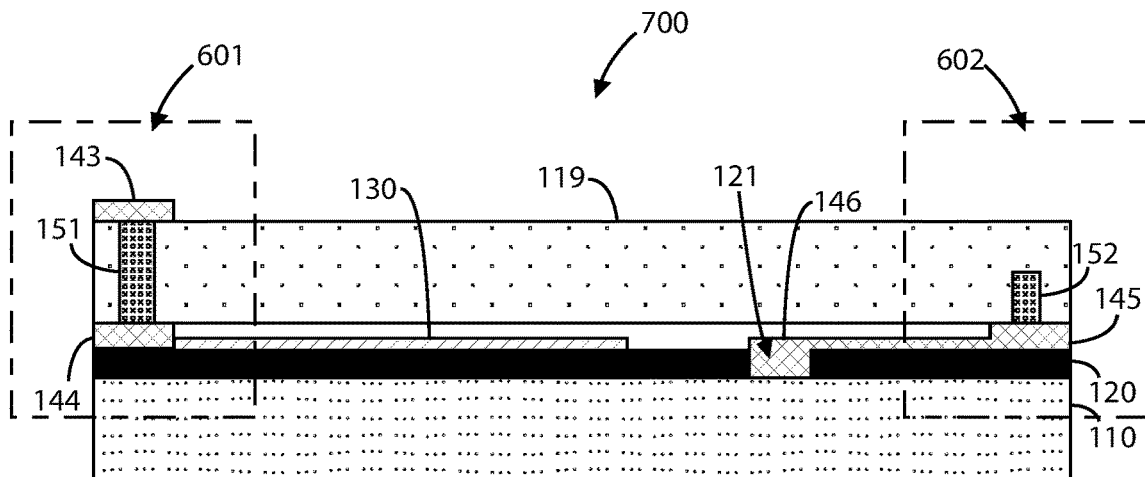
Figure 8:
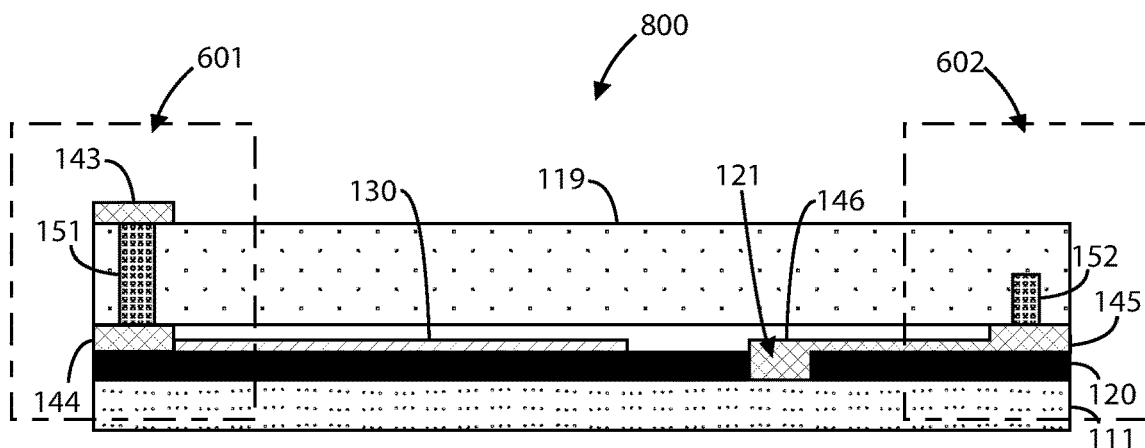

FIG. 7 can represent a method step of bonding the top cap structure to the partially processed acoustic resonator device. As shown, the interposer substrate 119 is bonded to the piezoelectric layer by the bond pads (140, 142) and the topside metal 141, which are now denoted as bond pad 144 and topside metal 145. This bonding process can be done using a compression bond method or the like. FIG. 8 can represent thinning the seed substrate 110, which may be denoted as thinned seed substrate 111. This substrate thinning process can include grinding and etching processes or the like. In a specific example, this process can include a wafer backgrinding process followed by stress removal, which can involve dry etching, CMP polishing, or annealing processes.

It will be understood that, in some embodiments, the substrate may be removed entirely to expose the surface of the piezoelectric thin film 120 and to remove a first formed portion of the piezoelectric thin film 120 (or the piezoelectric layer 6120 or 6101 shown in FIGS. 62-63). For example, in some embodiments, the substrate thinning process may be performed to expose the surface of the piezoelectric thin film 120 and further to remove about at least about 500 Angstroms of material from the exposed surface of the piezoelectric thin film. As appreciated by the present inventors, the removal of a portion of the exposed piezoelectric layer can remove a relatively low quality crystallinity portion of the piezoelectric thin film, so that the remaining portion of the piezoelectric thin film is of relatively higher quality crystallinity, to have a crystallinity of less than about 1.0 degree at Full Width Half Maximum (FWHM) to about 10 arcseconds at FWHM measured using X-ray diffraction (XRD). In some embodiments, the crystallinity of the piezoelectric thin film can be in a range between about 1.0 degree at FWHM to about 0.5 degrees at FWHM measured using XRD.

It will be further understood that the piezoelectric thin film according to some embodiments, such as piezoelectric thin films 120, 1620, 3220, and 4720 shown in FIGS. 8-9A, 22-23, 39-40, 52-53, respectively) can be any Group III material that is doped with one or more elements that are selected to change the crystal structure of the Group III material to modify the piezoelectric properties on the piezoelectric thin film. For example, in some embodiments the piezoelectric thin film can be AlScN and the exposed surface can be processed to remove about the first 500 Angstroms of the AlScN. It will be further understood that the amount of piezoelectric thin film 120 that is removed can be selected so as to improve the overall performance (such as the coupling coefficient) of the piezoelectric thin film used in the acoustic resonator device. The selected amount may further be based on the materials used to form the piezoelectric thin film; the process used to form the piezoelectric thin film 120.

Figure 9A:
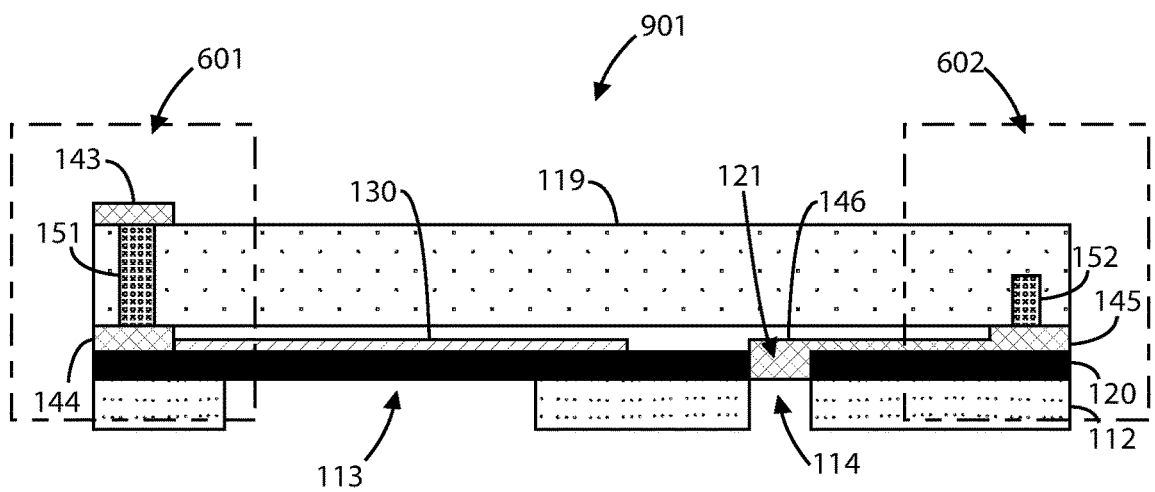
FIG. 9A is a simplified diagram illustrating a method step for forming backside trenches according to an example of the present invention.

FIG. 9A is a simplified diagram illustrating a step for a method of manufacture for an acoustic resonator device 901 according to an example of the present invention. FIG. 9A can represent a method step for forming backside trenches 113 and 114 to allow access to the piezoelectric layer 120 (or the piezoelectric layer 6120 or 6101 shown in FIGS. 62-63) from the backside of the thinned seed substrate 111. In some embodiments, it will be understood that the substrate thinning process described above in reference to FIG. 8 may be performed in combination with the process shown in FIG. 9A where the exposed portions of the surface of the piezoelectric layer are further processed to remove the portion of the exposed piezoelectric layer. For example, in some embodiments, the removal of the first formed portion of the exposed piezoelectric layer can be performed using the thinned substrate 112 as a mask to further to remove the lowest most portions of the piezoelectric thin film that are exposed by the thinned substrate 112. It will be understood that in some embodiments according to the invention, the techniques described above in reference to FIG. 8 to can also be used in accordance with FIG. 9A. It will be further understood that the processes described above regarding the removal of a portion of the piezoelectric thin film that is first formed on the substrate can be applied to the other embodiments described herein, such as those related FIGS. 16-31, 32-46, and 47-59. For example, the removal of a first formed portion of the piezoelectric thin film formed using a variety of processes can be applied to the structures and processes described in reference FIGS. 24, 41, and 53.

In an example, the first backside trench 113 can be formed within the thinned seed substrate 111 and underlying the topside metal electrode 130. The second backside trench 114 can be formed within the thinned seed substrate 111 and underlying the topside micro-trench 121 and topside metal plug 146. This substrate is now denoted thinned substrate 112. In a specific example, these trenches 113 and 114 can be formed using deep reactive ion etching (DRIE) processes, Bosch processes, or the like. The size, shape, and number of the trenches may vary with the design of the acoustic resonator device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

Figure 9B:
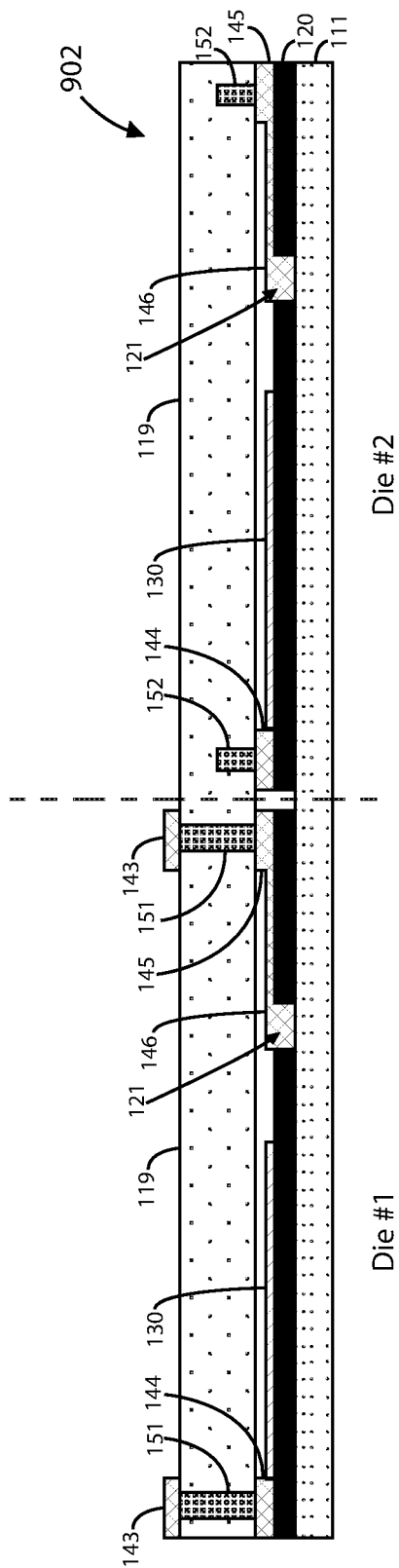
FIGS. 9B and 9C are simplified diagrams illustrating an alternative method for conducting the method step of forming backside trenches, as described in FIG. 9A, and simultaneously singulating a seed substrate according to an embodiment of the present invention.
Figure 9C:
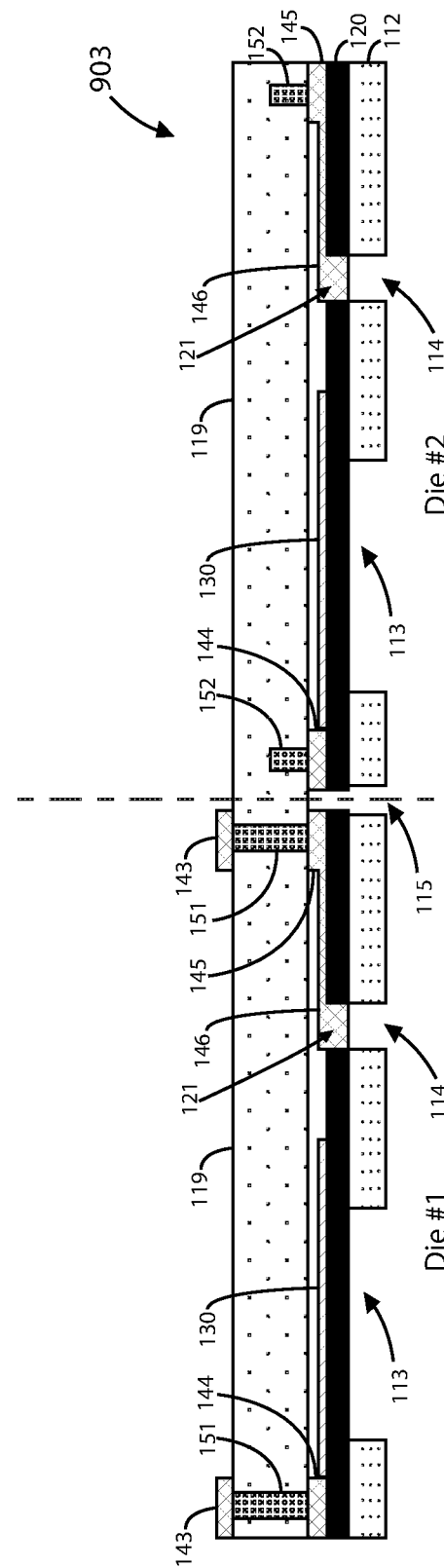

FIGS. 9B and 9C are simplified diagrams illustrating an alternative method for conducting the method step as described in FIG. 9A. Like FIGS. 4D and 4E, these figures can represent the method step of manufacturing multiple acoustic resonator devices simultaneously. In FIG. 9B, two devices with cap structures are shown on Die #1 and Die #2, respectively. FIG. 9C shows the process of forming backside trenches (113, 114) on each of these dies while also etching a scribe line 115 or dicing line. In an example, the etching of the scribe line 115 provides an optional way to singulate the backside wafer 112.

Figure 10:
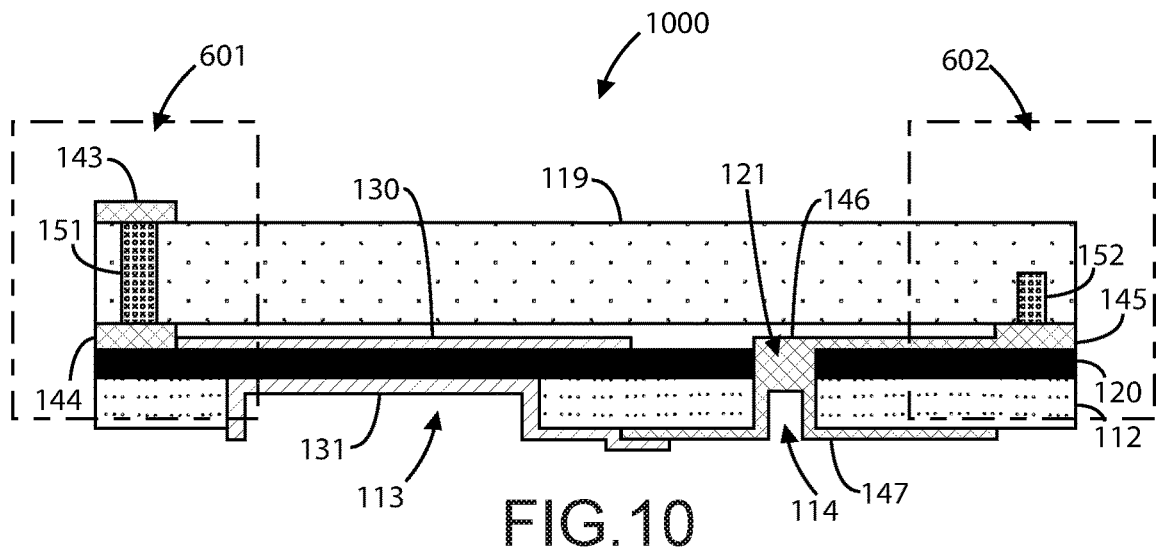
FIG. 10 is a simplified diagram illustrating a method step forming backside metallization and electrical interconnections between top and bottom sides of a resonator according to an example of the present invention.

FIG. 10 is a simplified diagram illustrating a step for a method of manufacture for an acoustic resonator device 1000 according to an example of the present invention. This figure can represent a method step of forming a backside metal electrode 131 and a backside metal plug 147 within the backside trenches of the thinned seed substrate 112. In an example, the backside metal electrode 131 can be formed underlying one or more portions of the thinned substrate 112, within the first backside trench 113, and underlying the topside metal electrode 130. This process completes the resonator structure within the acoustic resonator device. The backside metal plug 147 can be formed underlying one or more portions of the thinned substrate 112, within the second backside trench 114, and underlying the topside micro-trench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
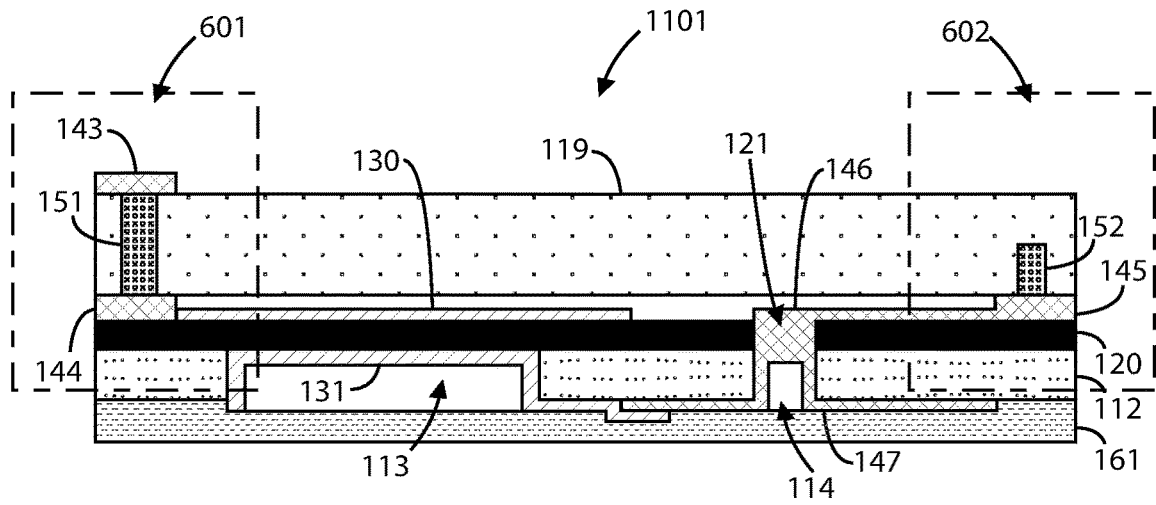
FIGS. 11A and 11B are simplified diagrams illustrating alternative steps for a method of manufacture for an acoustic resonator device according to an example of the present invention.
Figure 11B:
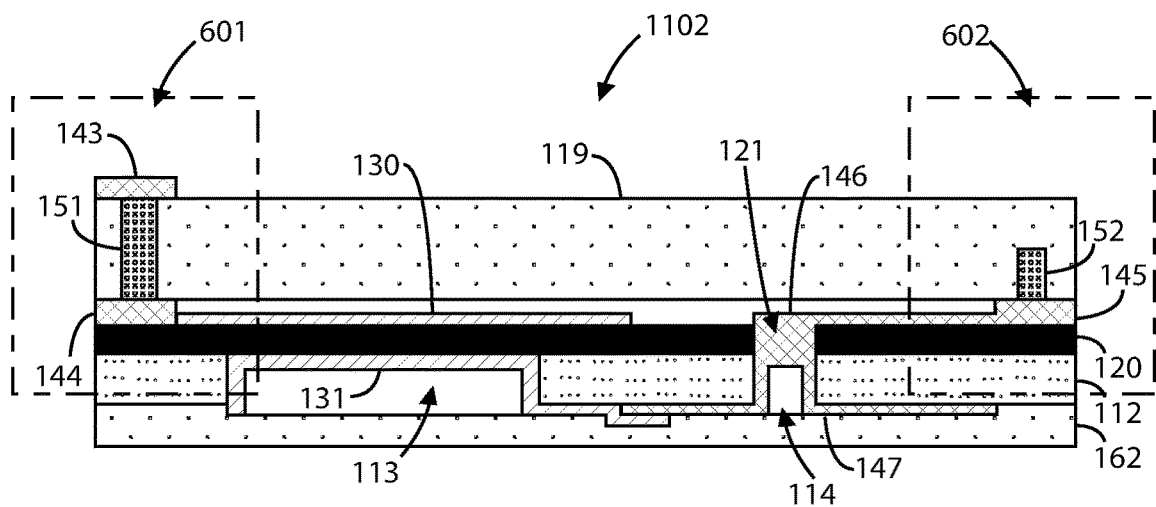

FIGS. 11A and 11B are simplified diagrams illustrating alternative steps for a method of manufacture for an acoustic resonator device according to an example of the present invention. These figures show methods of bonding a backside cap structure underlying the thinned seed substrate 112. In FIG. 11A, the backside cap structure is a dry film cap 161, which can include a permanent photo-imageable dry film such as a solder mask, polyimide, or the like. Bonding this cap structure can be cost-effective and reliable, but may not produce a hermetic seal. In FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
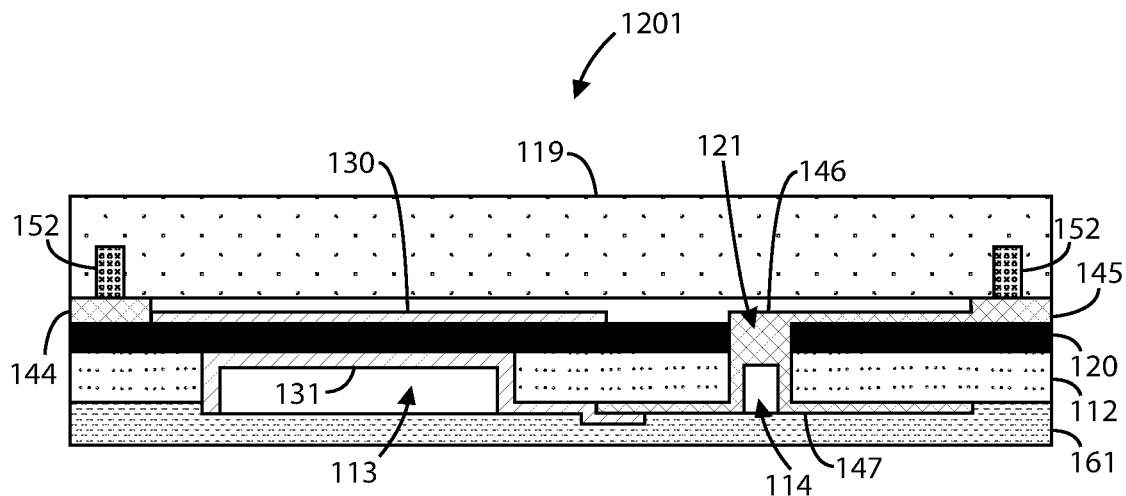
FIGS. 12A to 12E are simplified diagrams illustrating steps for a method of manufacture for an acoustic resonator device using a blind via interposer according to an example of the present invention.
Figure 12B:
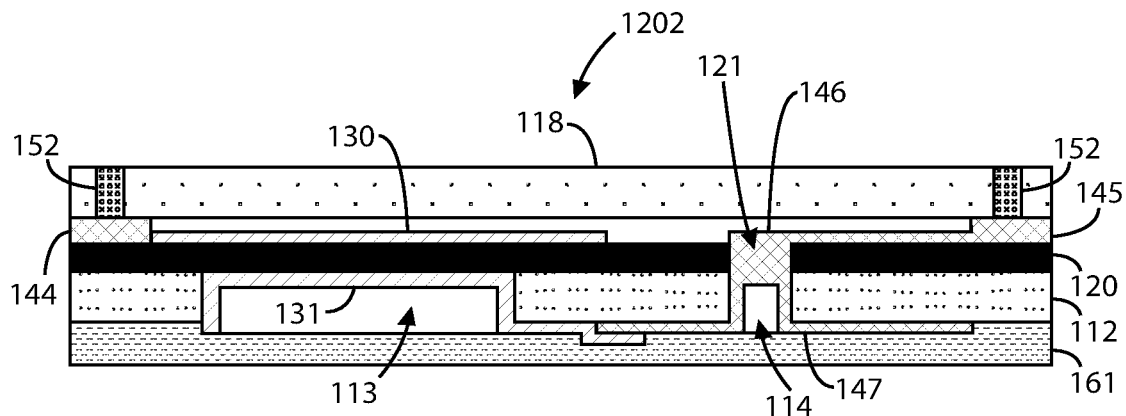
Figure 12C:
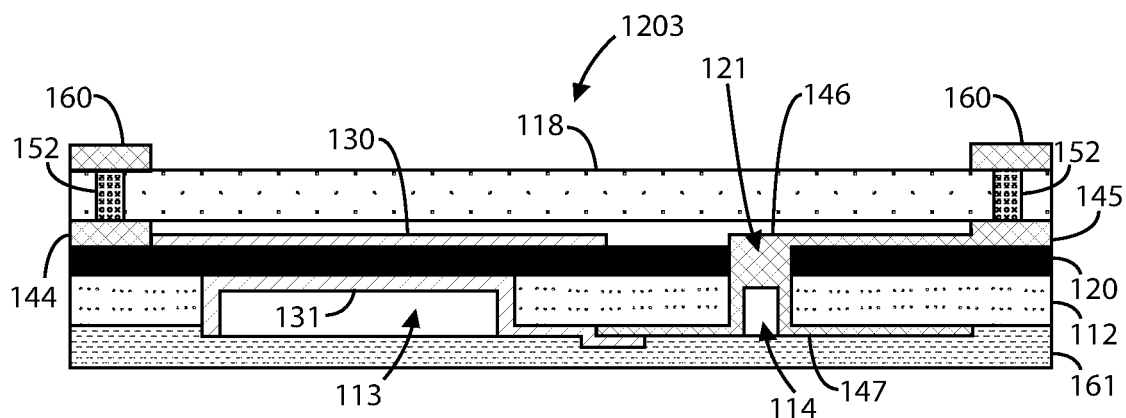
Figure 12D:
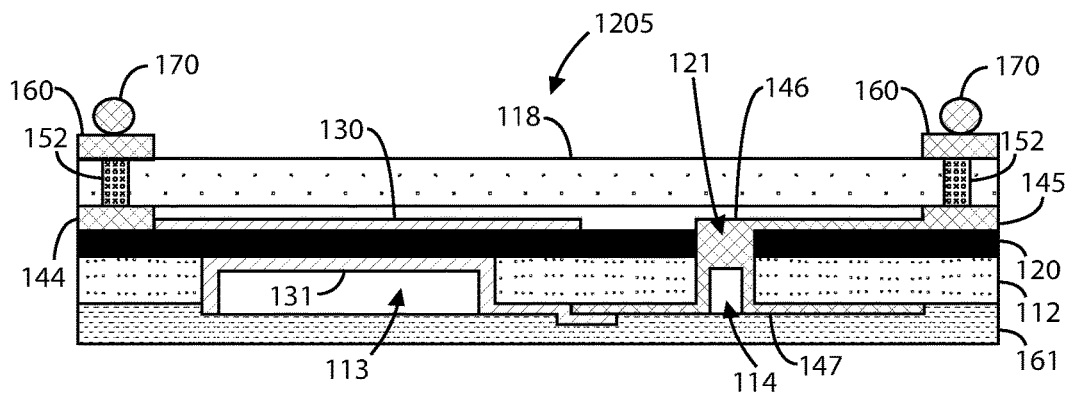
Figure 12E:
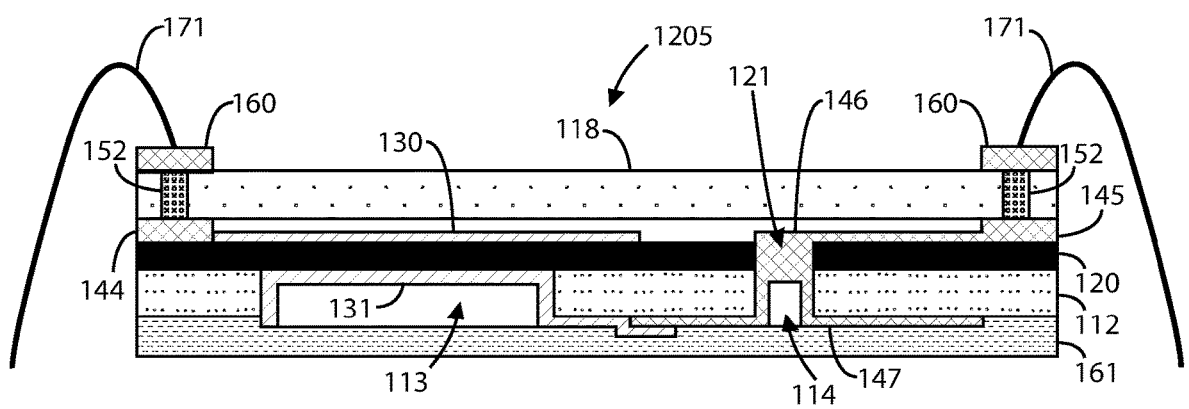

FIGS. 12A to 12E are simplified diagrams illustrating steps for a method of manufacture for an acoustic resonator device according to an example of the present invention. More specifically, these figures describe additional steps for processing the blind via interposer "602" version of the top cap structure. FIG. 12A shows an acoustic resonator device 1201 with blind vias 152 in the top cap structure. In FIG. 12B, the interposer substrate 119 is thinned, which forms a thinned interposer substrate 118, to expose the blind vias 152. This thinning process can be a combination of a grinding process and etching process as described for the thinning of the seed substrate. In FIG. 12C, a redistribution layer (RDL) process and metallization process can be applied to create top cap bond pads 160 that are formed overlying the blind vias 152 and are electrically coupled to the blind vias 152. As shown in FIG. 12D, a ball grid array (BGA) process can be applied to form solder balls 170 overlying and electrically coupled to the top cap bond pads 160. This process leaves the acoustic resonator device ready for wire bonding 171, as shown in FIG. 12E.

Figure 13:
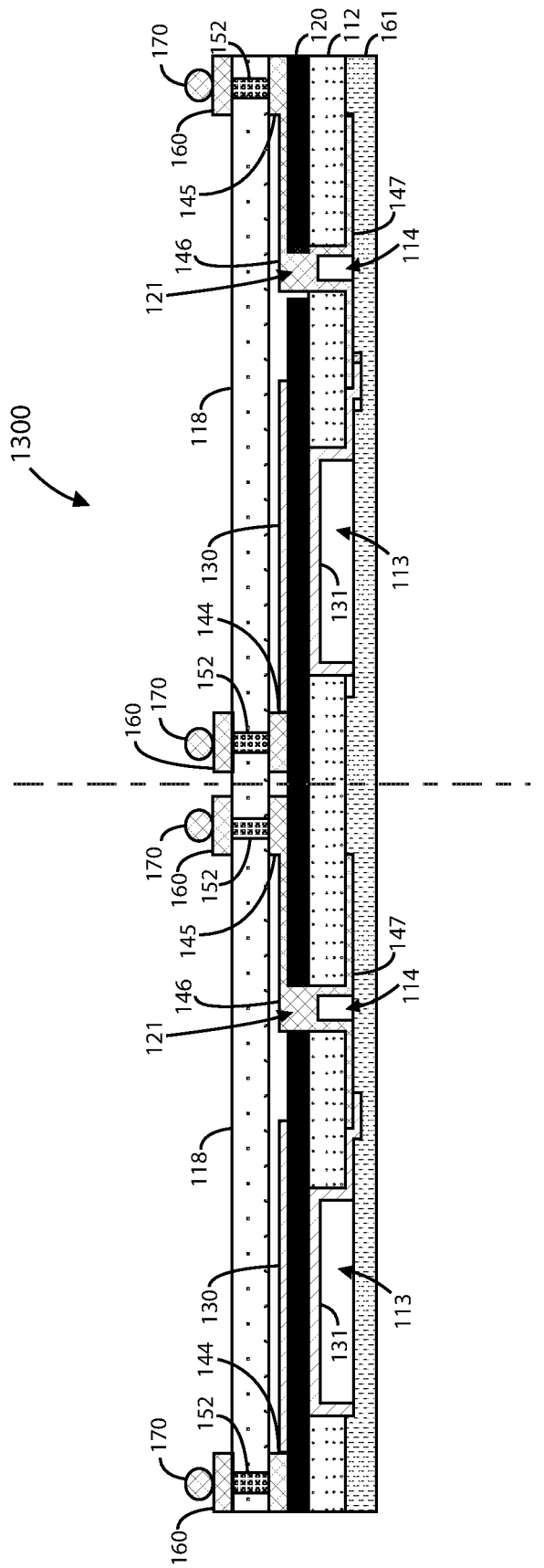
FIG. 13 is a simplified diagram illustrating a step for a method of manufacture for an acoustic resonator device according to an example of the present invention.

FIG. 13 is a simplified diagram illustrating a step for a method of manufacture for an acoustic resonator device according to an example of the present invention. As shown, device 1300 includes two fully processed acoustic resonator devices that are ready to singulation to create separate devices. In an example, the die singulation process can be done using a wafer dicing saw process, a laser cut singulation process, or other processes and combinations thereof.

Figure 14A:
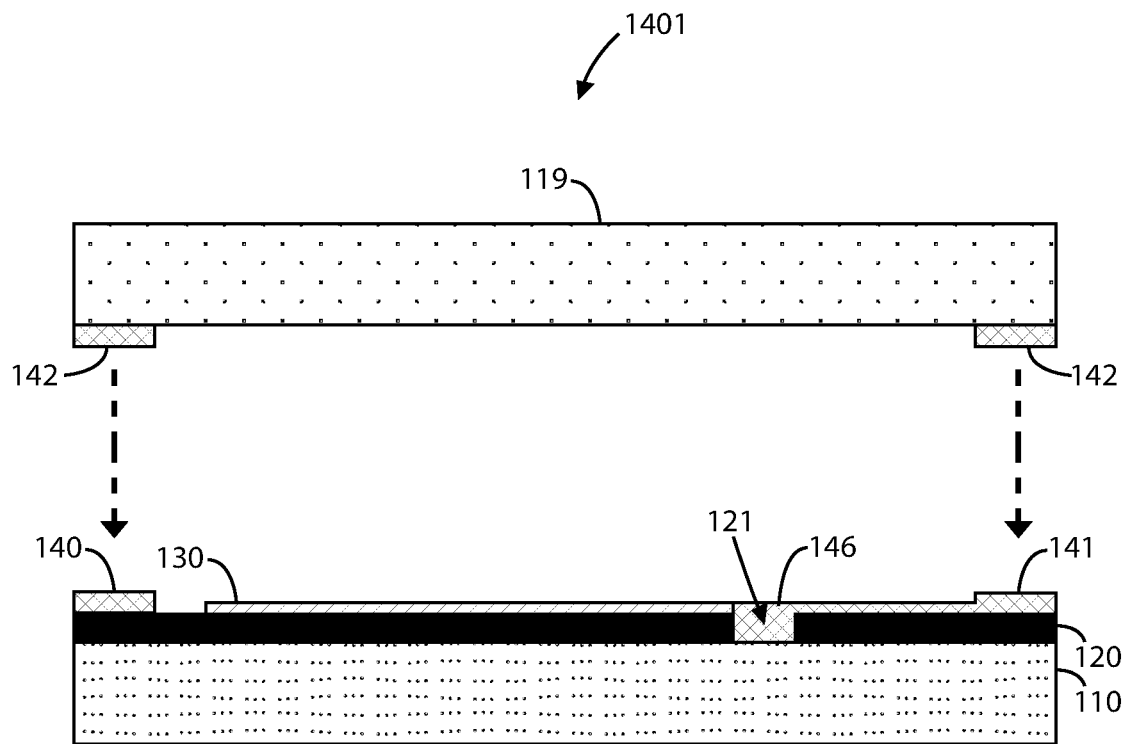
FIGS. 14A to 14G are simplified diagrams illustrating method steps for a cap wafer process for an acoustic resonator device according to an example of the present invention.

FIGS. 14A to 14G are simplified diagrams illustrating steps for a method of manufacture for an acoustic resonator device according to an example of the present invention. This method illustrates the process for fabricating an acoustic resonator device similar to that shown in FIG. 1B. The method for this example of an acoustic resonator can go through similar steps as described in FIGS. 1-5. FIG. 14A shows where this method differs from that described previously. Here, the top cap structure substrate 119 and only includes one layer of metallization with one or more bottom bond pads 142. Compared to FIG. 6, there are no via structures in the top cap structure because the interconnections will be formed on the bottom side of the acoustic resonator device.

Figure 14B:
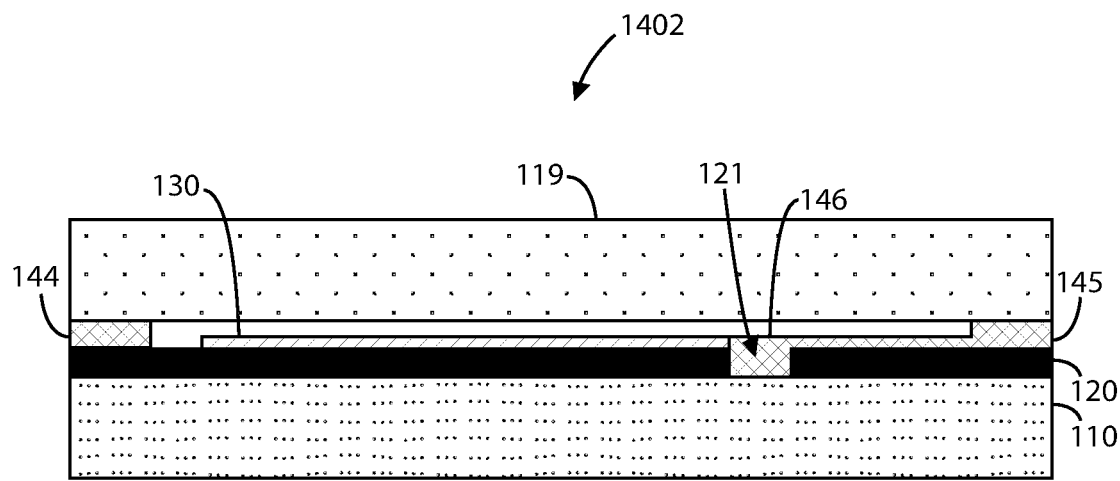
Figure 14C:
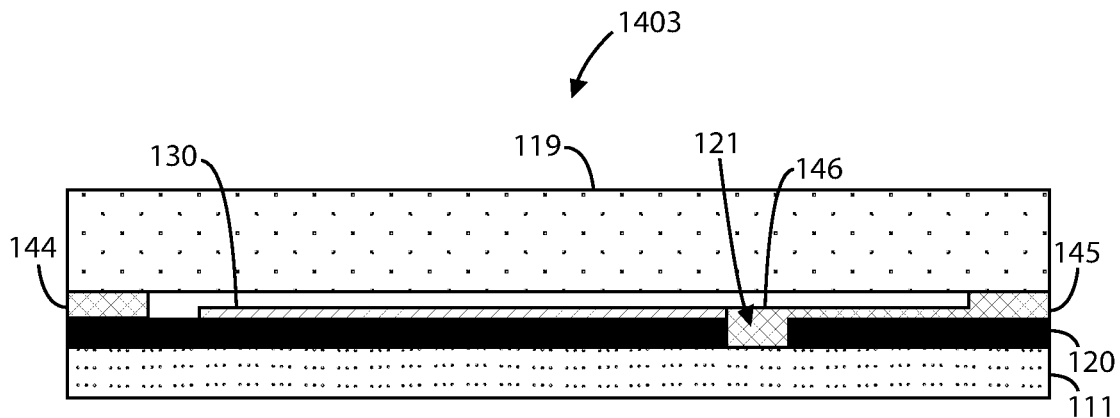
Figure 14D:
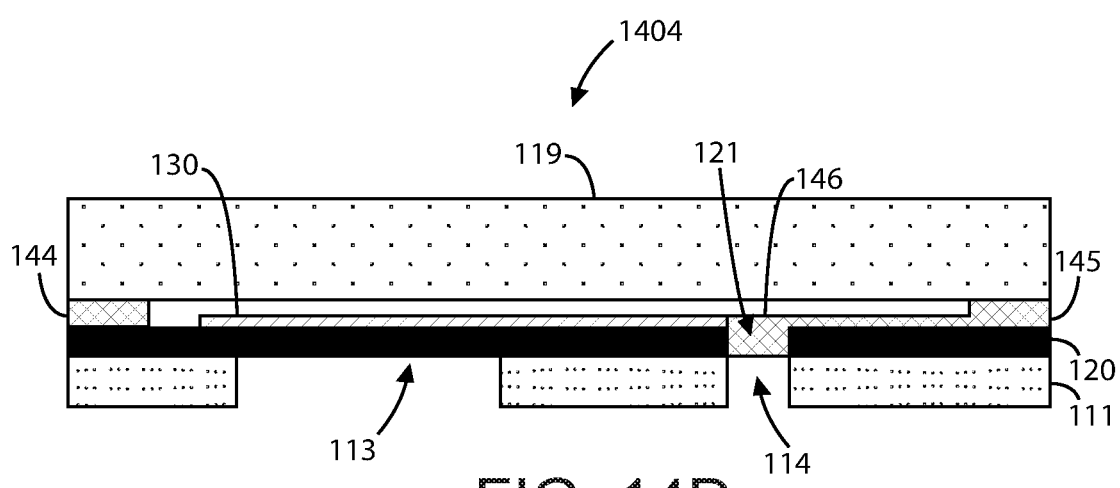
Figure 14E:
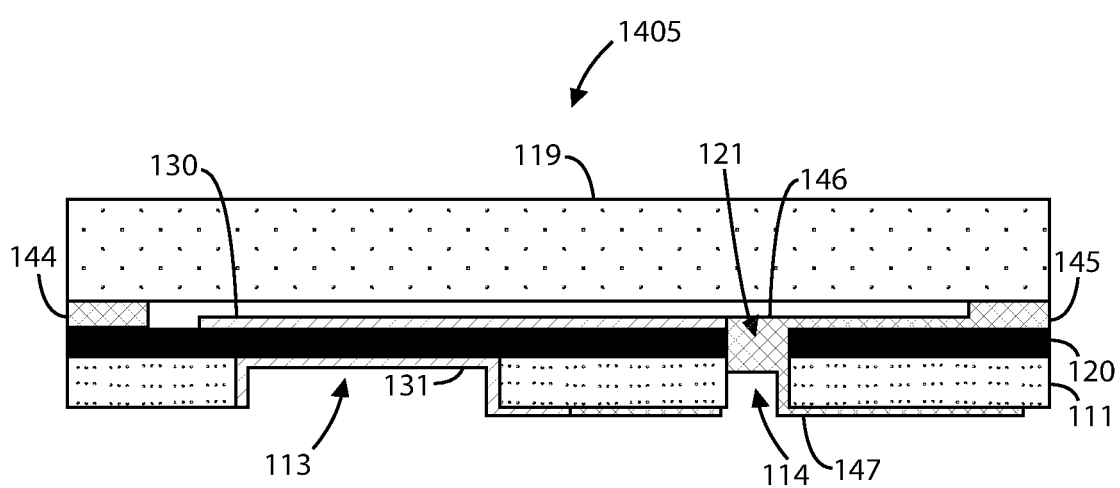
Figure 14F:
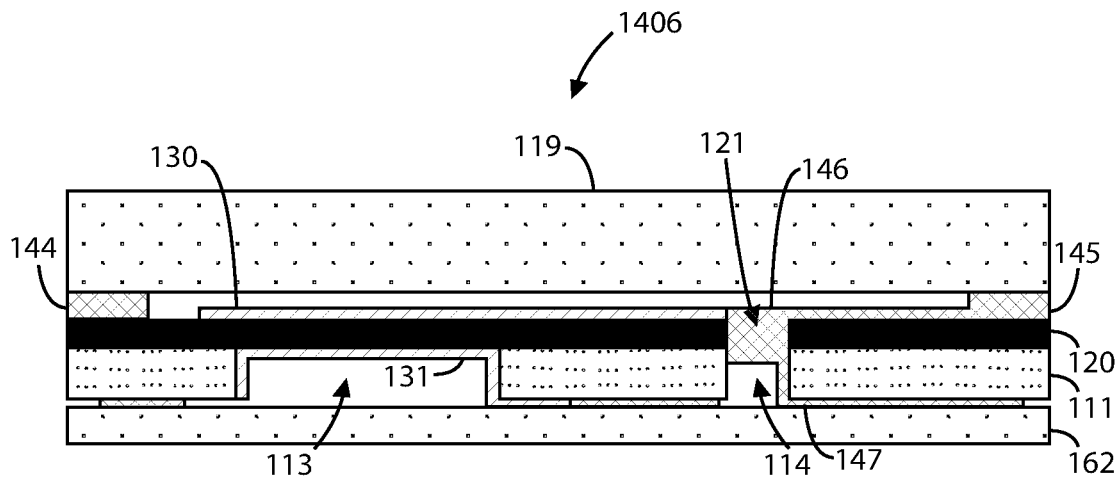

FIGS. 14B to 14F depict method steps similar to those described in the first process flow. FIG. 14B can represent a method step of bonding the top cap structure to the piezoelectric layer 120 through the bond pads (140, 142) and the topside metal 141, now denoted as bond pads 144 and topside metal 145 with topside metal plug 146. FIG. 14C can represent a method step of thinning the seed substrate 110, which forms a thinned seed substrate 111, similar to that described in FIG. 8. FIG. 14D can represent a method step of forming first and second backside trenches, similar to that described in FIG. 9A. FIG. 14E can represent a method step of forming a backside metal electrode 131 and a backside metal plug 147, similar to that described in FIG. 10. FIG.

14F can represent a method step of bonding a backside cap structure 162, similar to that described in FIGS. 11A and 11B.

Figure 14G:
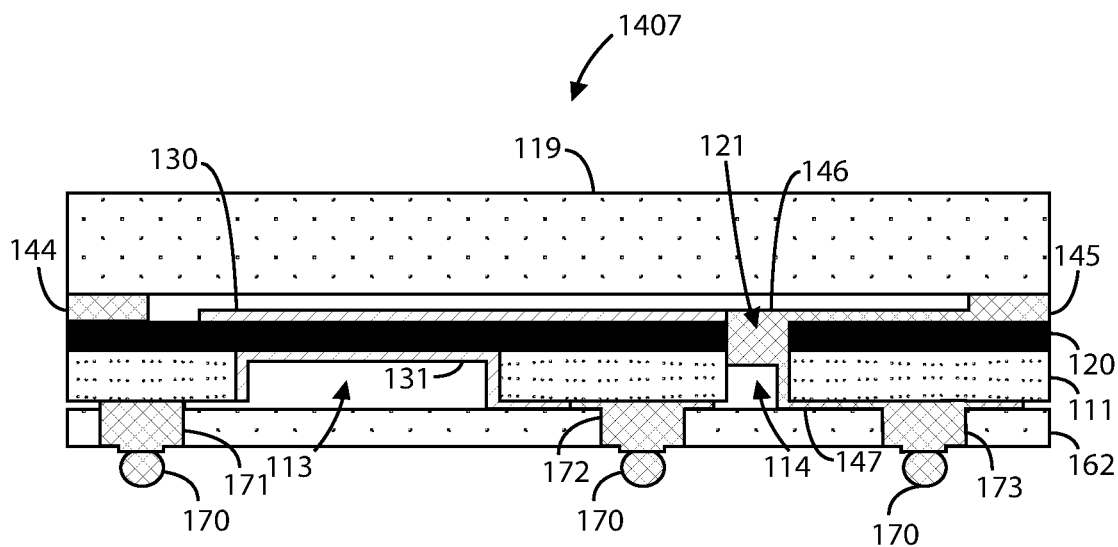

FIG. 14G shows another step that differs from the previously described process flow. Here, the backside bond pads 171, 172, and 173 are formed within the backside cap structure 162. In an example, these backside bond pads 171-173 can be formed through a masking, etching, and metal deposition processes similar to those used to form the other metal materials. A BGA process can be applied to form solder balls 170 in contact with these backside bond pads 171-173, which prepares the acoustic resonator device 1407 for wire bonding.

Figure 15A:
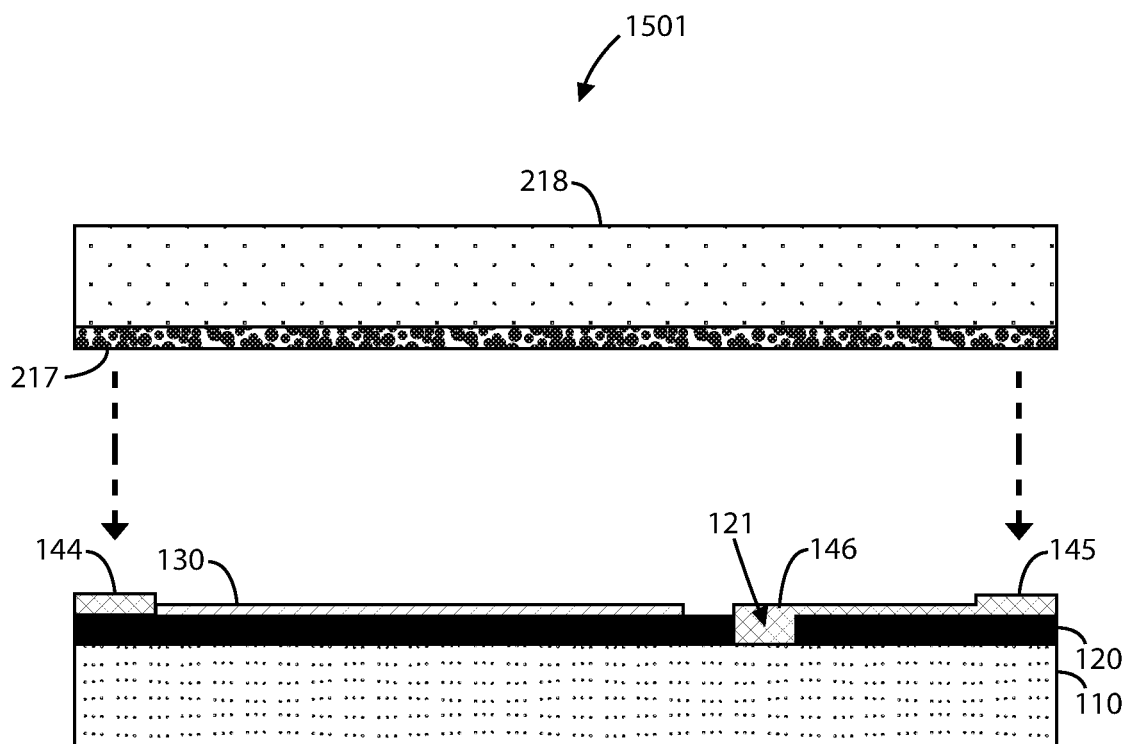
FIGS. 15A-15E are simplified diagrams illustrating method steps for making an acoustic resonator device with shared backside trench, which can be implemented in both interposer/cap and interposer free versions, according to examples of the present invention.

FIGS. 15A to 15E are simplified diagrams illustrating steps for a method of manufacture for an acoustic resonator device according to an example of the present invention. This method illustrates the process for fabricating an acoustic resonator device similar to that shown in FIG. 1B. The method for this example can go through similar steps as described in FIG. 1-5. FIG. 15A shows where this method differs from that described previously. A temporary carrier 218 with a layer of temporary adhesive 217 is attached to the substrate. In a specific example, the temporary carrier 218 can include a glass wafer, a silicon wafer, or other wafer and the like.

Figure 15B:
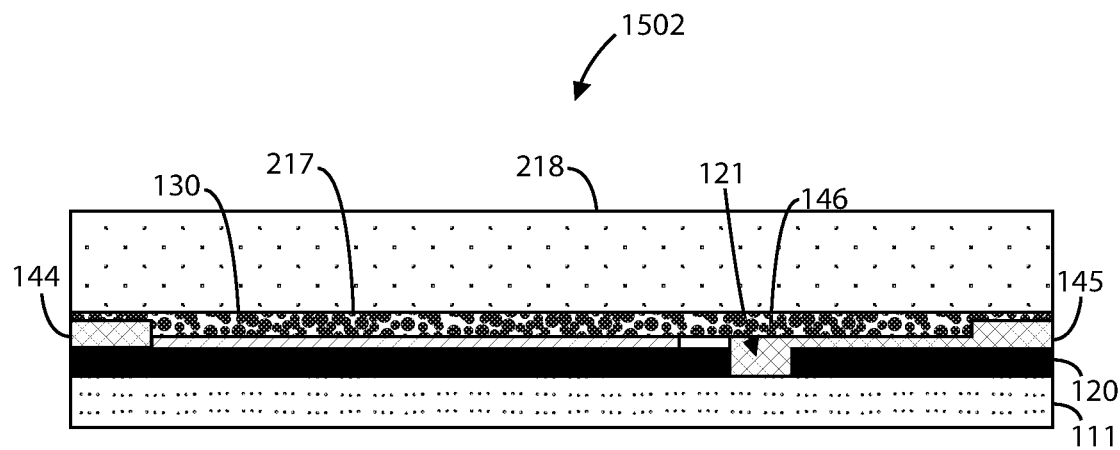

FIGS. 15B to 15F depict method steps similar to those described in the first process flow. FIG. 15B can represent a method step of thinning the seed substrate 110, which forms a thinned substrate 111, similar to that described in FIG. 8. In a specific example, the thinning of the seed substrate 110 can include a back side grinding process followed by a stress removal process. The stress removal process can include a dry etch, a Chemical Mechanical Planarization (CMP), and annealing processes.

Figure 15C:
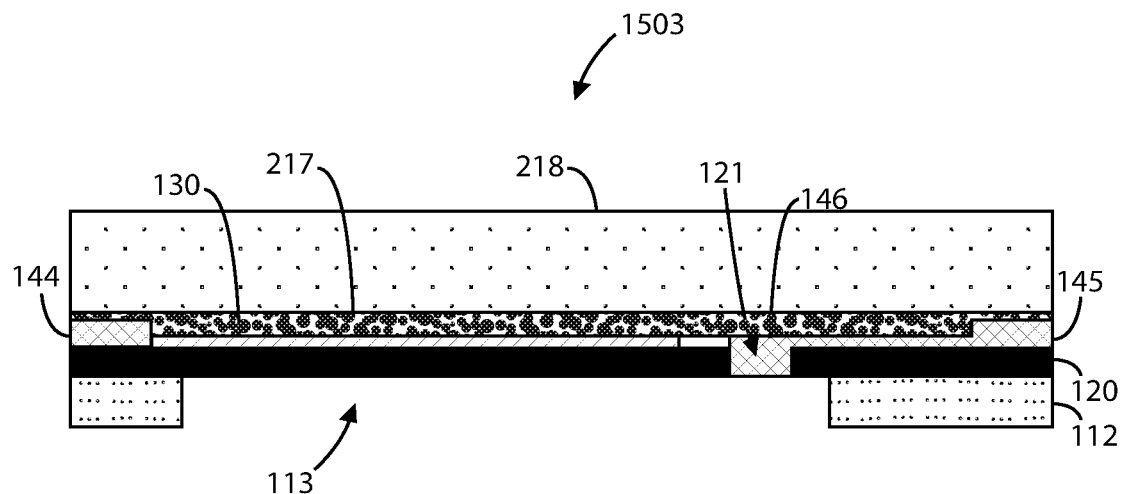

FIG. 15C can represent a method step of forming a shared backside trench 113, similar to the techniques described in FIG. 9A. The main difference is that the shared backside trench is configured underlying both topside metal electrode 130, topside micro-trench 121, and topside metal plug 146. In an example, the shared backside trench 113 is a backside resonator cavity that can vary in size, shape (all possible geometric shapes), and side wall profile (tapered convex, tapered concave, or right angle). In a specific example, the forming of the shared backside trench 113 can include a litho-etch process, which can include a back-to-front alignment and dry etch of the backside substrate 111. The piezoelectric layer 120 can serve as an etch stop layer for the forming of the shared backside trench 113.

Figure 15D:
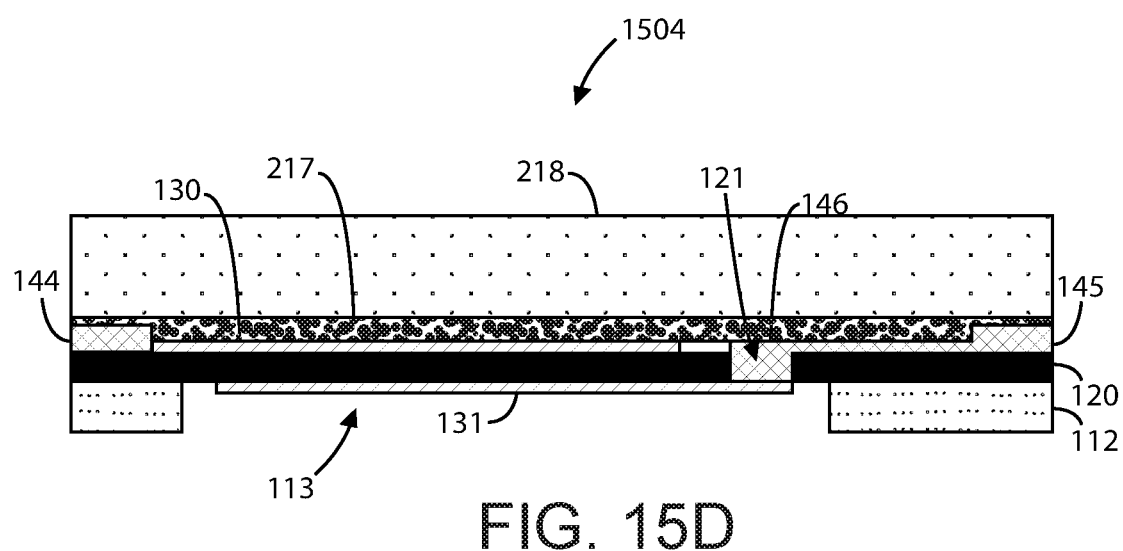

FIG. 15D can represent a method step of forming a backside metal electrode 131 and a backside metal 147, similar to that described in FIG. 10. In an example, the forming of the backside metal electrode 131 can include a deposition and patterning of metal materials within the shared backside trench 113. Here, the backside metal 131 serves as an electrode and the backside plug/connect metal 147 within the micro-via 121. The thickness, shape, and type of metal can vary as a function of the resonator/filter design. As an example, the backside electrode 131 and via plug metal 147 can be different metals. In a specific example, these backside metals 131, 147 can either be deposited and patterned on the surface of the piezoelectric layer 120 or rerouted to the backside of the substrate 112. In an example, the backside metal electrode may be patterned such that it is configured within the boundaries of the shared backside trench such that the backside metal electrode does not come in contact with one or more side-walls of the seed substrate created during the forming of the shared backside trench.

Figure 15E:
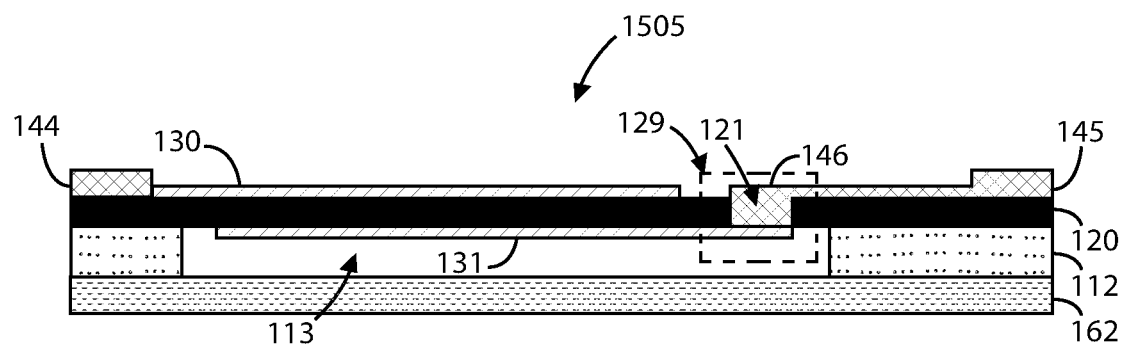

FIG. 15E can represent a method step of bonding a backside cap structure 162, similar to that described in FIGS. 11A and 11B, following a de-bonding of the temporary carrier 218 and cleaning of the topside of the device to remove the temporary adhesive 217. Those of ordinary skill in the art will recognize other variations, modifications, and alternatives of the methods steps described previously.

As used herein, the term "substrate" can mean the bulk substrate or can include overlying growth structures such as an aluminum, gallium, or ternary compound of aluminum and gallium and nitrogen containing epitaxial region, or functional regions, combinations, and the like.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic resonator using multiple ways of three-dimensional stacking through a wafer level process. Such filters or resonators can be implemented in an RF filter device, an RF filter system, or the like. Depending upon the embodiment, one or more of these benefits may be achieved. Of course, there can be other variations, modifications, and alternatives.

With 4G LTE and 5G growing more popular by the day, wireless data communication demands high performance RF filters with frequencies around 5 GHz and higher. Bulk acoustic wave resonators (BAWR), widely used in such filters operating at frequencies around 3 GHz and lower, are leading candidates for meeting such demands. Current bulk acoustic wave resonators use polycrystalline piezoelectric AlN thin films where each grain's c-axis is aligned perpendicular to the film's surface to allow high piezoelectric performance whereas the grains' a- or b-axis are randomly distributed. This peculiar grain distribution works well when the piezoelectric film's thickness is around 1 um and above, which is the perfect thickness for bulk acoustic wave (BAW) filters operating at frequencies ranging from 1 to 3 GHz. However, the quality of the polycrystalline piezoelectric films degrades quickly as the thicknesses decrease below around 0.5 um, which is required for resonators and filters operating at frequencies around 5 GHz and above.

Single crystalline or epitaxial piezoelectric thin films grown on compatible crystalline substrates exhibit good crystalline quality and high piezoelectric performance even down to very thin thicknesses, e.g., 0.4 um. The present invention provides manufacturing processes and structures for high quality bulk acoustic wave resonators with single crystalline or epitaxial piezoelectric thin films for high frequency BAW filter applications.

BAWRs require a piezoelectric material, e.g., AlN, in crystalline form, i.e., polycrystalline or single crystalline. The quality of the film heavy depends on the chemical, crystalline, or topographical quality of the layer on which the film is grown. In conventional BAWR processes (including film bulk acoustic resonator (FBAR) or solidly mounted resonator (SMR) geometry), the piezoelectric film is grown on a patterned bottom electrode, which is usually made of molybdenum (Mo), tungsten (W), or ruthenium (Ru). The surface geometry of the patterned bottom electrode significantly influences the crystalline orientation and crystalline quality of the piezoelectric film, requiring complicated modification of the structure.

Thus, the present invention uses single crystalline piezoelectric films and thin film transfer processes to produce a BAWR with enhanced ultimate quality factor and electromechanical coupling for RF filters. Such methods and structures facilitate methods of manufacturing and structures for RF filters using single crystalline or epitaxial piezoelectric films to meet the growing demands of contemporary data communication.

In an example, the present invention provides transfer structures and processes for acoustic resonator devices, which provides a flat, high-quality, single-crystal piezoelectric film for superior acoustic wave control and high Q in high frequency. As described above, polycrystalline piezoelectric layers limit Q in high frequency. Also, growing epitaxial piezoelectric layers on patterned electrodes affects the crystalline orientation of the piezoelectric layer, which limits the ability to have tight boundary control of the resulting resonators. Embodiments of the present invention, as further described below, can overcome these limitations and exhibit improved performance and cost-efficiency.

FIGS. 16A-16C through FIGS. 31A-31C illustrate a method of fabrication for an acoustic resonator device using a transfer structure with a sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 16C:
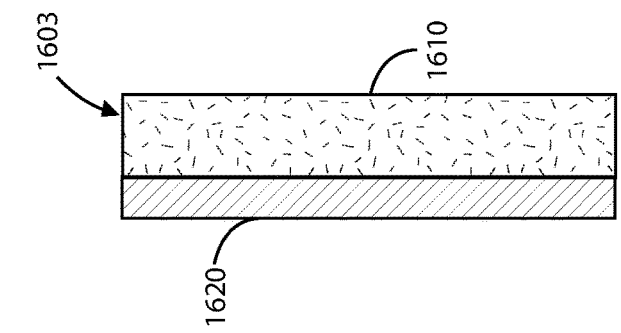
FIGS. 16A-16C through FIGS. 31A-31C are simplified diagrams illustrating various cross-sectional views of a single crystal acoustic resonator device and of method steps for a transfer process using a sacrificial layer for single crystal acoustic resonator devices according to an example of the present invention.
Figure 16A:
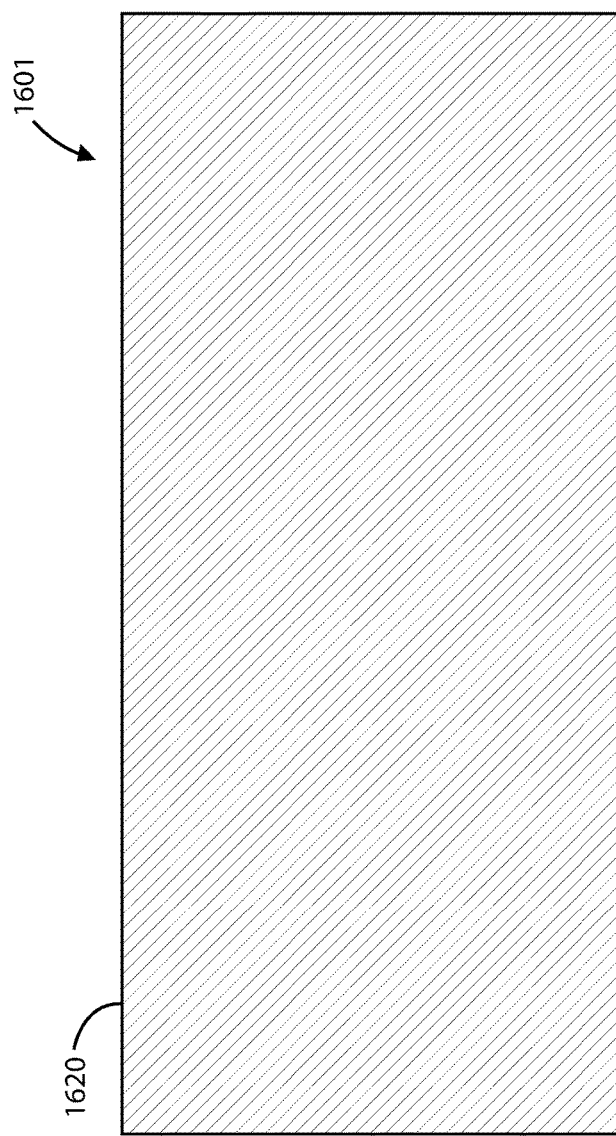
Figure 16B:
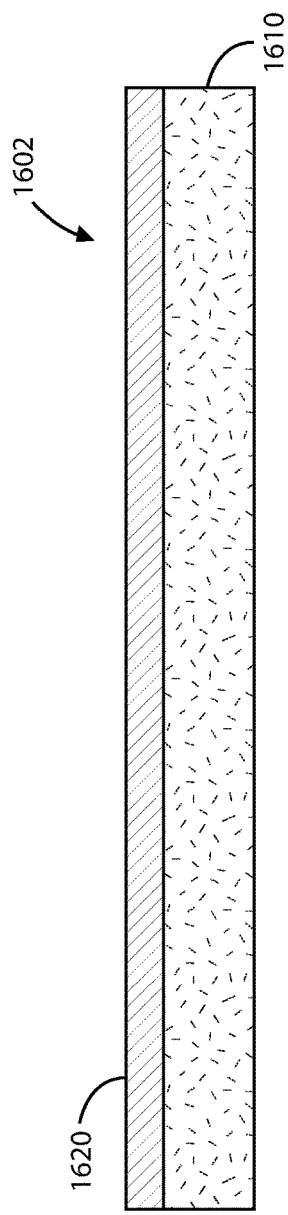

FIGS. 16A-16C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a piezoelectric thin film 1620 overlying a growth substrate 1610. In an example, the growth substrate 1610 can include silicon (S), silicon carbide (SiC), Sapphire, or other like materials. The piezoelectric film 1620 can be a film including a Group III nitride, such as aluminum nitride (AlN), gallium nitride (GaN), or other like materials. Additionally, this piezoelectric substrate can be subjected to a thickness trim. The piezoelectric thin film 1620 (with or without a seed layer) can be formed as described above in reference to FIGS. 60-64 in some embodiments.

Figure 17C:
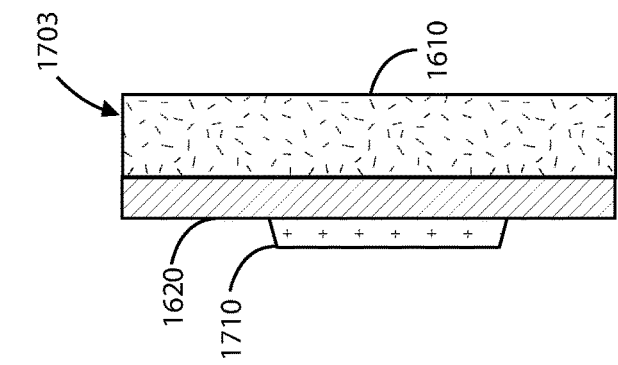
Figure 17A:
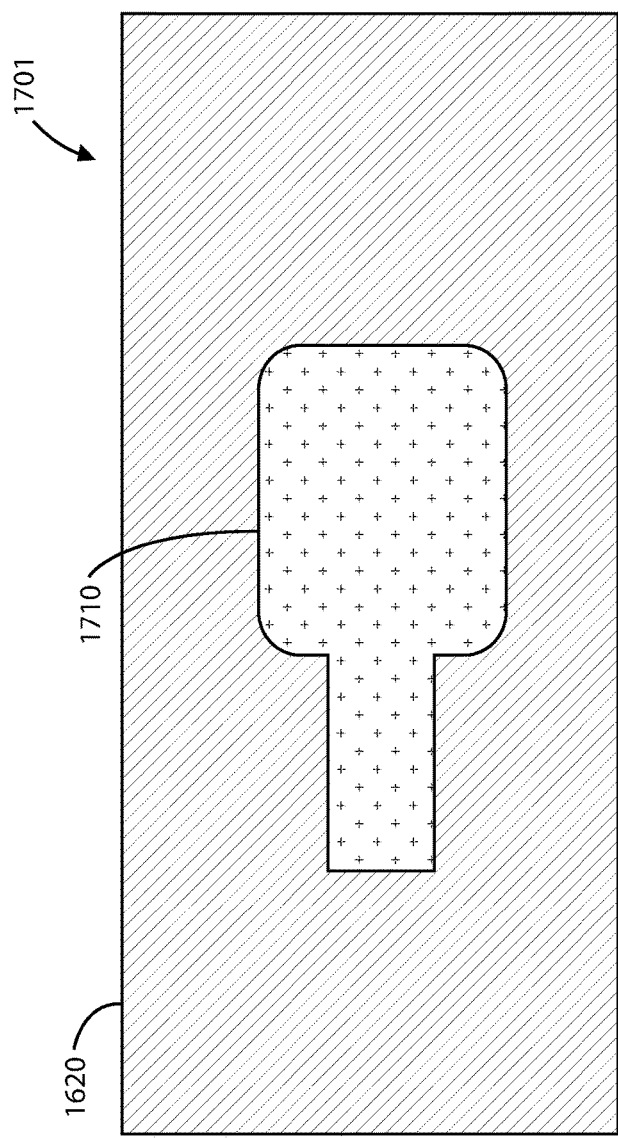
Figure 17B:
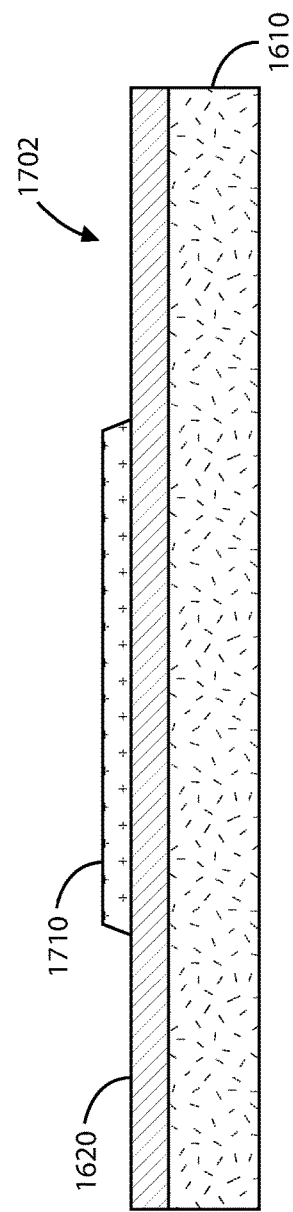

FIGS. 17A-17C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first electrode 1710 overlying the surface region of the piezoelectric thin film 1620. In an example, the first electrode 1710 can include molybdenum (Mo), ruthenium (Ru), tungsten (W), or other like materials. In a specific example, the first electrode 1710 can be subjected to a dry etch with a slope. As an example, the slope can be about 60 degrees.

FIGS. 18A-18C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first passivation layer 1810 overlying the first electrode 1710 and the piezoelectric thin film 1620. In an example, the first passivation layer 1810 can include silicon nitride (SiN), silicon oxide (SiOx), or other like materials. In a specific example, the first passivation layer 1810 can have a thickness ranging from about 50 nm to about 100 nm.

FIGS. 19A-19C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a sacrificial layer 1910 overlying a portion of the first electrode 1810 and a portion of the piezoelectric film 1620. In an example, the sacrificial layer 1910 can include polycrystalline silicon (poly-Si), amorphous silicon (a-Si), or other like materials. In a specific example, this sacrificial layer 1910 can be subjected to a dry etch with a slope and be deposited with a thickness of about 1 um. Further, phosphorous doped SiO.sub.2 (PSG) can be used as the sacrificial layer with different combinations of support layer (e.g., SiNx).

FIGS. 20A-20C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a support layer 2010 overlying the sacrificial layer 1910, the first electrode 1710, and the piezoelectric thin film 1620. In an example, the support layer 2010 can include silicon dioxide (SiO.sub.2), silicon nitride (SiN), or other like materials. In a specific example, this support layer 2010 can be deposited with a thickness of about 2-3 um. As described above, other support layers (e.g., SiNx) can be used in the case of a PSG sacrificial layer.

FIGS. 21A-21C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of polishing the support layer 2010 to form a polished support layer 2011. In an example, the polishing process can include a chemical-mechanical planarization process or the like.

FIGS. 22A-22C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate flipping the device and physically coupling overlying the support layer 2011 overlying a bond substrate 2210. In an example, the bond substrate 2210 can include a bonding support layer 2220 (SiO.sub.2 or like material) overlying a substrate having silicon (Si), sapphire (Al.sub.2O.sub.3), silicon dioxide (SiO.sub.2), silicon carbide (SiC), or other like materials. In a specific embodiment, the bonding support layer 2220 of the bond substrate 2210 is physically coupled to the polished support layer 2011. Further, the physical coupling process can include a room temperature bonding process following by a 300 degree Celsius annealing process.

FIGS. 23A-23C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the growth substrate 1610 or otherwise the transfer of the piezoelectric thin film 1620. In an example, the removal process can include a grinding process, a blanket etching process, a film transfer process, an ion implantation transfer process, a laser crack transfer process, or the like and combinations thereof.

Further referring to FIGS. 23A-23C, the growth substrate 1610 can be removed to expose the backside surface of the piezoelectric thin film 1620. The exposed backside surface of the piezoelectric thin film 1620 can also be processed to remove the first formed portions of the piezoelectric thin film 1620. As appreciated by the present inventors, the portion of the piezoelectric thin film 1620 that is first formed (by sputtering, CVD, or other processes at high or low temperatures) can have a lower crystalline quality that later formed portions. Accordingly, the first formed portion of the piezoelectric thin film 1620 that contacted the growth substrate 1610 and the portions immediately adjacent to the first formed portion, can have a lower crystalline quality than portions that were later formed.

As further appreciated by the present inventors, removing the portion of the piezoelectric thin film that was first formed on the growth substrate can eliminate the lower crystallinity portion of the piezoelectric thin film such that the remaining portion of the piezoelectric thin film 1620 has a higher crystallinity. For example, in some embodiments, a piezoelectric thin film of AlN or AlScN can be processed to remove about at least 500 Angstroms of material from the back-side of the film (the portion that was first formed on the substrate) so that the remaining portion has a crystallinity of less than about 1.0 degree at Full Width Half Maximum (FWHM) to about 10 arcseconds at FWHM measured using X-ray diffraction (XRD). In some embodiments, the crystallinity of the piezoelectric thin film can be in a range between about 1.0 degree at FWHM to about 0.5 degrees at FWHM measured using XRD.

FIGS. 24A-24C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming an electrode contact via 2410 within the piezoelectric film 1620 (becoming piezoelectric film 1621) overlying the first electrode 1710 and forming one or more release holes 2420 within the piezoelectric film 1620 and the first passivation layer 1810 overlying the sacrificial layer 1910. The via forming processes can include various types of etching processes.

Figure 25C:
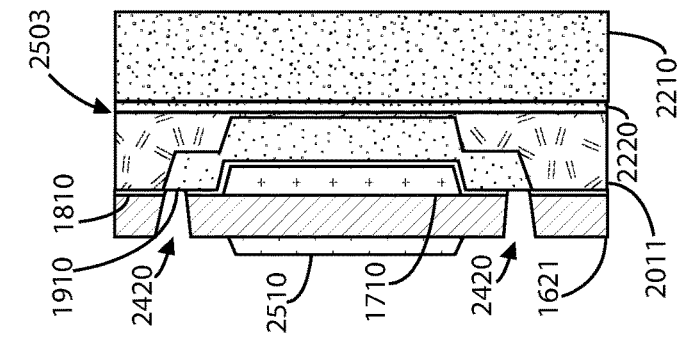
Figure 25A:
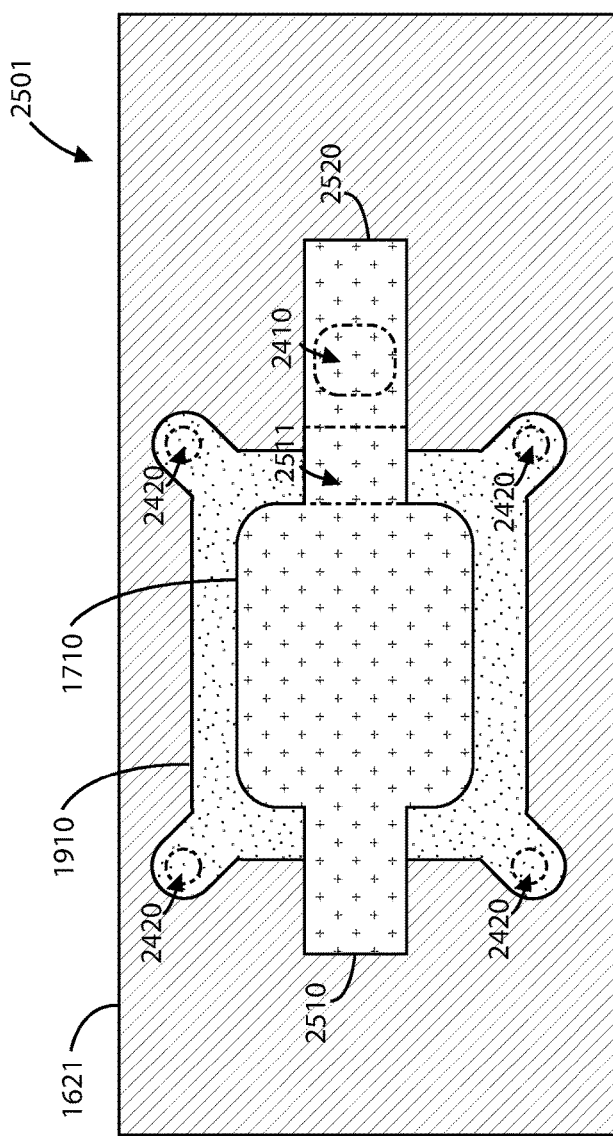
Figure 25B:
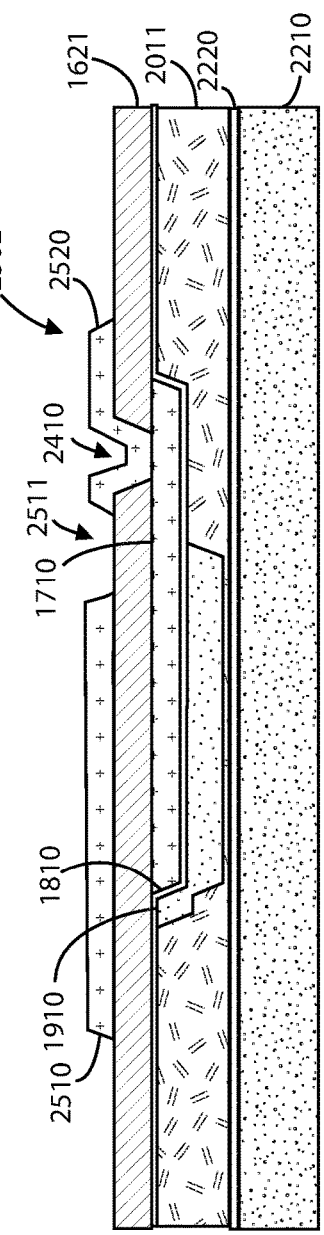

FIGS. 25A-25C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second electrode 2510 overlying the piezoelectric film 1621. In an example, the formation of the second electrode 2510 includes depositing molybdenum (Mo), ruthenium (Ru), tungsten (W), or other like materials; and then etching the second electrode 2510 to form an electrode cavity 2511 and to remove portion 2511 from the second electrode to form a top metal 2520. Further, the top metal 2520 is physically coupled to the first electrode 1720 through electrode contact via 2410.

FIGS. 26A-26C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first contact metal 2610 overlying a portion of the second electrode 2510 and a portion of the piezoelectric film 1621, and forming a second contact metal 2611 overlying a portion of the top metal 2520 and a portion of the piezoelectric film 1621. In an example, the first and second contact metals can include gold (Au), aluminum (Al), copper (Cu), nickel (Ni), aluminum bronze (AlCu), or related alloys of these materials or other like materials.

FIGS. 27A-27C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second passivation layer 2710 overlying the second electrode 2510, the top metal 2520, and the piezoelectric film 1621. In an example, the second passivation layer 2710 can include silicon nitride (SiN), silicon oxide (SiOx), or other like materials. In a specific example, the second passivation layer 2710 can have a thickness ranging from about 50 nm to about 100 nm.

Figure 28C:
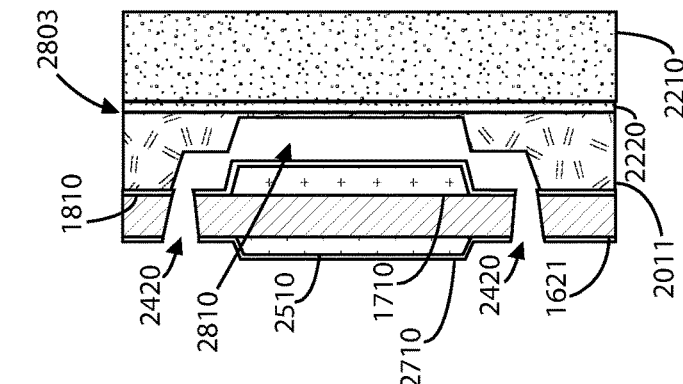
Figure 28A:
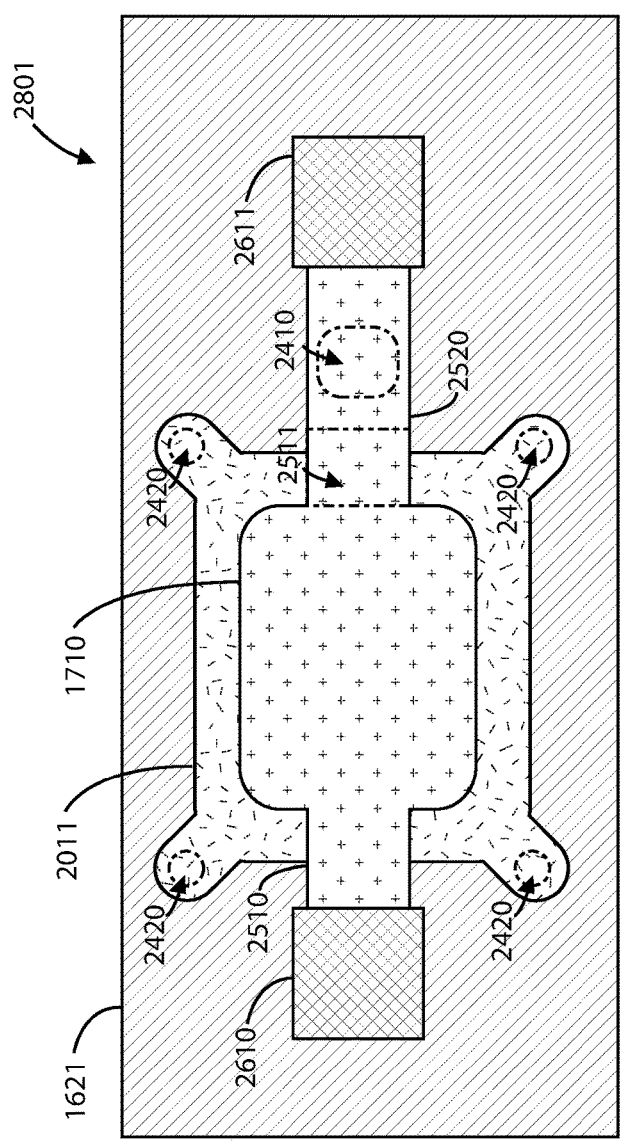
Figure 28B:
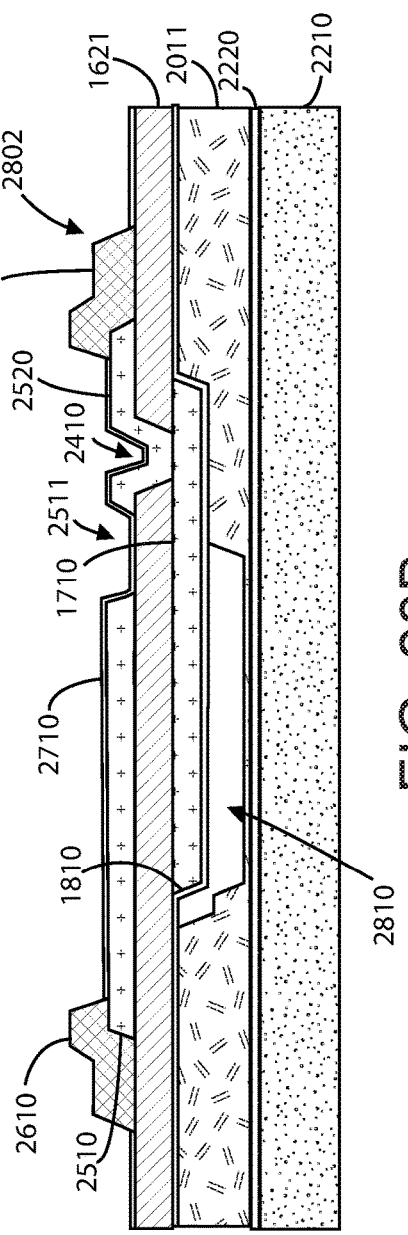

FIGS. 28A-28C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the sacrificial layer 1910 to form an air cavity 2810. In an example, the removal process can include a poly-Si etch or an a-Si etch, or the like.

FIGS. 29A-29C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the second electrode 2510 and the top metal 2520 to form a processed second electrode 2910 and a processed top metal 2920. This step can follow the formation of second electrode 2510 and top metal 2520. In an example, the processing of these two components includes depositing molybdenum (Mo), ruthenium (Ru), tungsten (W), or other like materials; and then etching (e.g., dry etch or the like) this material to form the processed second electrode 2910 with an electrode cavity 2912 and the processed top metal 2920. The processed top metal 2920 remains separated from the processed second electrode 2910 by the removal of portion 2911. In a specific example, the processed second electrode 2910 is characterized by the addition of an energy confinement structure configured on the processed second electrode 2910 to increase Q.

FIGS. 30A-30C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710 to form a processed first electrode 2310. This step can follow the formation of first electrode 1710. In an example, the processing of these two components includes depositing molybdenum (Mo), ruthenium (Ru), tungsten (W), or other like materials; and then etching (e.g., dry etch or the like) this material to form the processed first electrode 3010 with an electrode cavity, similar to the processed second electrode 2910. Air cavity 2811 shows the change in cavity shape due to the processed first electrode 3010. In a specific example, the processed first electrode 3010 is characterized by the addition of an energy confinement structure configured on the processed second electrode 3010 to increase Q.

Figure 31C:
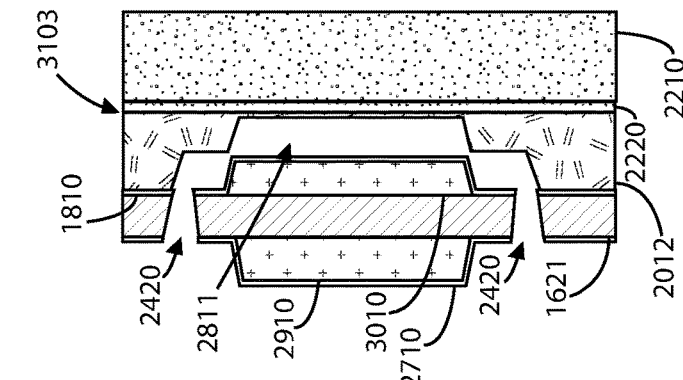
Figure 31A:
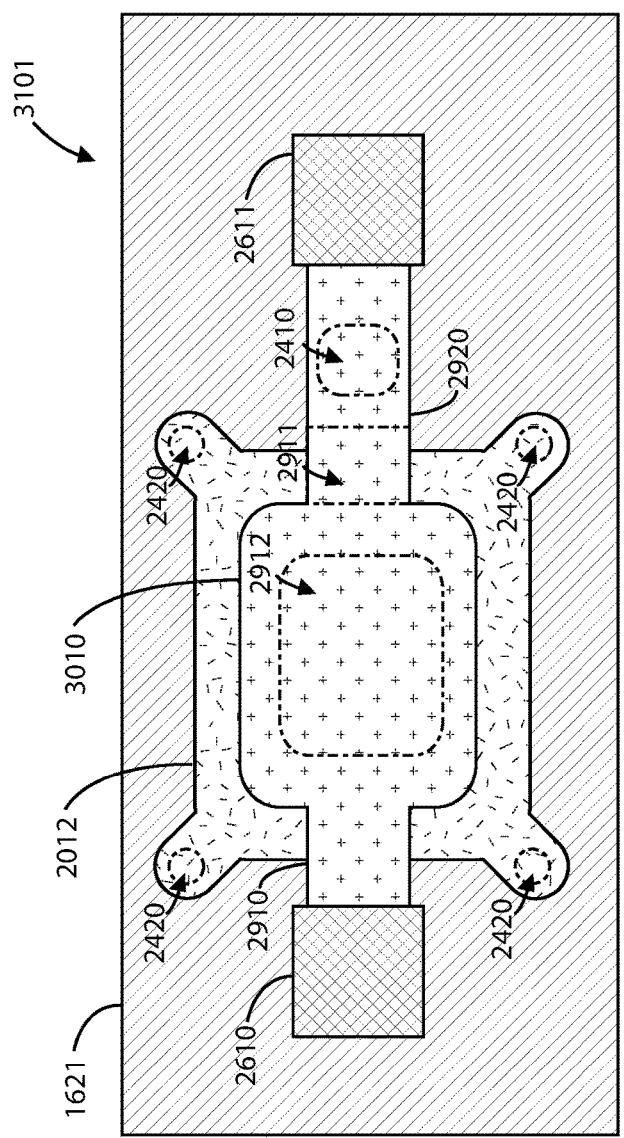
Figure 31B:
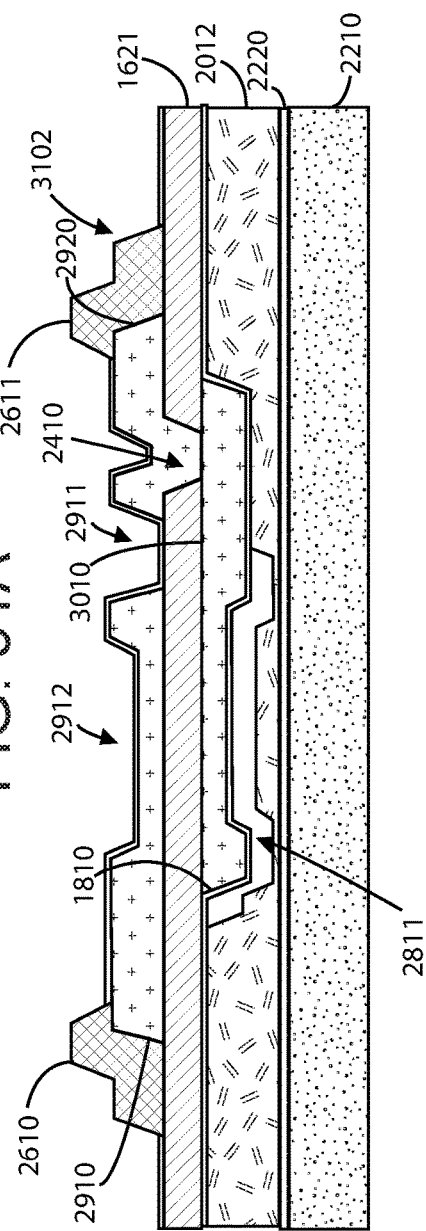

FIGS. 31A-31C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710, to form a processed first electrode 2310, and the second electrode 2510/top metal 2520 to form a processed second electrode 2910/processed top metal 2920. These steps can follow the formation of each respective electrode, as described for FIGS. 29A-29C and 30A-30C. Those of ordinary skill in the art will recognize other variations, modifications, and alternatives.

FIGS. 32A-32C through FIGS. 46A-46C illustrate a method of fabrication for an acoustic resonator device using a transfer structure without sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 32C:
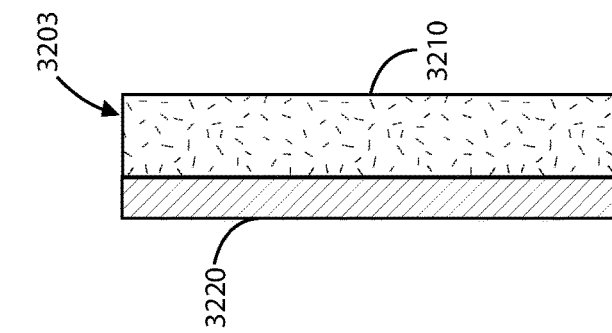
FIGS. 32A-32C through FIGS. 46A-46C are simplified diagrams illustrating various cross-sectional views of a single crystal acoustic resonator device and of method steps for a cavity bond transfer process for single crystal acoustic resonator devices according to an example of the present invention.
Figure 32A:
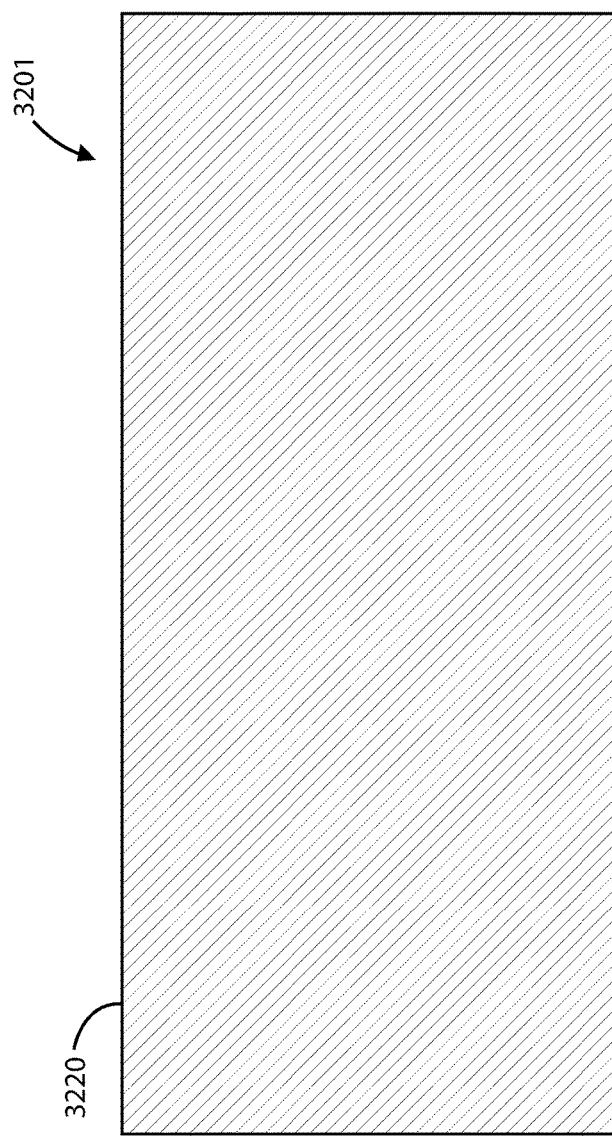
Figure 32B:
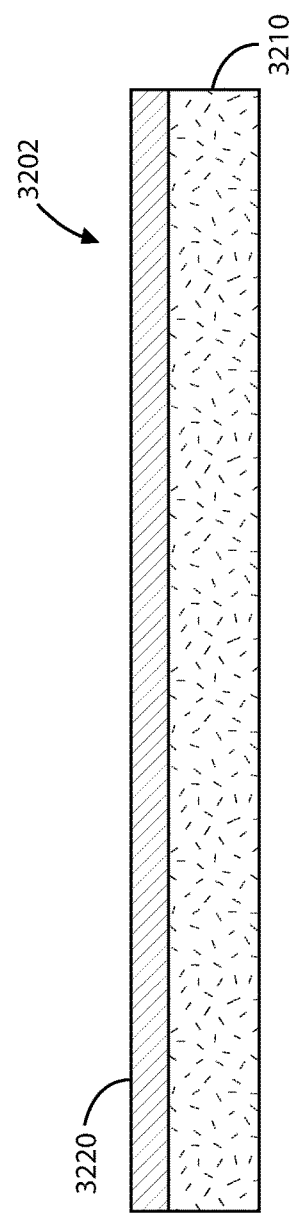

FIGS. 32A-32C are simplified diagrams illustrating various cross-sectional views of a single crystal acoustic resonator device and of method steps for a transfer process for single crystal acoustic resonator devices according to an example of the present invention. As shown, these figures illustrate the method step of forming a piezoelectric film 3220 overlying a growth substrate 3210. In an example, the growth substrate 3210 can include silicon (S), silicon carbide (SiC), or other like materials. The piezoelectric film 3220 can be an epitaxial film including aluminum nitride (AlN), gallium nitride (GaN), or other like materials. Additionally, this piezoelectric substrate can be subjected to a thickness trim. The piezoelectric thin film 3220 (with or without a seed layer) can be formed as described above in reference to FIGS. 16 and 60-64 in some embodiments.

Figure 33C:
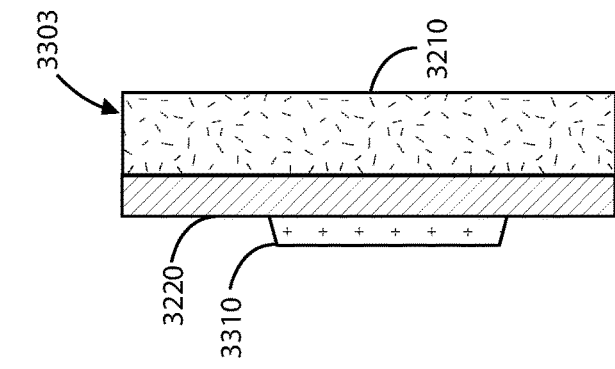
Figure 33A:
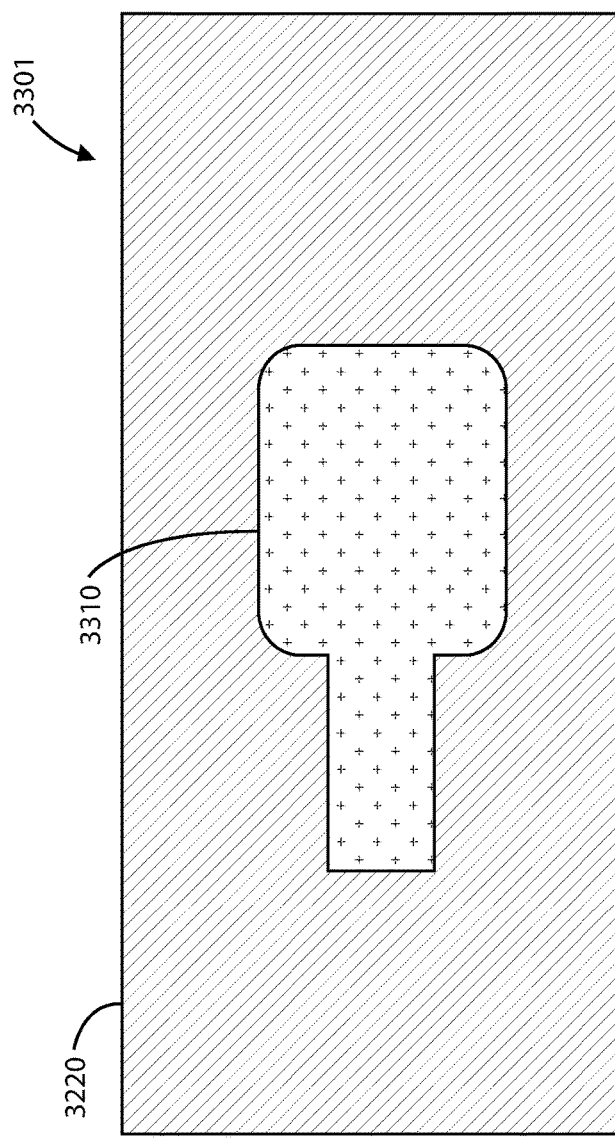
Figure 33B:
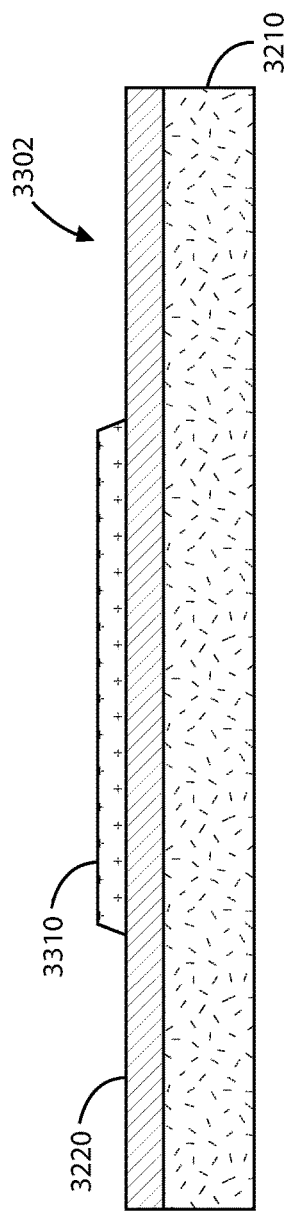

FIGS. 33A-33C are simplified diagrams illustrating various cross-sectional views of a single crystal acoustic resonator device and of method steps for a transfer process for single crystal acoustic resonator devices according to an example of the present invention. As shown, these figures illustrate the method step of forming a first electrode 3310 overlying the surface region of the piezoelectric film 3220. In an example, the first electrode 3310 can include molybdenum (Mo), ruthenium (Ru), tungsten (W), or other like materials. In a specific example, the first electrode 3310 can be subjected to a dry etch with a slope. As an example, the slope can be about 60 degrees.

Figure 34C:
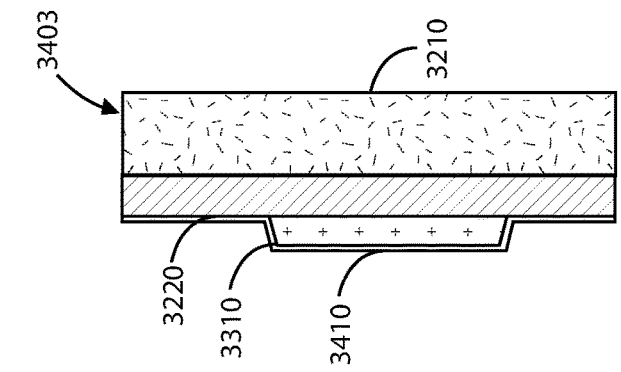
Figure 34A:
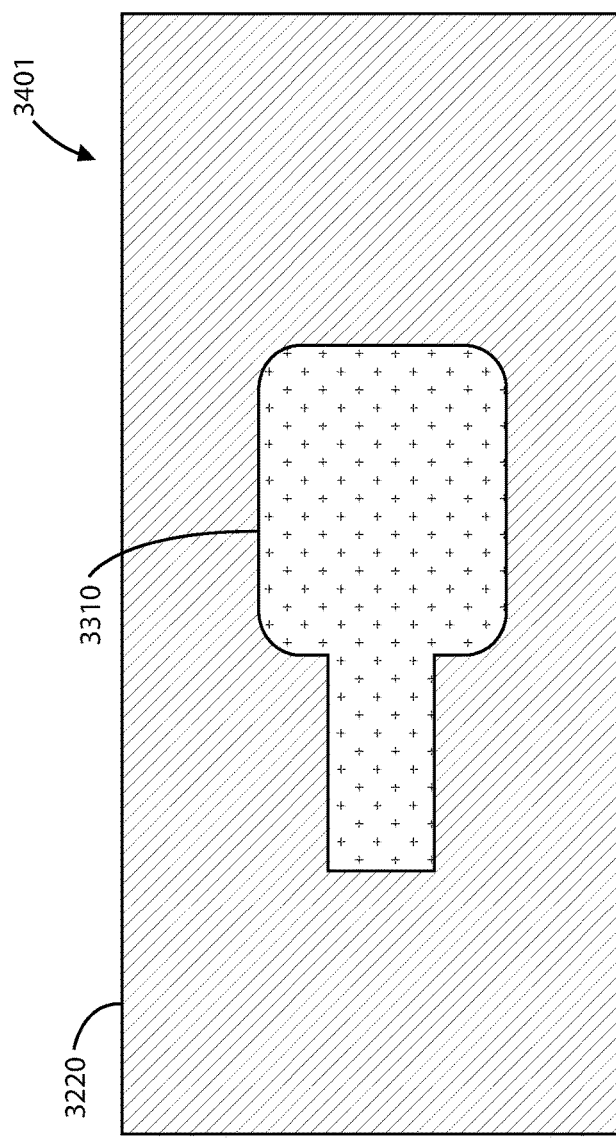
Figure 34B:
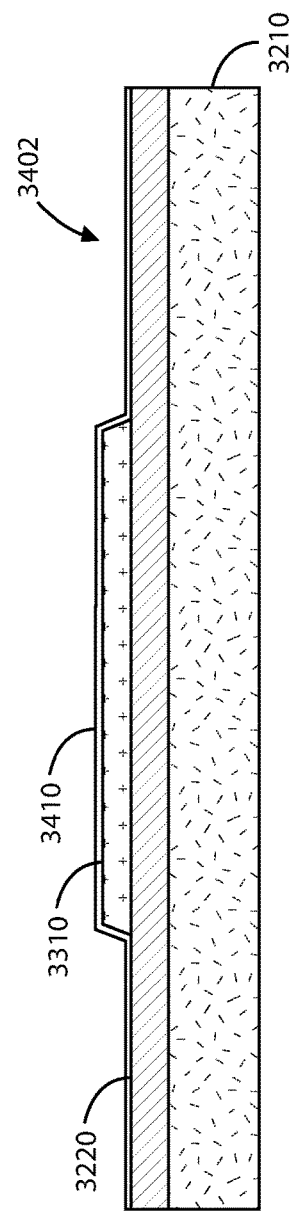

FIGS. 34A-34C are simplified diagrams illustrating various cross-sectional views of a single crystal acoustic resonator device and of method steps for a transfer process for single crystal acoustic resonator devices according to an example of the present invention. As shown, these figures illustrate the method step of forming a first passivation layer 3410 overlying the first electrode 3310 and the piezoelectric film 3220. In an example, the first passivation layer 3410 can include silicon nitride (SiN), silicon oxide (SiOx), or other like materials. In a specific example, the first passivation layer 3410 can have a thickness ranging from about 50 nm to about 100 nm.

FIGS. 35A-35C are simplified diagrams illustrating various cross-sectional views of a single crystal acoustic resonator device and of method steps for a transfer process for single crystal acoustic resonator devices according to an example of the present invention. As shown, these figures illustrate the method step of forming a support layer 3510 overlying the first electrode 3310, and the piezoelectric film 3220. In an example, the support layer 3510 can include silicon dioxide (SiO.sub.2), silicon nitride (SiN), or other like materials. In a specific example, this support layer 3510 can be deposited with a thickness of about 2-3 um. As described above, other support layers (e.g., SiNx) can be used in the case of a PSG sacrificial layer.

Figure 36C:
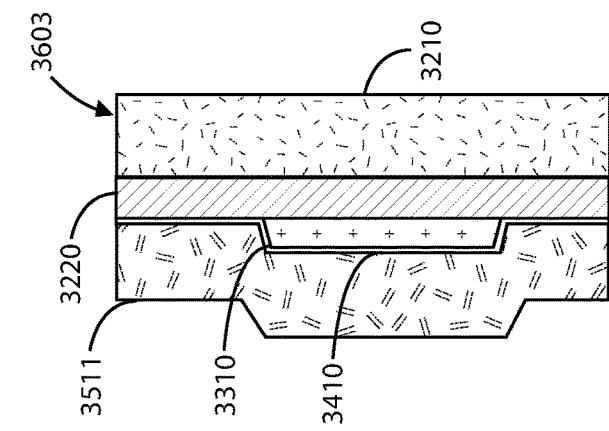
Figure 36A:
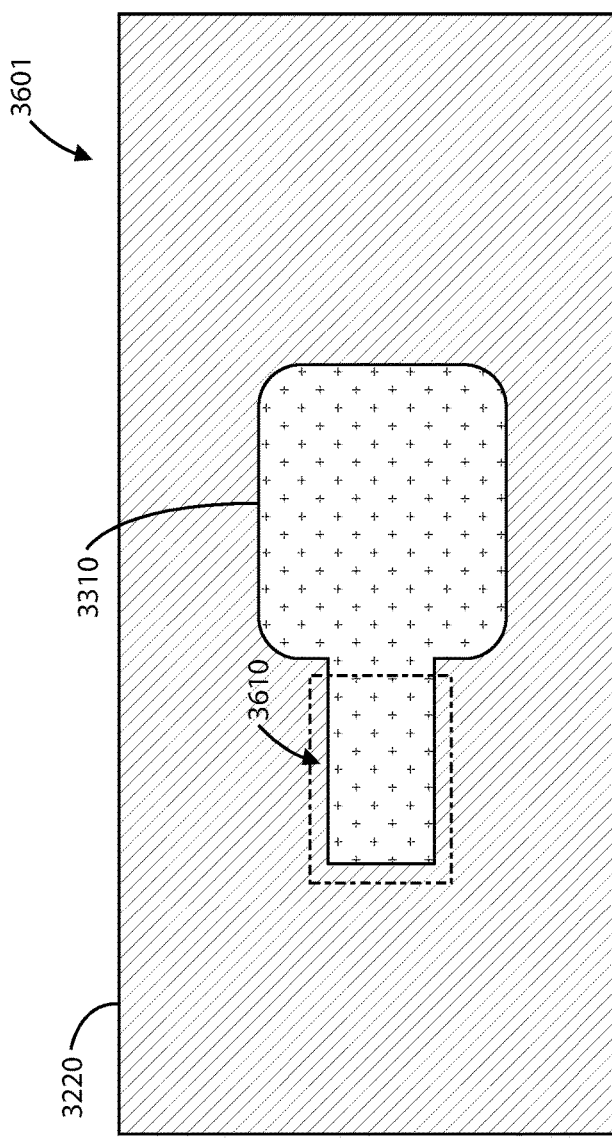
Figure 36B:
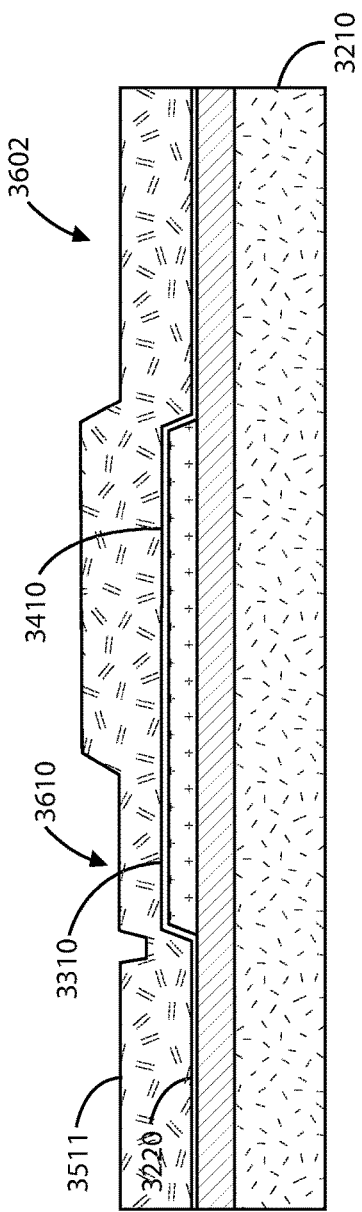

FIGS. 36A-36C are simplified diagrams illustrating various cross-sectional views of a single crystal acoustic resonator device and of method steps for a transfer process for single crystal acoustic resonator devices according to an example of the present invention. As shown, these figures illustrate the optional method step of processing the support layer 3510 (to form support layer 3511) in region 3610. In an example, the processing can include a partial etch of the support layer 3510 to create a flat bond surface. In a specific example, the processing can include a cavity region. In other examples, this step can be replaced with a polishing process such as a chemical-mechanical planarization process or the like.

Figure 37C:
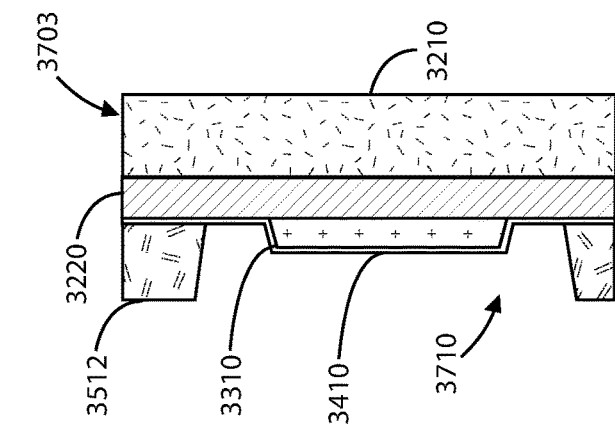
Figure 37A:
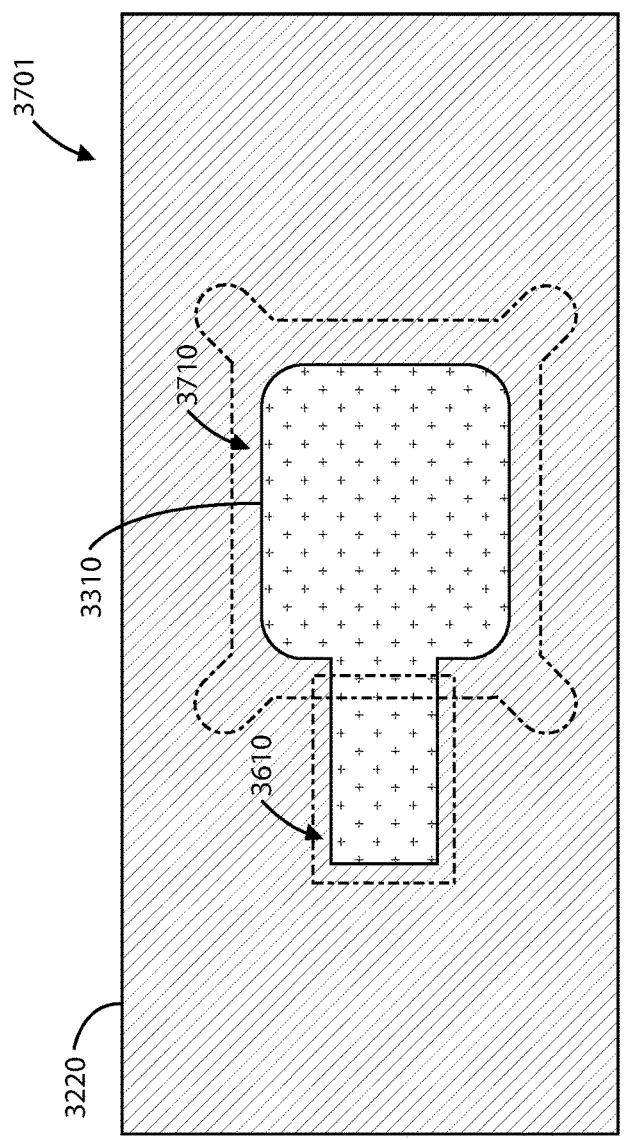
Figure 37B:
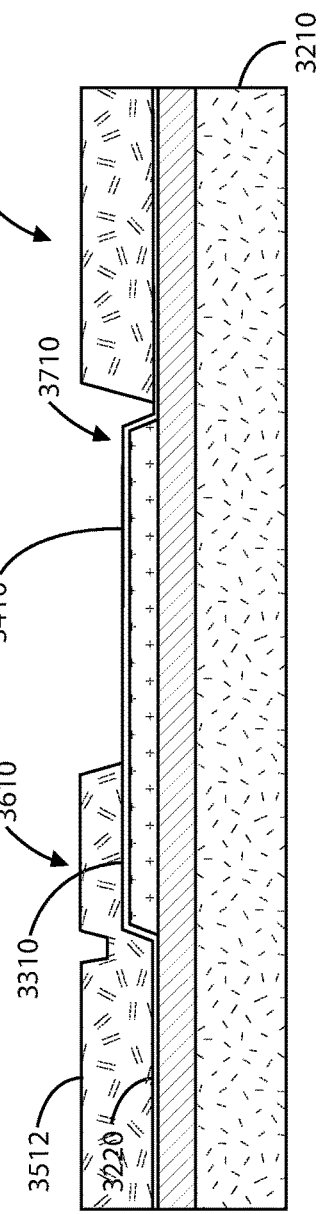

FIGS. 37A-37C are simplified diagrams illustrating various cross-sectional views of a single crystal acoustic resonator device and of method steps for a transfer process for single crystal acoustic resonator devices according to an example of the present invention. As shown, these figures illustrate the method step of forming an air cavity 3710 within a portion of the support layer 3511 (to form support layer 3512). In an example, the cavity formation can include an etching process that stops at the first passivation layer 3410.

FIGS. 38A-38C are simplified diagrams illustrating various cross-sectional views of a single crystal acoustic resonator device and of method steps for a transfer process for single crystal acoustic resonator devices according to an example of the present invention. As shown, these figures illustrate the method step of forming one or more cavity vent holes 3810 within a portion of the piezoelectric film 3220 through the first passivation layer 3410. In an example, the cavity vent holes 3810 connect to the air cavity 3710.

Figure 39C:
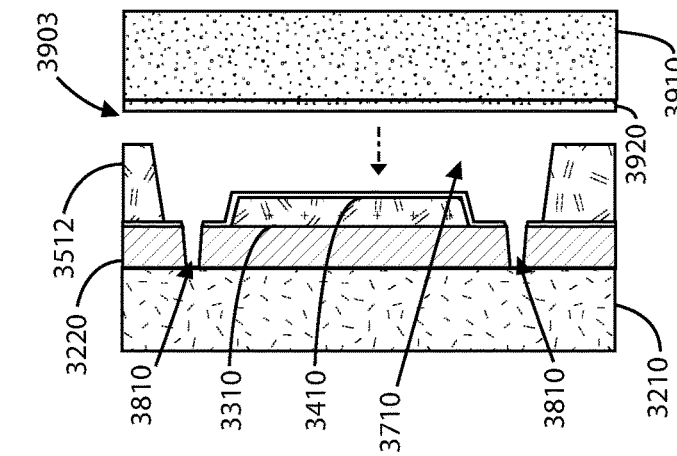
Figure 39A:
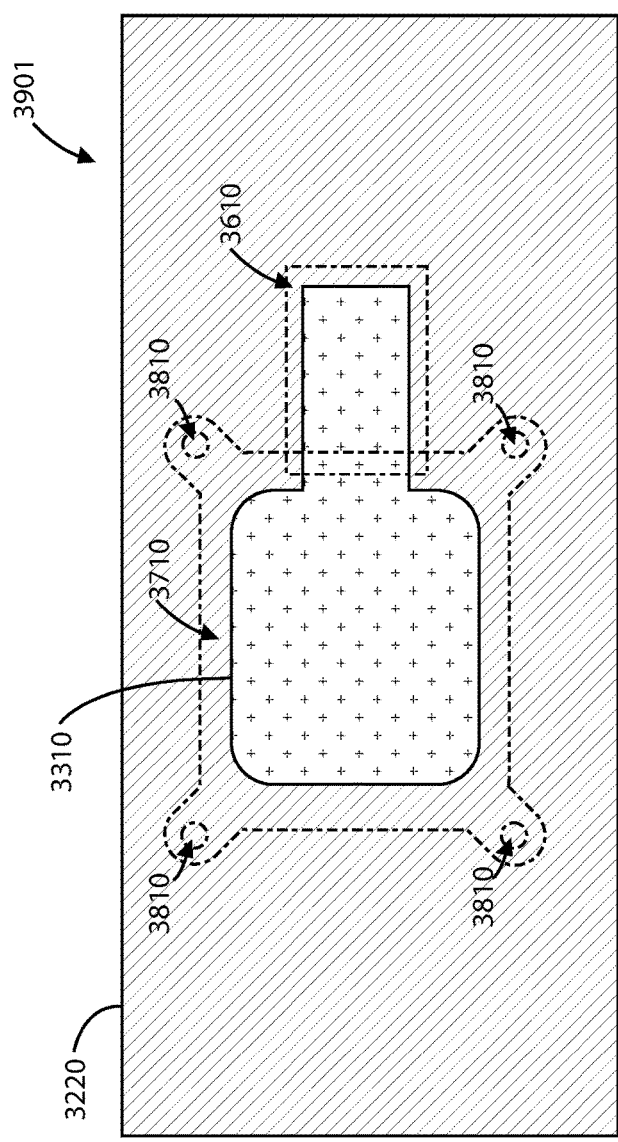
Figure 39B:
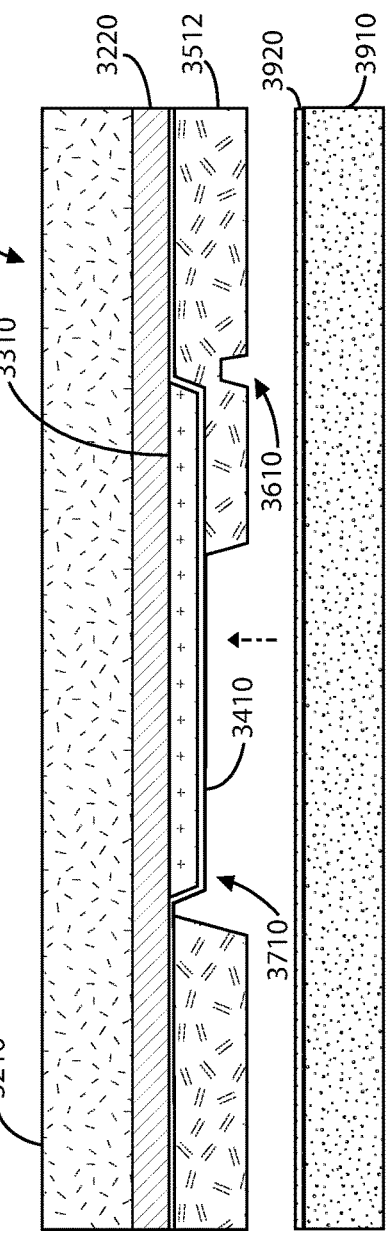

FIGS. 39A-39C are simplified diagrams illustrating various cross-sectional views of a single crystal acoustic resonator device and of method steps for a transfer process for single crystal acoustic resonator devices according to an example of the present invention. As shown, these figures illustrate flipping the device and physically coupling overlying the support layer 3512 overlying a bond substrate 3910. In an example, the bond substrate 3910 can include a bonding support layer 3920 (SiO.sub.2 or like material) overlying a substrate having silicon (Si), sapphire (Al.sub.2O.sub.3), silicon dioxide (SiO.sub.2), silicon carbide (SiC), or other like materials. In a specific embodiment, the bonding support layer 3920 of the bond substrate 3910 is physically coupled to the polished support layer 3512.

Further, the physical coupling process can include a room temperature bonding process following by a 300 degree Celsius annealing process.

FIGS. 40A-40C are simplified diagrams illustrating various cross-sectional views of a single crystal acoustic resonator device and of method steps for a transfer process for single crystal acoustic resonator devices according to an example of the present invention. As shown, these figures illustrate the method step of removing the growth substrate 3210 or otherwise the transfer of the piezoelectric film 3220. In an example, the removal process can include a grinding process, a blanket etching process, a film transfer process, an ion implantation transfer process, a laser crack transfer process, or the like and combinations thereof.

Further referring to FIGS. 40A-40C, the growth substrate 3210 can be removed to expose the backside surface of the piezoelectric thin film 3220. The exposed backside surface of the piezoelectric thin film 1620 can also be processed to remove the first formed portions of the piezoelectric thin film 1620. As appreciated by the present inventors, the portion of the piezoelectric thin film 3220 that is first formed (by sputtering, CVD, or other processes at high or low temperatures) can have a lower crystalline quality that later formed portions. Accordingly, the first formed portion of the piezoelectric thin film 3220 that contacted the growth substrate 3210 and the portions immediately adjacent to the first formed portion, can have a lower crystalline quality than portions that were later formed.

As further appreciated by the present inventors, removing the portion of the piezoelectric thin film that was first formed on the growth substrate can eliminate the lower crystallinity portion of the piezoelectric thin film such that the remaining portion of the piezoelectric thin film 3220 has a higher crystallinity. For example, in some embodiments, a piezoelectric thin film of AlN or AlScN can be processed to remove about at least 500 Angstroms of material from the back-side of the film (the portion that was first formed on the substrate) so that the remaining portion has a crystallinity of less than about 1.0 degree at Full Width Half Maximum (FWHM) to about 10 arcseconds at FWHM measured using X-ray diffraction (XRD). In some embodiments, the crystallinity of the piezoelectric thin film can be in a range between about 1.0 degree at FWHM to about 0.5 degrees at FWHM measured using XRD.

FIGS. 41A-41C are simplified diagrams illustrating various cross-sectional views of a single crystal acoustic resonator device and of method steps for a transfer process for single crystal acoustic resonator devices according to an example of the present invention. As shown, these figures illustrate the method step of forming an electrode contact via 4110 within the piezoelectric film 3220 overlying the first electrode 3310. The via forming processes can include various types of etching processes.

Figure 42C:
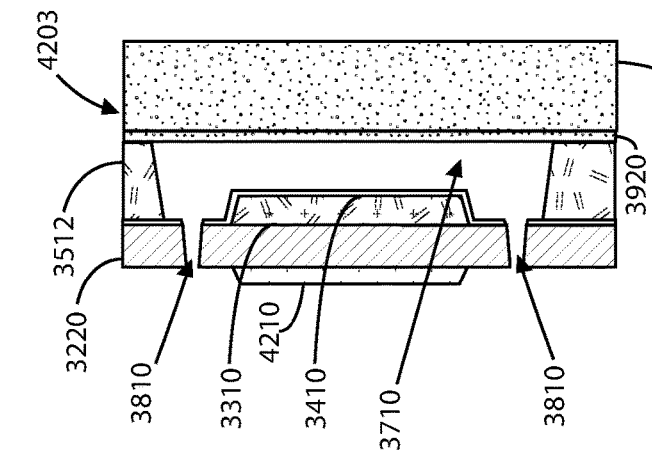
Figure 42A:
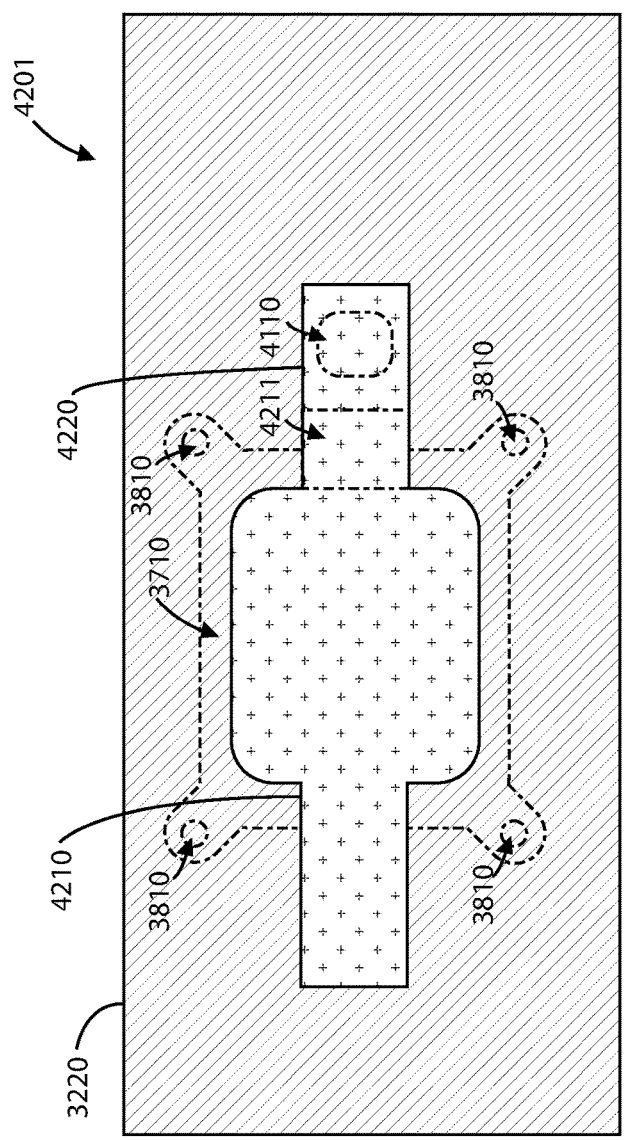
Figure 42B:
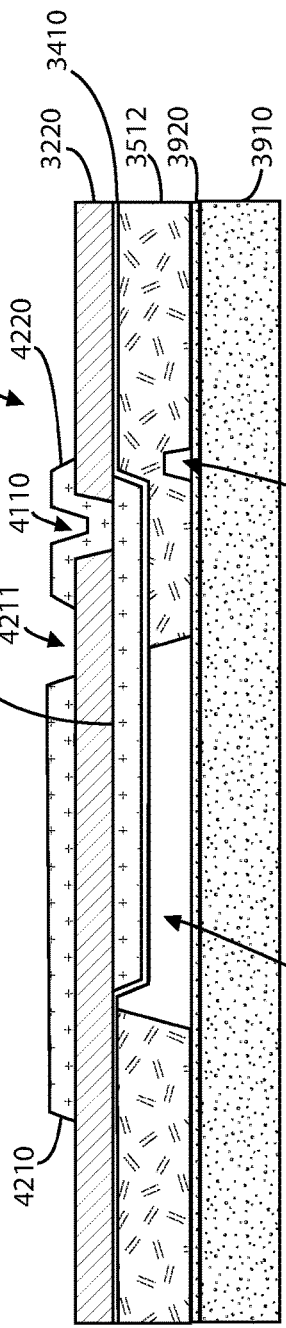

FIGS. 42A-42C are simplified diagrams illustrating various cross-sectional views of a single crystal acoustic resonator device and of method steps for a transfer process for single crystal acoustic resonator devices according to an example of the present invention. As shown, these figures illustrate the method step of forming a second electrode 4210 overlying the piezoelectric film 3220. In an example, the formation of the second electrode 4210 includes depositing molybdenum (Mo), ruthenium (Ru), tungsten (W), or other like materials; and then etching the second electrode 4210 to form an electrode cavity 4211 and to remove portion 4211 from the second electrode to form a top metal 4220. Further, the top metal 4220 is physically coupled to the first electrode 3310 through electrode contact via 4110.

FIGS. 43A-43C are simplified diagrams illustrating various cross-sectional views of a single crystal acoustic resonator device and of method steps for a transfer process for single crystal acoustic resonator devices according to an example of the present invention. As shown, these figures illustrate the method step of forming a first contact metal 4310 overlying a portion of the second electrode 4210 and a portion of the piezoelectric film 3220, and forming a second contact metal 4311 overlying a portion of the top metal 4220 and a portion of the piezoelectric film 3220. In an example, the first and second contact metals can include gold (Au), aluminum (Al), copper (Cu), nickel (Ni), aluminum bronze (AlCu), or other like materials. This figure also shows the method step of forming a second passivation layer 4320 overlying the second electrode 4210, the top metal 4220, and the piezoelectric film 3220. In an example, the second passivation layer 4320 can include silicon nitride (SiN), silicon oxide (SiOx), or other like materials. In a specific example, the second passivation layer 4320 can have a thickness ranging from about 50 nm to about 100 nm.

FIGS. 44A-44C are simplified diagrams illustrating various cross-sectional views of a single crystal acoustic resonator device and of method steps for a transfer process for single crystal acoustic resonator devices according to another example of the present invention. As shown, these figures illustrate the method step of processing the second electrode 4210 and the top metal 4220 to form a processed second electrode 4410 and a processed top metal 4420. This step can follow the formation of second electrode 4210 and top metal 4220. In an example, the processing of these two components includes depositing molybdenum (Mo), ruthenium (Ru), tungsten (W), or other like materials; and then etching (e.g., dry etch or the like) this material to form the processed second electrode 4410 with an electrode cavity 4412 and the processed top metal 4420. The processed top metal 4420 remains separated from the processed second electrode 4410 by the removal of portion 4411. In a specific example, the processed second electrode 4410 is characterized by the addition of an energy confinement structure configured on the processed second electrode 4410 to increase Q.

FIGS. 45A-45C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310 to form a processed first electrode 4510. This step can follow the formation of first electrode 3310. In an example, the processing of these two components includes depositing molybdenum (Mo), ruthenium (Ru), tungsten (W), or other like materials; and then etching (e.g., dry etch or the like) this material to form the processed first electrode 4510 with an electrode cavity, similar to the processed second electrode 4410. Air cavity 3711 shows the change in cavity shape due to the processed first electrode 4510. In a specific example, the processed first electrode 4510 is characterized by the addition of an energy confinement structure configured on the processed second electrode 4510 to increase Q.

Figure 46C:
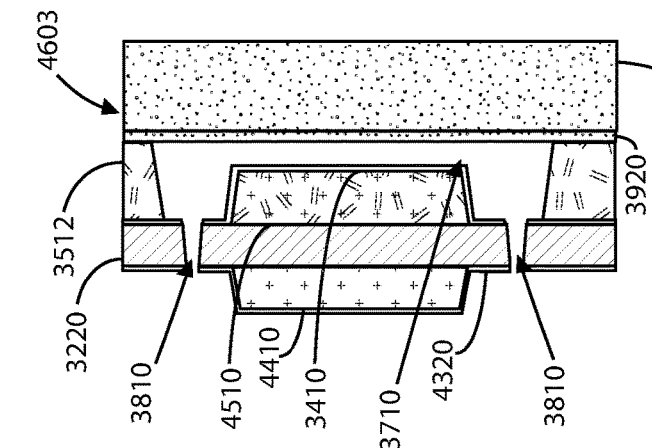
Figure 46A:
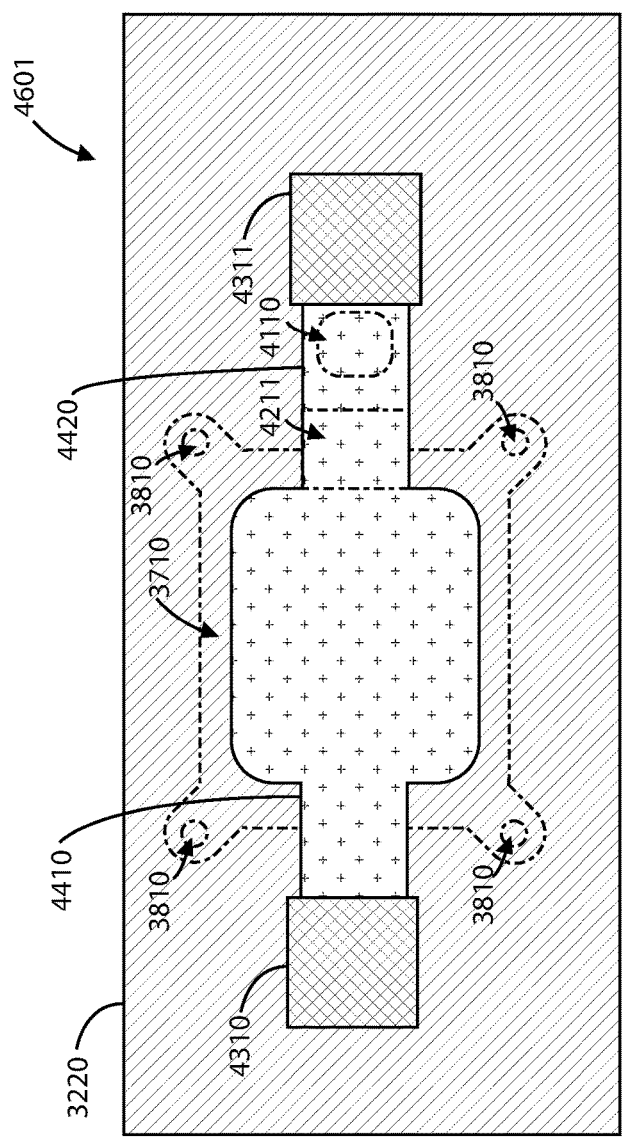
Figure 46B:
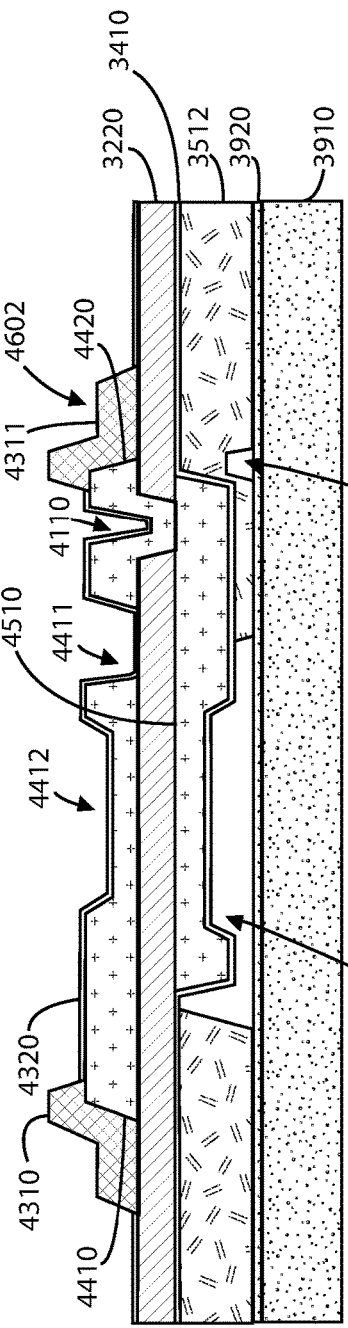

FIGS. 46A-46C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310, to form a processed first electrode 4510, and the second electrode 4210/top metal 4220 to form a processed second electrode 4410/processed top metal 4420. These steps can follow the formation of each respective electrode, as described for FIGS. 44A-44C and 45A-45C. Those of ordinary skill in the art will recognize other variations, modifications, and alternatives.

FIGS. 47A-47C through FIGS. 59A-59C illustrate a method of fabrication for an acoustic resonator device using a transfer structure with a multilayer mirror structure. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 47C:
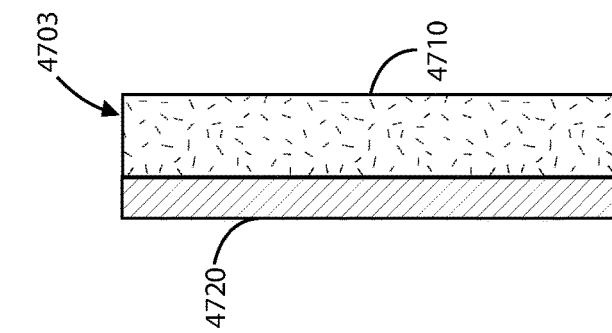
FIGS. 47A-47C though
Figure 47A:
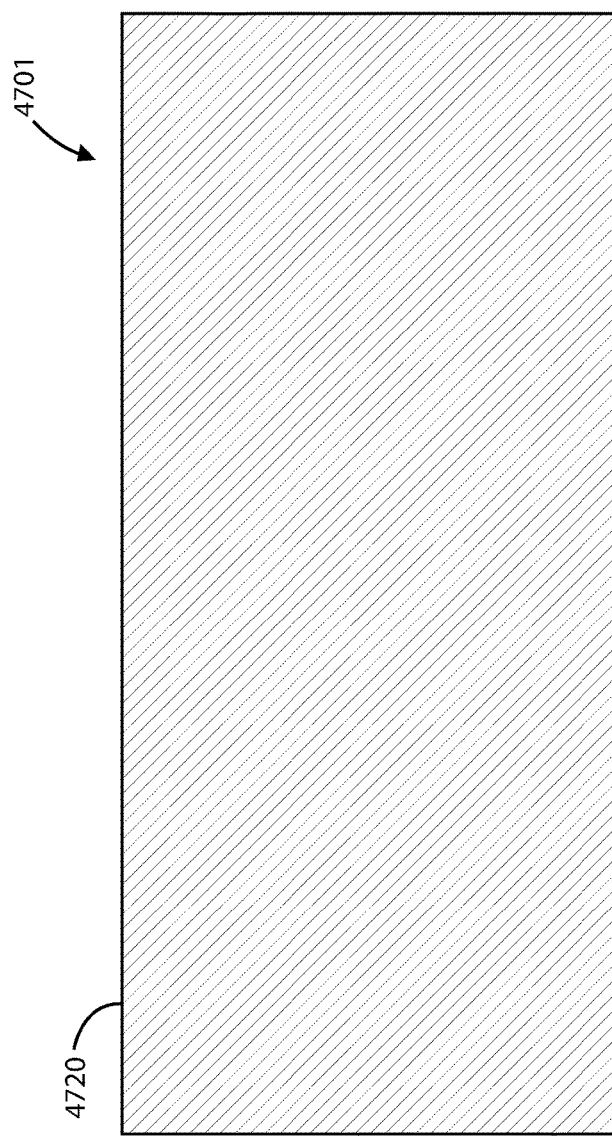
Figure 47B:
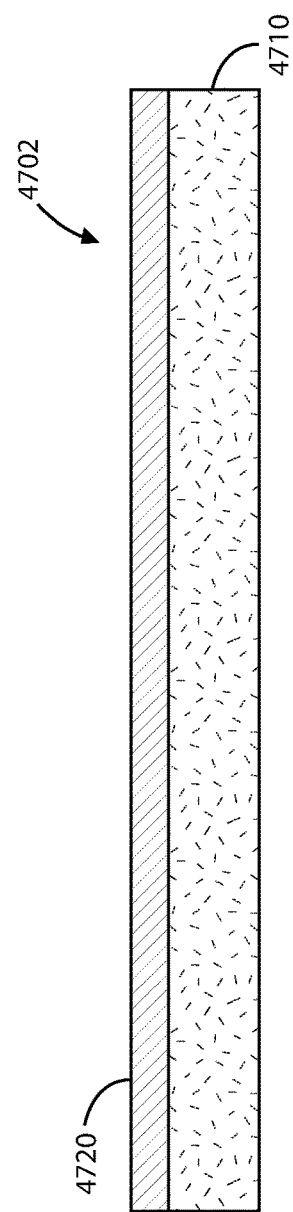

FIGS. 47A-47C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a piezoelectric film 4720 overlying a growth substrate 4710. In an example, the growth substrate 4710 can include silicon (S), silicon carbide (SiC), or other like materials. The piezoelectric thin film 4720 can be an epitaxial film including aluminum nitride (AlN), gallium nitride (GaN), or other like materials. Additionally, this piezoelectric substrate can be subjected to a thickness trim. The piezoelectric thin film 4720 (with or without a seed layer) can be formed as described above in reference to FIGS. 60-64 in some embodiments.

Figure 48C:
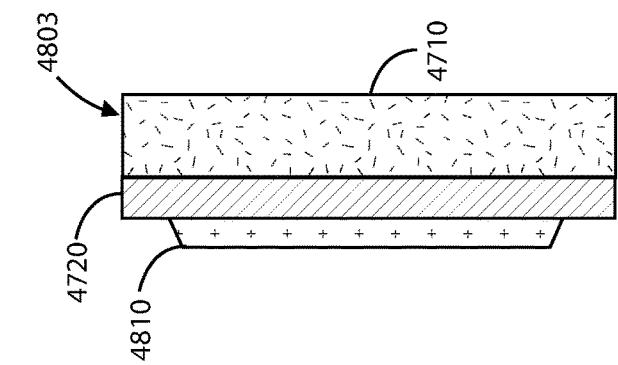
Figure 48A:
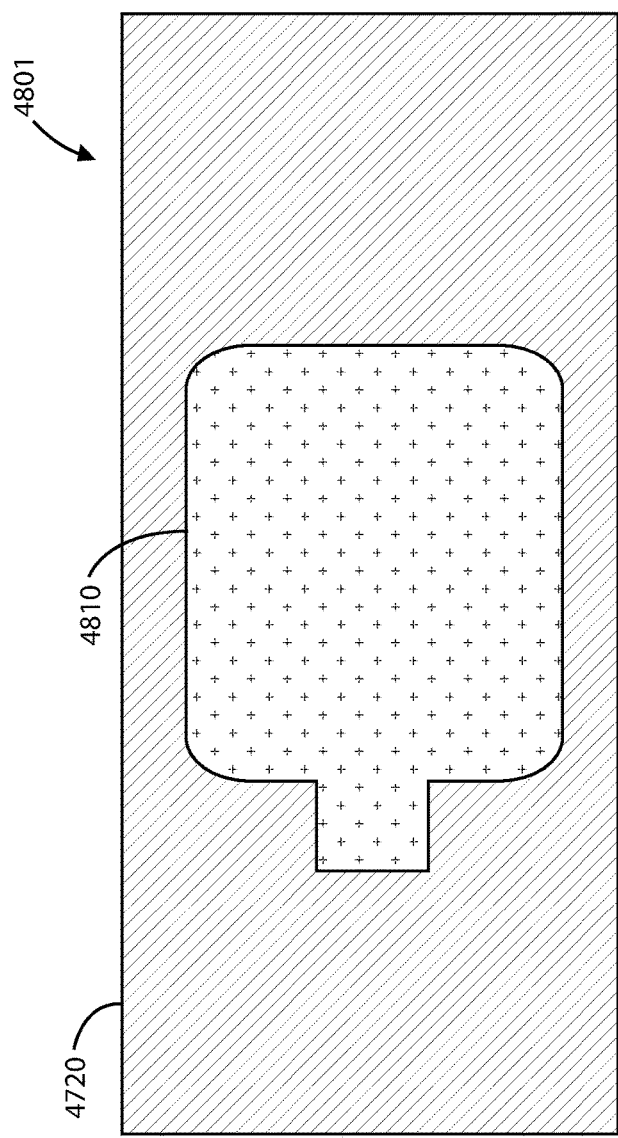
Figure 48B:
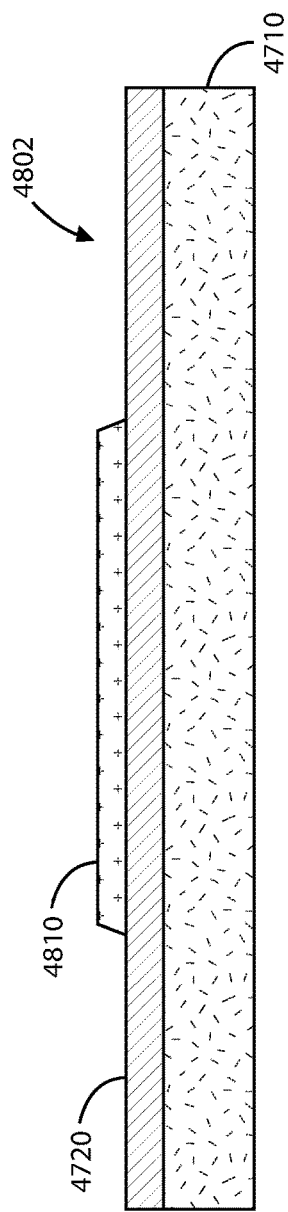

FIGS. 48A-48C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a first electrode 4810 overlying the surface region of the piezoelectric film 4720. In an example, the first electrode 4810 can include molybdenum (Mo), ruthenium (Ru), tungsten (W), or other like materials. In a specific example, the first electrode 4810 can be subjected to a dry etch with a slope. As an example, the slope can be about 60 degrees.

FIGS. 49A-49C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a multilayer mirror or reflector structure. In an example, the multilayer mirror includes at least one pair of layers with a low impedance layer 4910 and a high impedance layer 4920. In FIGS. 49A-49C, two pairs of low/high impedance layers are shown (low: 4910 and 4911; high: 4920 and 4921). In an example, the mirror/reflector area can be larger than the resonator area and can encompass the resonator area. In a specific embodiment, each layer thickness is about ¼ of the wavelength of an acoustic wave at a targeting frequency. The layers can be deposited in sequence and be etched afterwards, or each layer can be deposited and etched individually. In another example, the first electrode 4810 can be patterned after the mirror structure is patterned.

FIGS. 50A-50C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a support layer 5010 overlying the mirror structure (layers 4910, 4911, 4920, and 4921), the first electrode 4810, and the piezoelectric film 4720. In an example, the support layer 5010 can include silicon dioxide (SiO.sub.2), silicon nitride (SiN), or other like materials. In a specific example, this support layer 5010 can be deposited with a thickness of about 2-3 um. As described above, other support layers (e.g., SiNx) can be used.

FIGS. 51A-51C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of polishing the support layer 5010 to form a polished support layer 5011. In an example, the polishing process can include a chemical-mechanical planarization process or the like.

FIGS. 52A-52C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate flipping the device and physically coupling overlying the support layer 5011 overlying a bond substrate 5210. In an example, the bond substrate 5210 can include a bonding support layer 5220 (SiO.sub.2 or like material) overlying a substrate having silicon (Si), sapphire (Al.sub.2O.sub.3), silicon dioxide (SiO.sub.2), silicon carbide (SiC), or other like materials. In a specific embodiment, the bonding support layer 5220 of the bond substrate 5210 is physically coupled to the polished support layer 5011. Further, the physical coupling process can include a room temperature bonding process following by a 300 degree Celsius annealing process.

Figure 53C:
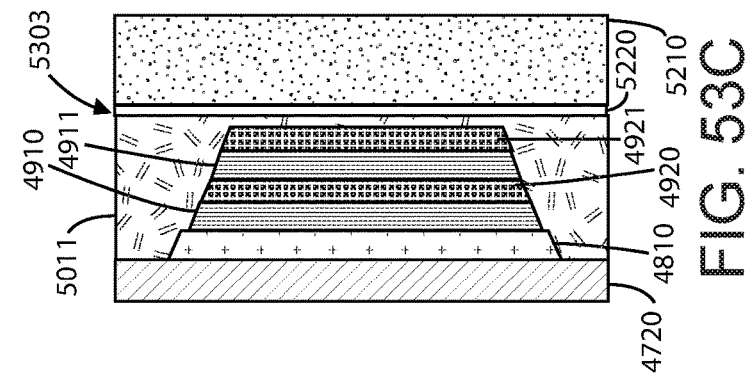
Figure 53A:
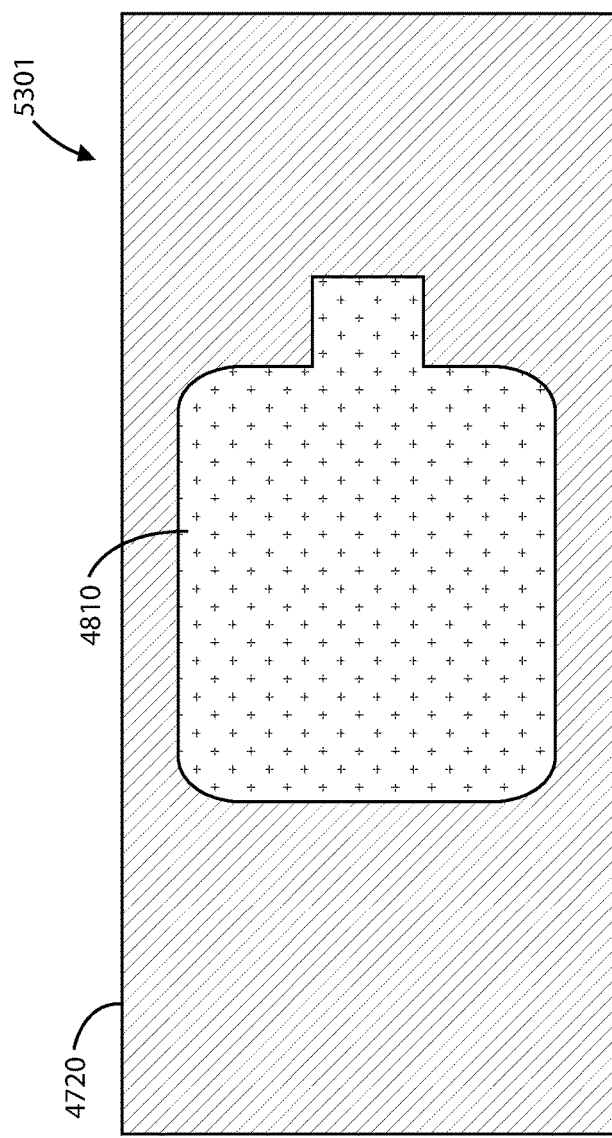
Figure 53B:
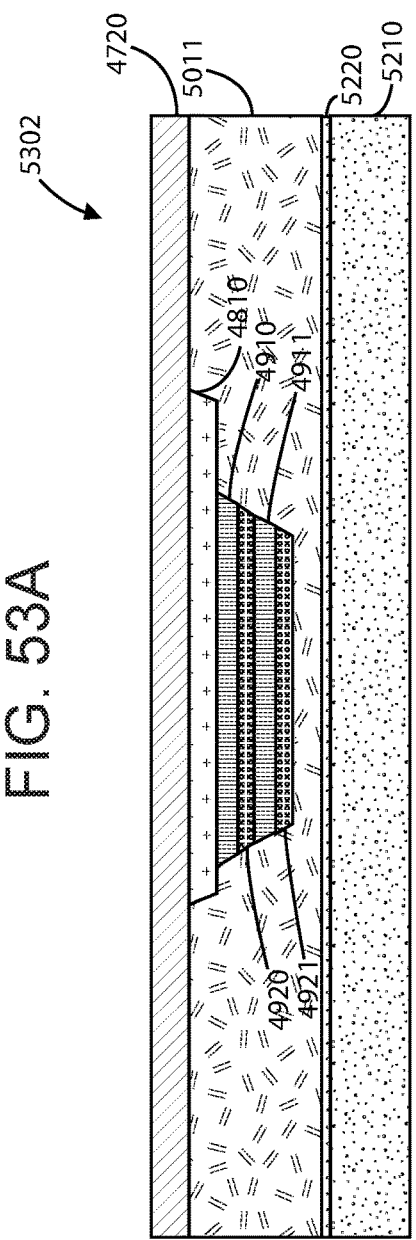

FIGS. 53A-53C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of removing the growth substrate 4710 or otherwise the transfer of the piezoelectric thin film 4720. In an example, the removal process can include a grinding process, a blanket etching process, a film transfer process, an ion implantation transfer process, a laser crack transfer process, or the like and combinations thereof.

Further referring to FIGS. 53A-53C, the growth substrate 4710 can be removed to expose the backside surface of the piezoelectric thin film 4720. The exposed backside surface of the piezoelectric thin film 4720 can also be processed to remove the first formed portions of the piezoelectric thin film 4720. As appreciated by the present inventors, the portion of the piezoelectric thin film 4720 that is first formed (by sputtering, CVD, or other processes at high or low temperatures) can have a lower crystalline quality that later formed portions. Accordingly, the first formed portion of the piezoelectric thin film 4720 that contacted the growth substrate 1610 and the portions immediately adjacent to the first formed portion, can have a lower crystalline quality than portions that were later formed.

As further appreciated by the present inventors, removing the portion of the piezoelectric thin film that was first formed on the growth substrate can eliminate the lower crystallinity portion of the piezoelectric thin film such that the remaining portion of the piezoelectric thin film 4720 has a higher crystallinity. For example, in some embodiments, a piezoelectric thin film of AlN or AlScN can be processed to remove about at least 500 Angstroms of material from the back-side of the film (the portion that was first formed on the substrate) so that the remaining portion has a crystallinity of less than about 1.0 degree at Full Width Half Maximum (FWHM) to about 10 arcseconds at FWHM measured using X-ray diffraction (XRD). In some embodiments, the crystallinity of the piezoelectric thin film can be in a range between about 1.0 degree at FWHM to about 0.5 degrees at FWHM measured using XRD.

FIGS. 54A-54C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming an electrode contact via 5410 within the piezoelectric film 4720 overlying the first electrode 4810. The via forming processes can include various types of etching processes.

FIGS. 55A-55C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a second electrode 5510 overlying the piezoelectric film 4720. In an example, the formation of the second electrode 5510 includes depositing molybdenum (Mo), ruthenium (Ru), tungsten (W), or other like materials; and then etching the second electrode 5510 to form an electrode cavity 5511 and to remove portion 5511 from the second electrode to form a top metal 5520. Further, the top metal 5520 is physically coupled to the first electrode 5520 through electrode contact via 5410.

Figure 56C:
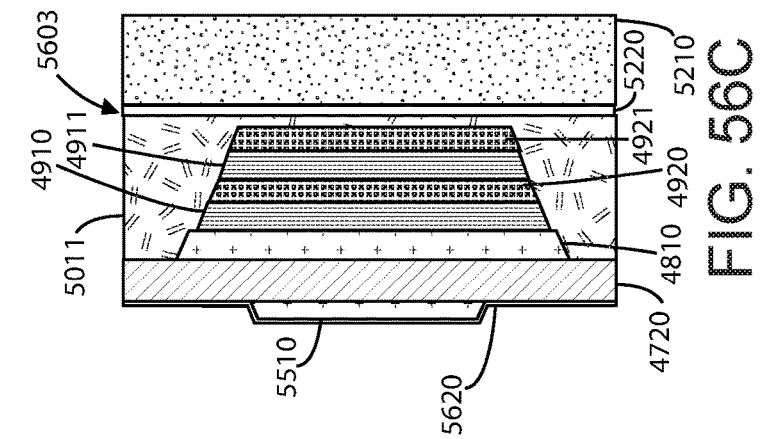
Figure 56A:
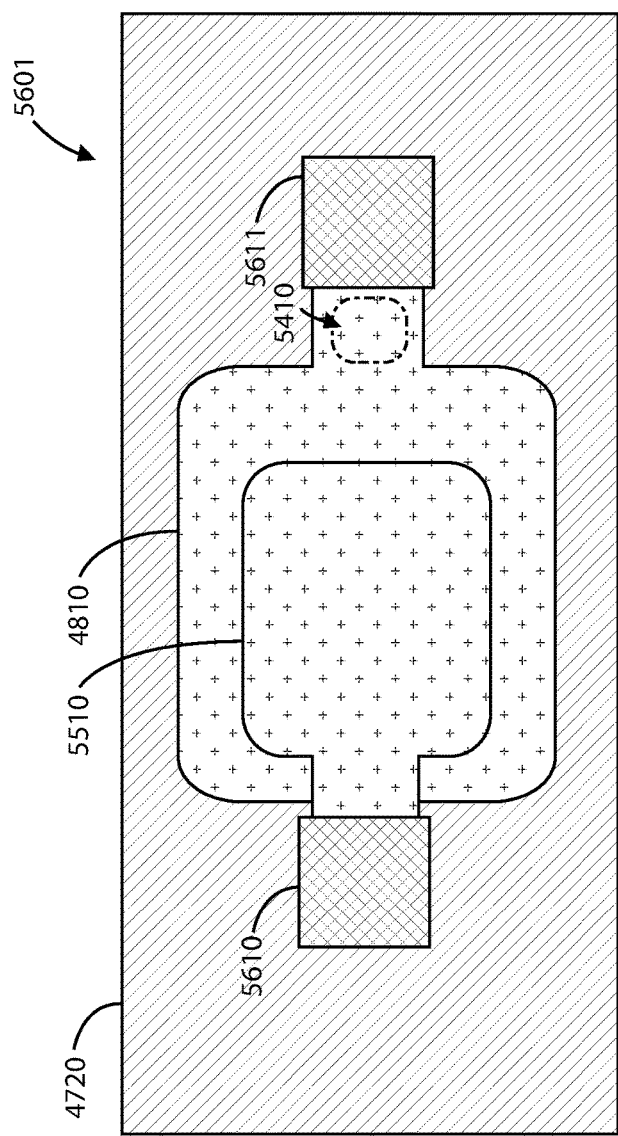
Figure 56B:
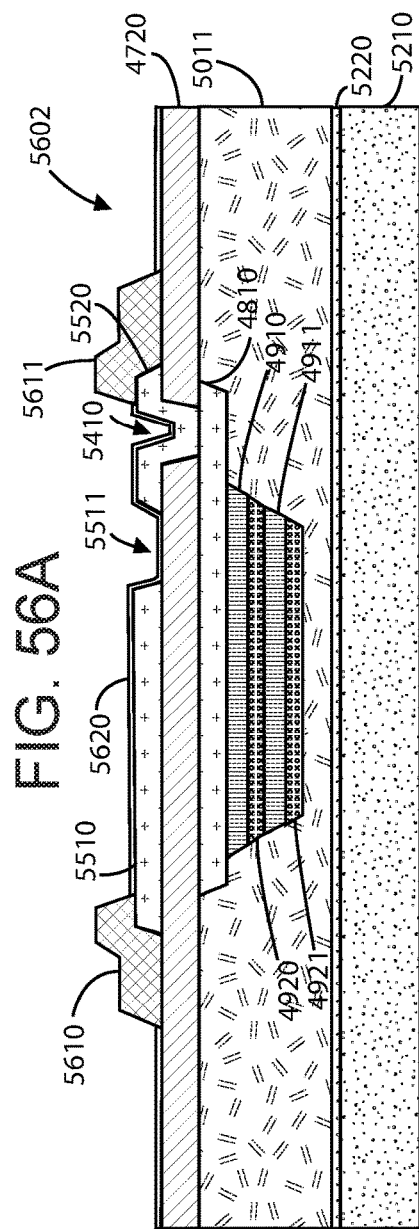

FIGS. 56A-56C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a first contact metal 5610 overlying a portion of the second electrode 5510 and a portion of the piezoelectric film 4720, and forming a second contact metal 5611 overlying a portion of the top metal 5520 and a portion of the piezoelectric film 4720. In an example, the first and second contact metals can include gold (Au), aluminum (Al), copper (Cu), nickel (Ni), aluminum bronze (AlCu), or other like materials. This figure also shows the method step of forming a second passivation layer 5620 overlying the second electrode 5510, the top metal 5520, and the piezoelectric film 4720. In an example, the second passivation layer 5620 can include silicon nitride (SiN), silicon oxide (SiOx), or other like materials. In a specific example, the second passivation layer 5620 can have a thickness ranging from about 50 nm to about 100 nm.

FIGS. 57A-57C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the second electrode 5510 and the top metal 5520 to form a processed second electrode 5710 and a processed top metal 5720. This step can follow the formation of second electrode 5710 and top metal 5720. In an example, the processing of these two components includes depositing molybdenum (Mo), ruthenium (Ru), tungsten (W), or other like materials; and then etching (e.g., dry etch or the like) this material to form the processed second electrode 5410 with an electrode cavity 5712 and the processed top metal 5720. The processed top metal 5720 remains separated from the processed second electrode 5710 by the removal of portion 5711. In a specific example, this processing gives the second electrode and the top metal greater thickness while creating the electrode cavity 5712. In a specific example, the processed second electrode 5710 is characterized by the addition of an energy confinement structure configured on the processed second electrode 5710 to increase Q.

FIGS. 58A-58C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the first electrode 4810 to form a processed first electrode 5810. This step can follow the formation of first electrode 4810. In an example, the processing of these two components includes depositing molybdenum (Mo), ruthenium (Ru), tungsten (W), or other like materials; and then etching (e.g., dry etch or the like) this material to form the processed first electrode 5810 with an electrode cavity, similar to the processed second electrode 5710. Compared to the two previous examples, there is no air cavity. In a specific example, the processed first electrode 5810 is characterized by the addition of an energy confinement structure configured on the processed second electrode 5810 to increase Q.

FIGS. 59A-59C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the first electrode 4810, to form a processed first electrode 5810, and the second electrode 5510/top metal 5520 to form a processed second electrode 5710/processed top metal 5720. These steps can follow the formation of each respective electrode, as described for FIGS. 57A-57C and 58A-58C. Those of ordinary skill in the art will recognize other variations, modifications, and alternatives.

In each of the preceding examples relating to transfer processes, energy confinement structures can be formed on the first electrode, second electrode, or both. In an example, these energy confinement structures are mass loaded areas surrounding the resonator area. The resonator area is the area where the first electrode, the piezoelectric layer, and the second electrode overlap. The larger mass load in the energy confinement structures lowers a cut-off frequency of the resonator. The cut-off frequency is the lower or upper limit of the frequency at which the acoustic wave can propagate in a direction parallel to the surface of the piezoelectric film. Therefore, the cut-off frequency is the resonance frequency in which the wave is traveling along the thickness direction and thus is determined by the total stack structure of the resonator along the vertical direction. In piezoelectric films (e.g., AlN), acoustic waves with lower frequency than the cut-off frequency can propagate in a parallel direction along the surface of the film, i.e., the acoustic wave exhibits a high-band-cut-off type dispersion characteristic. In this case, the mass loaded area surrounding the resonator provides a barrier preventing the acoustic wave from propagating outside the resonator. By doing so, this feature increases the quality factor of the resonator and improves the performance of the resonator and, consequently, the filter.

In addition, the top single crystalline piezoelectric layer can be replaced by a polycrystalline piezoelectric film. In such films, the lower part that is close to the interface with the substrate has poor crystalline quality with smaller grain sizes and a wider distribution of the piezoelectric polarization orientation than the upper part of the film close to the surface. This is due to the polycrystalline growth of the piezoelectric film, i.e., the nucleation and initial film have random crystalline orientations. Considering AlN as a piezoelectric material, the growth rate along the c-axis or the polarization orientation is higher than other crystalline orientations that increase the proportion of the grains with the c-axis perpendicular to the growth surface as the film grows thicker. In a typical polycrystalline AlN film with about a 1 um thickness, the upper part of the film close to the surface has better crystalline quality and better alignment in terms of piezoelectric polarization. By using the thin film transfer process contemplated in the present invention, it is possible to use the upper portion of the polycrystalline film in high frequency BAW resonators with very thin piezoelectric films. This can be done by removing a portion of the piezoelectric layer during the growth substrate removal process. Of course, there can be other variations, modifications, and alternatives.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A method of forming an acoustic resonator device, the method comprising:
   sputtering onto a first surface of a substrate to provide a piezoelectric thin film comprising AlN, AlScN, AlCrN, HfMgAlN, or ZrMgAlN on the first surface of the substrate while the first surface of the substrate is at a temperature in a range between 350 degrees Centigrade to 850 degrees Centigrade;
   processing a second surface of the substrate that is opposite the first surface of the substrate to provide an exposed surface of the piezoelectric thin film from beneath the second surface of the substrate, wherein the exposed surface of the piezoelectric thin film comprises a first crystalline quality portion of the piezoelectric thin film;
   removing a portion of the exposed surface of the piezoelectric thin film to access a second crystalline quality portion of the piezoelectric thin film that is covered by the first crystalline quality portion of the piezoelectric thin film, wherein the second crystalline quality portion of the piezoelectric thin film has a crystallinity of less than 1.0 degree at Full Width Half Maximum (FWHM) to 10 arcseconds at FWHM measured using X-ray diffraction (XRD); and
   processing the second crystalline quality portion of the piezoelectric thin film to provide an acoustic resonator device on the second crystalline quality portion of the piezoelectric thin film.

2. The method of claim 1 wherein removing the portion of the exposed surface of the piezoelectric thin film comprises removing 500 Angstroms of the piezoelectric thin film to expose the second crystalline quality portion of the piezoelectric thin film.

3. The method of claim 1 wherein processing the second surface of the substrate that is opposite the first surface of the substrate is preceded by:
   forming a first electrode on the piezoelectric thin film; and
   forming a sacrificial layer on the first electrode.

4. The method of claim 1 wherein the sputtering onto the first surface of the substrate comprises heating the substrate to a temperature in a range between 400 degrees Centigrade to 600 degrees Centigrade.

5. The method of claim 1 wherein the sputtering onto the first surface of the substrate comprises sputtering a seed layer including one or more of elements Al, Sc, Cr, Hf, Mg, or Zr directly onto the first surface of the substrate to form a nucleation layer prior to formation of the piezoelectric thin film.

6. The method of claim 5 further comprising:
   sputtering the one or more of the elements onto the nucleation layer to form the piezoelectric thin film.

7. The method of claim 1 wherein the second crystalline quality portion of the piezoelectric thin film has a crystallinity in a range between 1.0 degree at FWHM to 0.5 degrees at FWHM measured using XRD.

8. A method of forming an acoustic resonator device, the method comprising: sputtering onto a first surface of a growth substrate to provide a piezoelectric thin film comprising AlN, AlScN, AlCrN, HfMgAlN, or ZrMgAlN on the first surface of the growth substrate;
   forming a first electrode on the piezoelectric thin film;
   forming a multilayer mirror or a reflector structure on the first electrode;
   forming a support layer on the multilayer mirror or reflector structure;
   coupling a bond substrate to the support layer;
   processing a second surface of the growth substrate that is opposite the first surface of the growth substrate to provide an exposed surface of the piezoelectric thin film from beneath the second surface of the growth substrate, wherein the exposed surface of the piezoelectric thin film comprises a first crystalline quality portion of the piezoelectric thin film;
   removing a portion of the exposed surface of the piezoelectric thin film to access a second crystalline quality portion of the piezoelectric thin film that is covered by the first crystalline quality portion of the piezoelectric thin film, wherein the second crystalline quality portion of the piezoelectric thin film has a higher quality than the first crystalline quality portion of the piezoelectric thin film;
   processing a surface of the second crystalline quality portion of the piezoelectric thin film to form a via that passes through the second crystalline quality portion of the piezoelectric thin film that exposes the first electrode;
   depositing a metal on the surface of the second crystalline quality portion of the piezoelectric thin film and depositing the metal in the via to contact the first electrode; and processing the metal to form a first electrode contact on the surface of the second crystalline quality portion of the piezoelectric thin film and to form a second electrode on the surface of the second crystalline quality portion of the piezoelectric thin film that is electrically isolated from the first electrode contact.

* * * * *